US012652926B2

(12) United States Patent (10) Patent No.: US 12,652,926 B2
Okabe et al. (45) Date of Patent: Jun. 9, 2026

(54) DISPLAY DEVICE FOR INCREASING TRANSMITTANCE OF LIGHT IN A PARTIAL DISPLAY REGION AND PRODUCTION METHOD THEREFOR

(71) Applicant: SHARP KABUSHIKI KAISHA, Sakai City (JP)

(72) Inventors: Tohru Okabe, Sakai City (JP); Ryosuke Gunji, Sakai City (JP); Shinsuke Saida, Sakai City (JP); Shinji Ichikawa, Sakai City (JP)

(73) Assignee: SHARP KABUSHIKI KAISHA, Sakai City (JP)

( * ) Notice: Subject to any disclaimer, the term of this patent is extended or adjusted under 35 U.S.C. 154(b) by 867 days.

(21) Appl. No.: 17/907,955

(22) PCT Filed: Mar. 2, 2020

(86) PCT No.: PCT/JP2020/008652
§ 371 (c)(1),
(2) Date: Aug. 29, 2022

(87) PCT Pub. No.: WO2021/176506
PCT Pub. Date: Oct. 9, 2021

(65) Prior Publication Data
US 2023/0112543 A1 Apr. 13, 2023

(51) Int. Cl.
*H10K 59/80* (2023.01)
*H10K 59/131* (2023.01)

(52) U.S. Cl.
CPC ..... *H10K 59/80517* (2023.02); *H10K 59/131* (2023.02); *H10K 59/80518* (2023.02); *H10K 59/8731* (2023.02)

(58) Field of Classification Search
CPC ........... H10K 59/80517; H10K 59/131; H10K 59/80518; H10K 59/8731; H10K 59/60;
(Continued)

(56) References Cited

U.S. PATENT DOCUMENTS

2008/0251785 A1* 10/2008 Noh ....................... H10D 86/60
257/E29.147
2014/0138642 A1* 5/2014 Kim ................. H10K 59/80515
438/34
(Continued)

FOREIGN PATENT DOCUMENTS

JP 2018-124457 A 8/2018

*Primary Examiner* — Jacob Y Choi
*Assistant Examiner* — Grace Cha
(74) *Attorney, Agent, or Firm* — ScienBiziP, P.C.

(57) ABSTRACT
A display region includes a second display region that transmits light used in a camera on the inner side of a first display region. A first electrode in the first display region has a structure in which a first lower transparent conductive layer, a first reflective conductive layer, and a first upper transparent conductive layer are layered in order. A first electrode in the second display region has a structure in which a second lower transparent conductive layer, a second reflective conductive layer, and a second upper transparent conductive layer are layered in order. The second reflective conductive layer is thinner than the first reflective conductive layer on the inner side of an opening of an edge cover.

20 Claims, 41 Drawing Sheets

(58) Field of Classification Search
CPC ....... H10K 2102/103; H10K 2102/351; H05B
33/12; H05B 33/22; H05B 33/26; G09F
9/00; G09F 9/30
See application file for complete search history.

(56) References Cited

U.S. PATENT DOCUMENTS

| | | | |
|---|---|---|---|
| 2018/0212198 A1* | 7/2018 | Inoue | H10K 59/124 |
| 2018/0366678 A1* | 12/2018 | Chi | H10K 50/813 |
| 2019/0103580 A1* | 4/2019 | Nakazawa | H01B 1/02 |
| 2019/0214596 A1* | 7/2019 | Park | H10K 59/65 |
| 2019/0379002 A1* | 12/2019 | Abe | H10K 59/121 |

\* cited by examiner

53

53e
53d
53c
53b
53a

DISPLAY DEVICE FOR INCREASING TRANSMITTANCE OF LIGHT IN A PARTIAL DISPLAY REGION AND PRODUCTION METHOD THEREFOR

TECHNICAL FIELD

The technique of the disclosure relates to a display device and a method of manufacturing the same.

BACKGROUND ART

In recent years, self-luminous type organic Electro Luminescence (hereinafter also referred to as EL) display devices using organic EL elements have attracted attention as display devices that can replace liquid crystal display devices.

Each of the organic EL elements includes a first electrode, an organic EL layer provided on the first electrode, and a second electrode provided on the organic EL layer. As the organic EL element, a top-emission type organic EL element having an excellent light extraction efficiency has been suitably adopted. In the top-emission type organic EL element, the first electrode includes a reflective conductive layer that is formed of a reflective conductive material and reflects light emitted by the organic EL layer toward the second electrode side.

In a case where the organic EL display device is used as a display of an information terminal such as a smartphone or a tablet terminal, or in a case where the organic EL display device is used as a display for performing bidirectional communication such as in a video telephone call or a video conference, the organic EL display device is combined with a camera (so-called in-camera) that captures an image of the side that is in front of a screen. In such an organic EL display device provided with the in-camera, it has been proposed to dispose the camera at a position that is on a back face side of the organic EL display device and overlaps a display region (see PTL 1, for example).

CITATION LIST

Patent Literature

PTL 1: JP 2018-124457 A

SUMMARY

Technical Problem

In an organic EL display device including top-emission type organic EL elements, external light is reflected by a reflective conductive layer constituting a first electrode, and thus the transmittance of light in a display region is significantly low. From this, in a case where an electronic component, such as a camera that uses the light transmitted through the display region, is disposed at a position overlapping the display region on the back face side of the organic EL display device, it is desired to increase the transmittance of light in a region of the display region that transmits the light used in the electronic component.

The technique of the disclosure has been made in view of such a point as described above, and an object thereof is to increase the transmittance of light in a region that transmits light used in an electronic component in a display region of a display device.

Solution to Problem

The technique of the disclosure relates to a display device including a substrate, a thin film transistor (hereinafter will be referred to as "TFT") layer provided on the substrate and including a plurality of TFTs, and a light-emitting element layer provided on the TFT layer and including a plurality of light-emitting elements. In the display device, a display region that displays an image by light emission from the light-emitting elements controlled by an action of the TFTs is provided, and an electronic component is disposed on a back face side of the display region with respect to the substrate and is configured to use light transmitted through the light-emitting element layer, the TFT layer and the substrate.

A light-emitting element layer includes a first electrode which is provided for each of light-emitting elements, an edge cover which covers a peripheral edge portion of the first electrode and in which an opening exposing the first electrode is formed, a light-emitting function layer which is provided on the first electrode inside the opening of the edge cover, and a second electrode which is provided on the light-emitting function layer. A display region includes a first display region and a second display region that is positioned inside of the first display region and transmits the light used in an electronic component. Each of the plurality of light-emitting elements includes a first light-emitting element positioned in the first display region and a second light-emitting element positioned in the second display region, each of the first light-emitting element and the second light-emitting element including the first electrode, the light-emitting function layer, and the second electrode. The first electrode of the first light-emitting element includes a first lower transparent conductive layer having light transmittance, a first reflective conductive layer provided on the first lower transparent conductive layer and having light reflectivity, and a first upper transparent conductive layer provided on the first reflective conductive layer and having light transmittance.

The first electrode of the second light-emitting, element includes a second lower transparent conductive layer having light transmittance and being formed of the same material as a material of the first lower transparent conductive layer and in the same layer as the first lower transparent conductive layer, a second reflective conductive layer having light reflectivity and being formed of the same material as a material of the first reflective conductive layer and in the same layer as the first reflective conductive layer on the second lower transparent conductive layer, and a second upper transparent conductive layer having light transmittance and being formed of the same material as a material of the first upper transparent conductive layer and in the same layer as the first upper transparent conductive layer on the second reflective conductive layer. The second reflective conductive layer is, on an inner side of the opening of the edge cover, provided partially or thinner in at least a portion than the first reflective conductive layer.

Advantageous Effects of Disclosure

According to a display device of the technique of the disclosure, a second reflective conductive layer is, on an inner side of an opening of an edge cover, provided partially or thinner in at least a portion than a first reflective conductive layer, and thus the amount of light that passes through a first electrode of a second organic EL element on the inner side of the opening of the edge cover is higher in a portion where the second reflective conductive layer is not provided or is thinner than the first reflective conductive layer. Thereby, it is possible to increase the transmittance of light in a second display region of a display region that transmits light used in an electronic component.

4 in a second patterning step in the method of manufacturing the organic EL display device according to the first embodiment.

Figure 18:
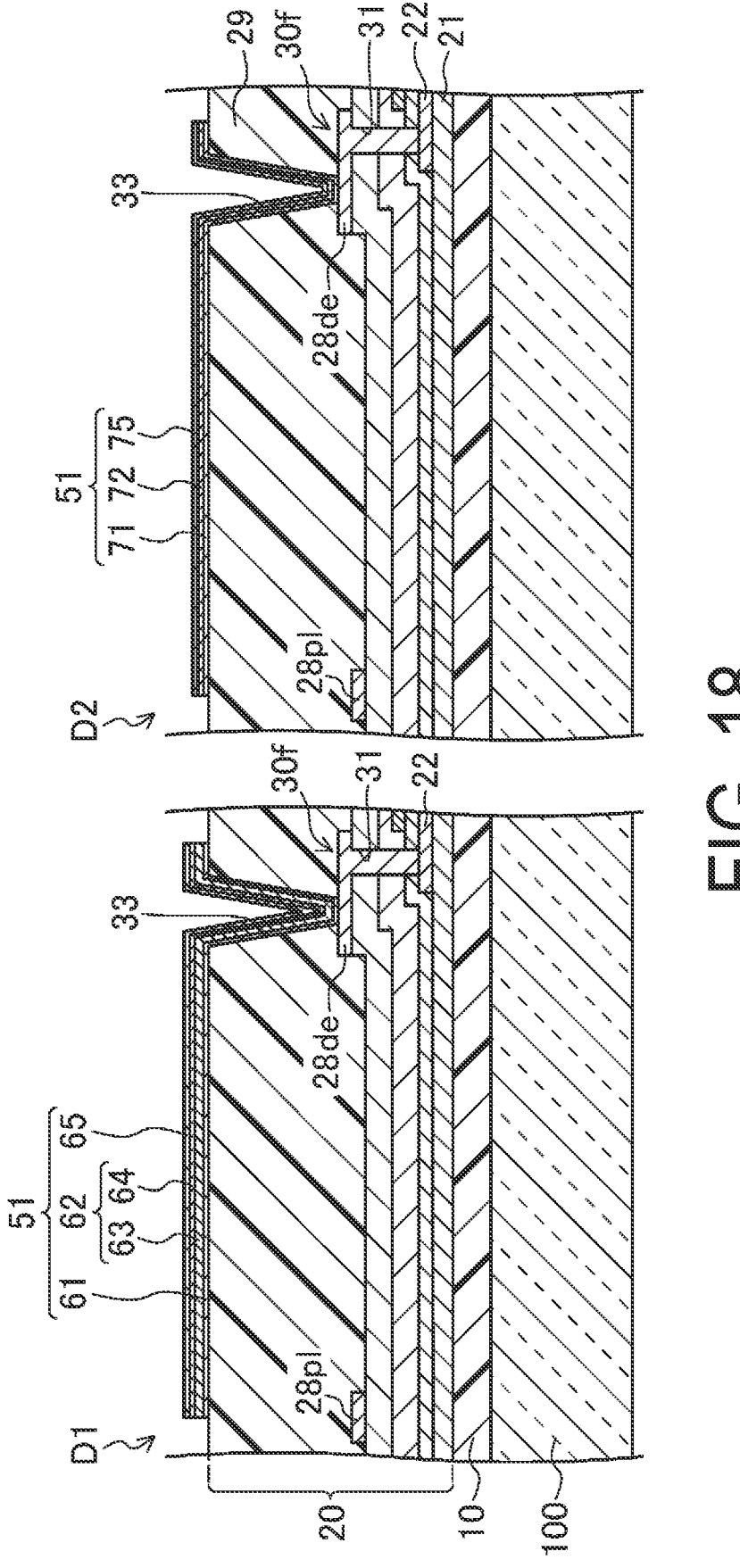

FIG. 18 is a cross-sectional view illustrating main portions of the substrate on which patterning has been performed in the second patterning step in the method of manufacturing the organic EL display device according to the first embodiment.

Figure 19:
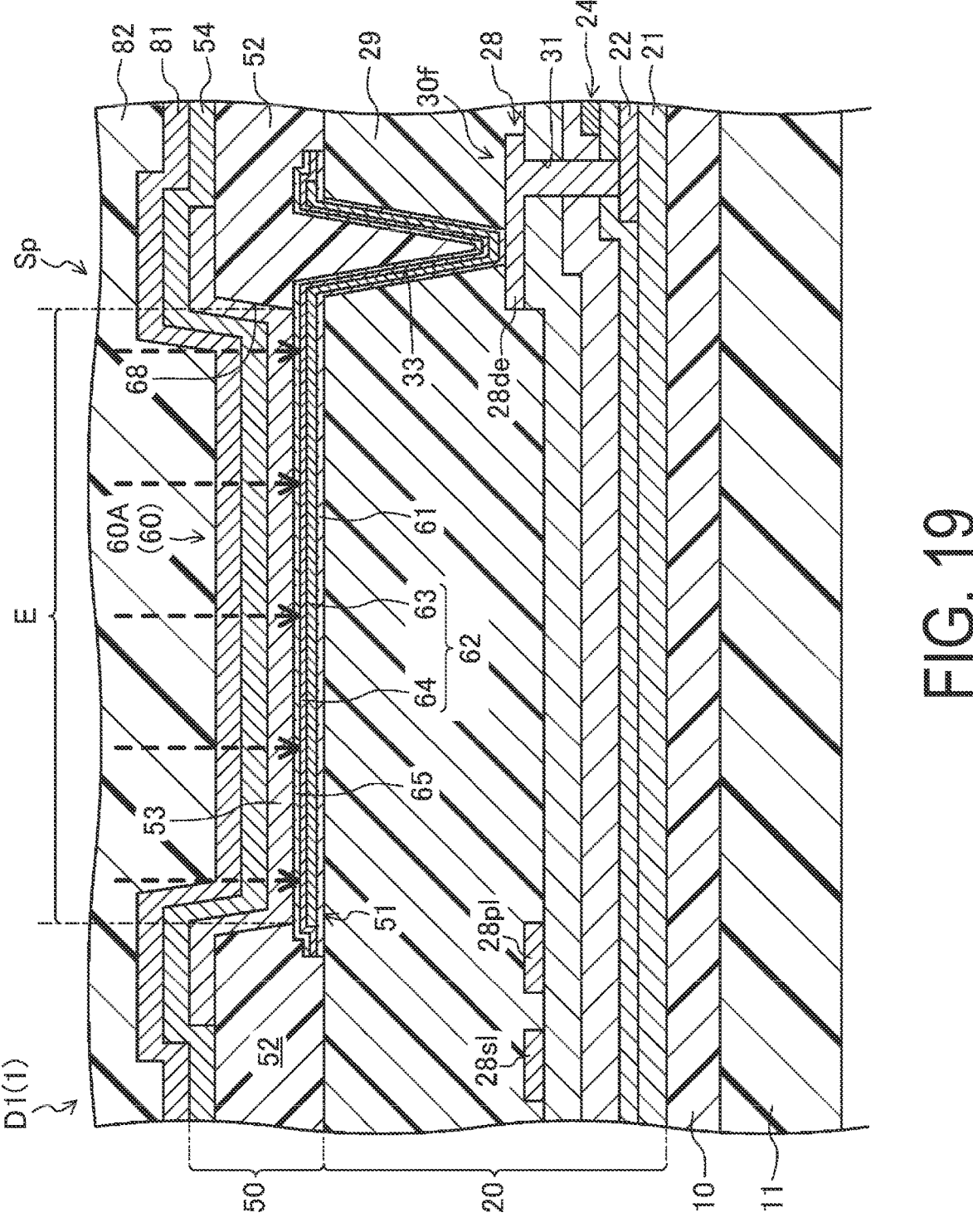

FIG. 19 is a cross-sectional view illustrating main portions in the first display region of the organic EL display device according to a first modification example of the first embodiment.

Figure 20:
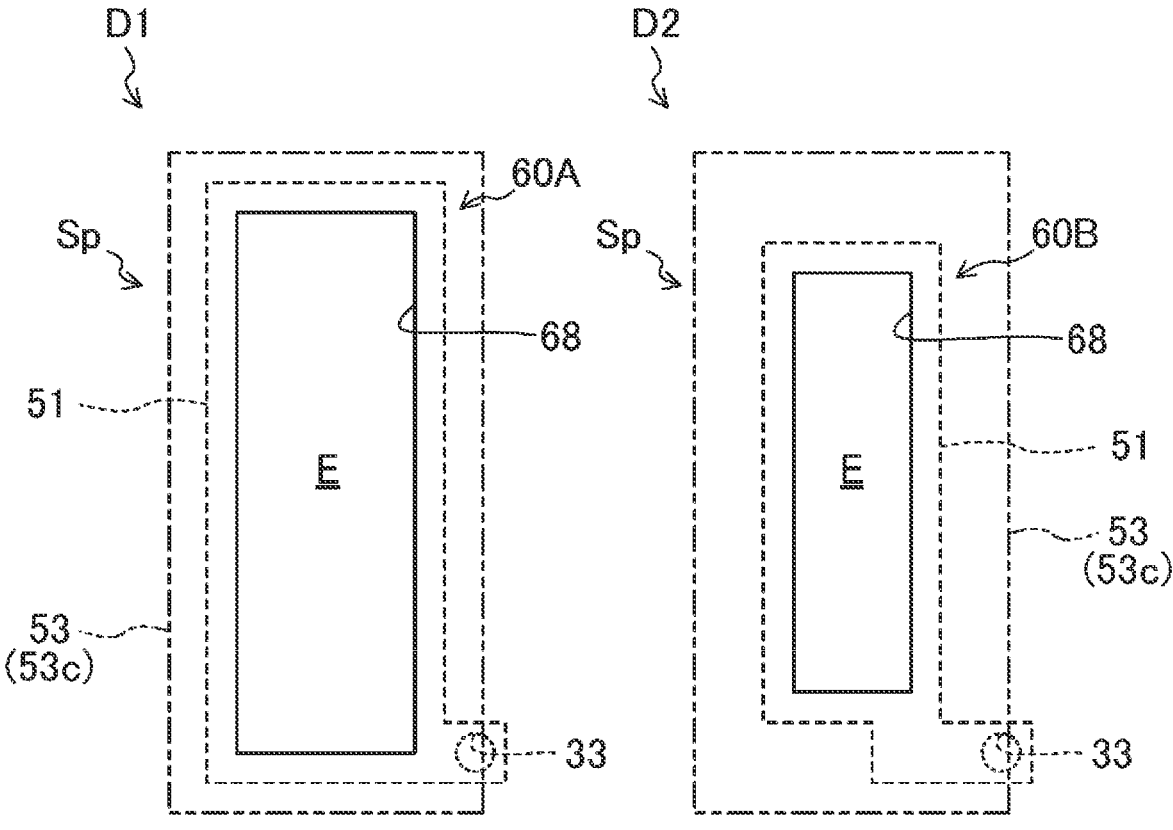

FIG. 20 is a plan view illustrating configurations of light-emitting regions and the peripheral configurations thereof in the first display region and the second display region of the organic EL display device according to a second modification example of the first embodiment.

Figure 21:
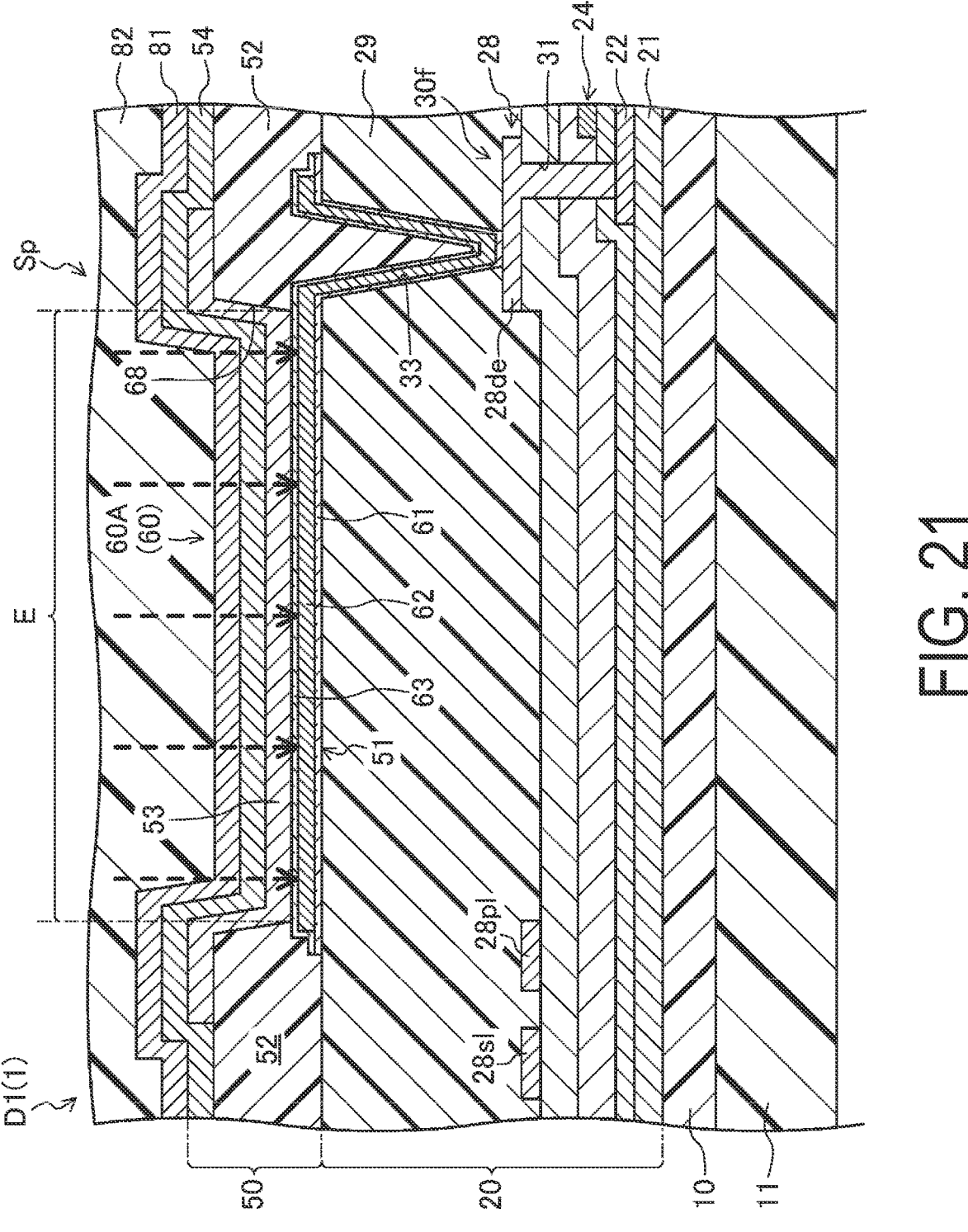

FIG. 21 is a cross-sectional view illustrating main portions in a first display region of an organic EL display device according to a second embodiment.

Figure 22:
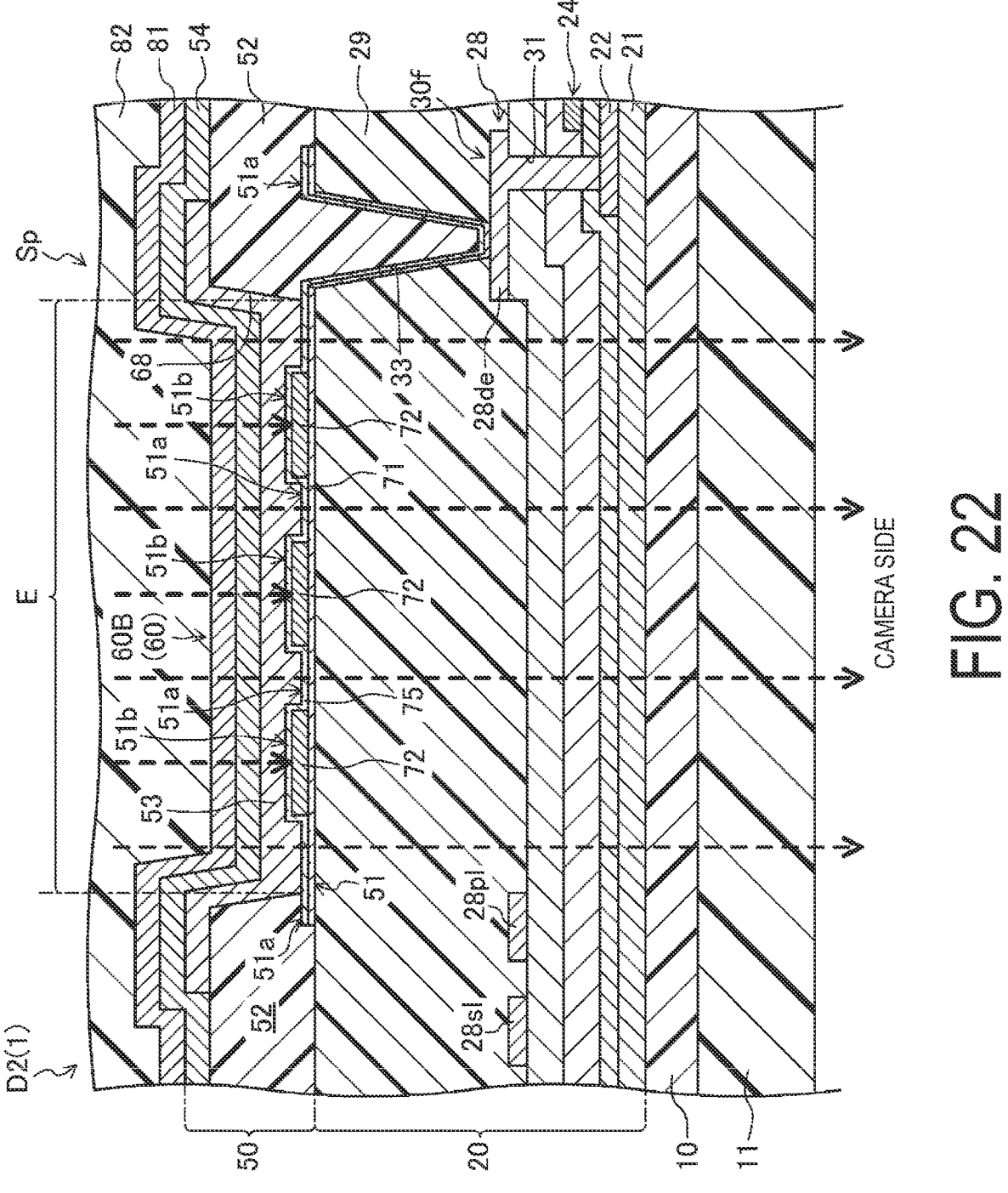

FIG. 22 is a cross-sectional view illustrating main portions in a second display region of the organic EL display device according to the second embodiment.

Figure 23:
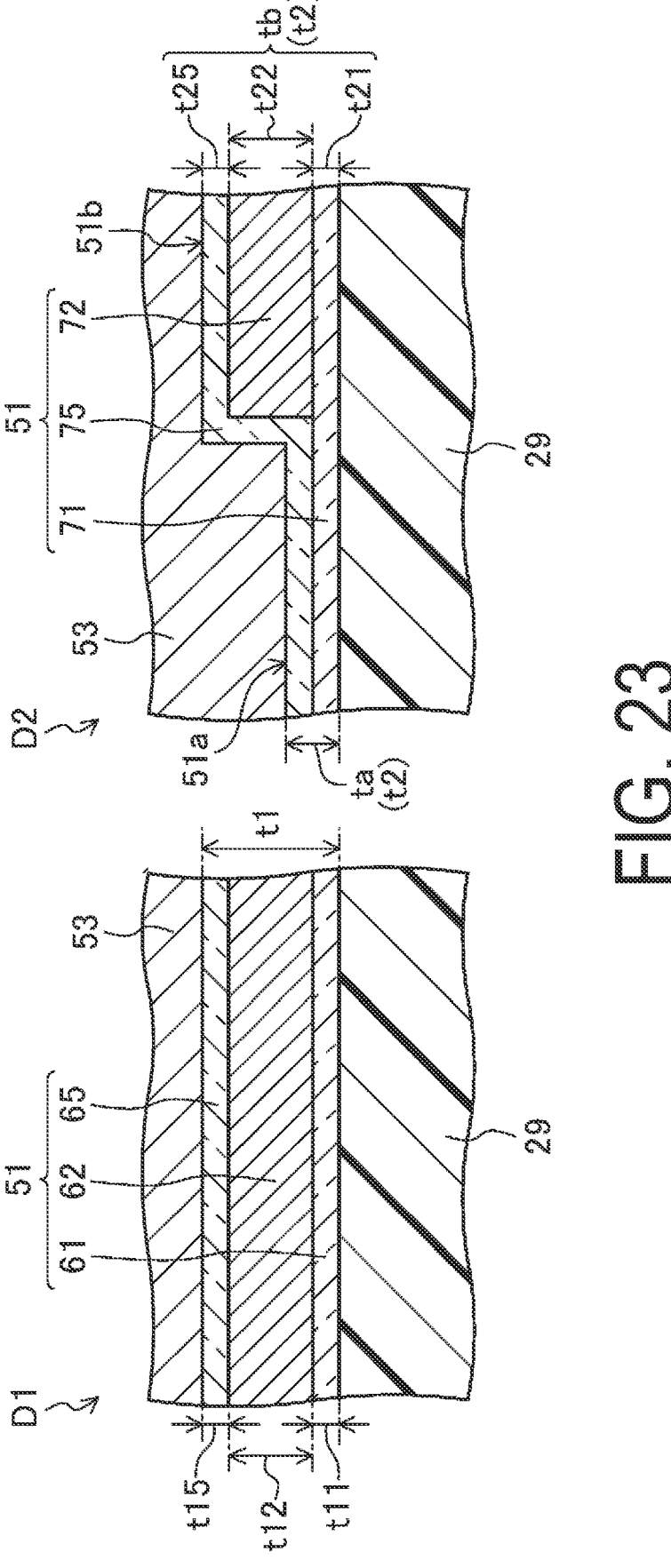

FIG. 23 is a cross-sectional view illustrating a layered structure of first electrodes in the first display region and the second display region of the organic EL display device according to the second embodiment.

Figure 24:
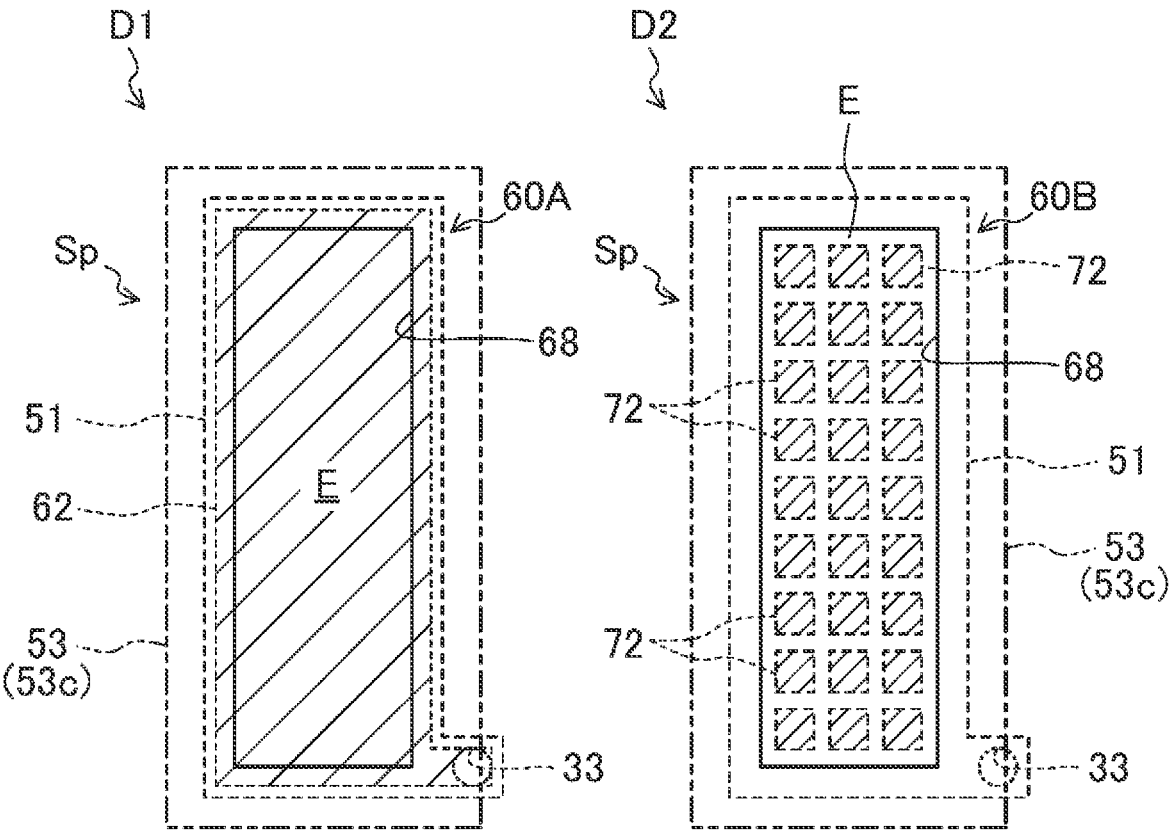

FIG. 24 is a plan view illustrating configurations of light-emitting regions and the peripheral configurations thereof in the first display region and the second display region of the organic EL display device according to the second embodiment.

Figure 25:
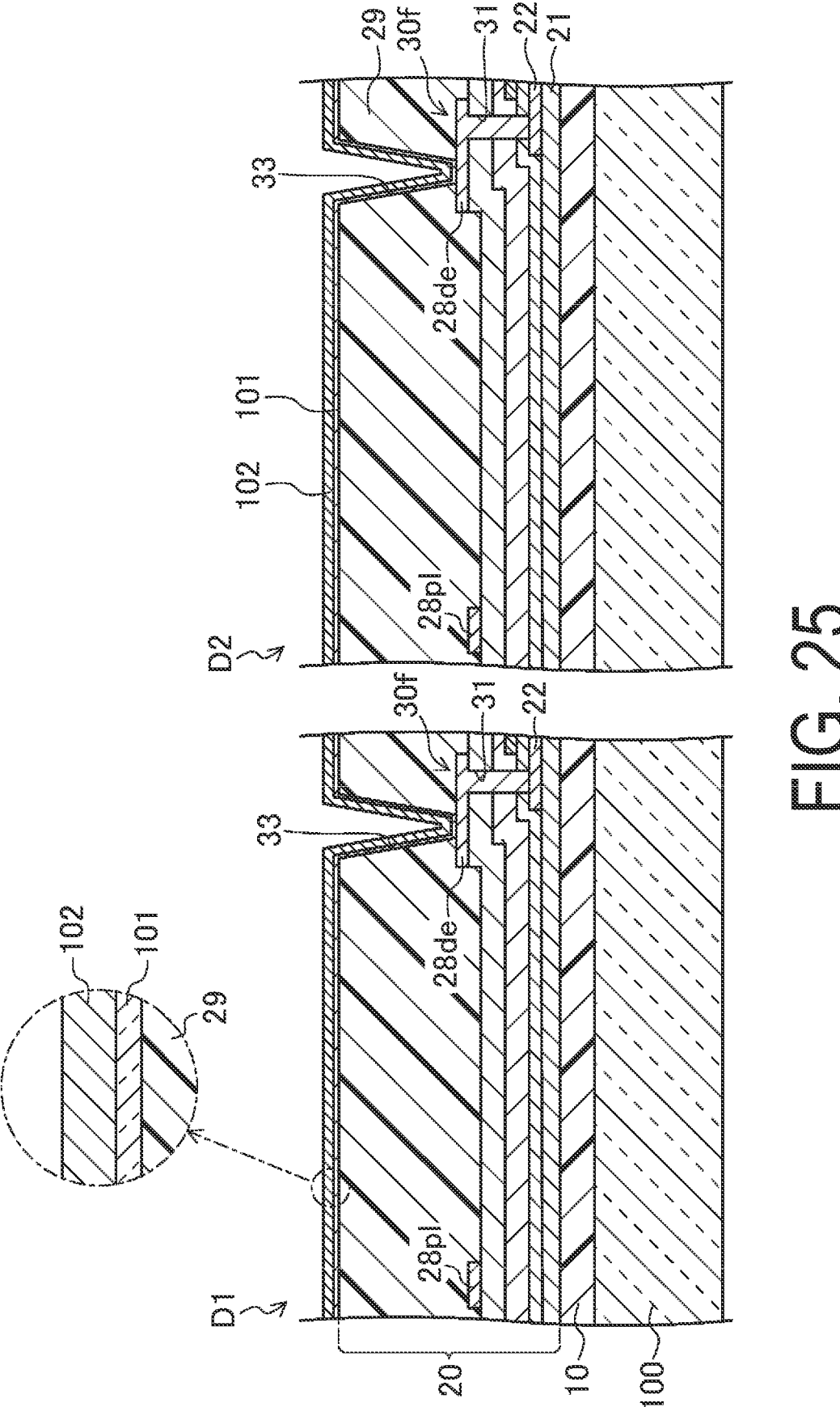

FIG. 25 is a cross-sectional view illustrating main portions of a substrate on which film formation has been performed in a first film forming step in the method of manufacturing the organic EL display device according to the second embodiment.

Figure 26:
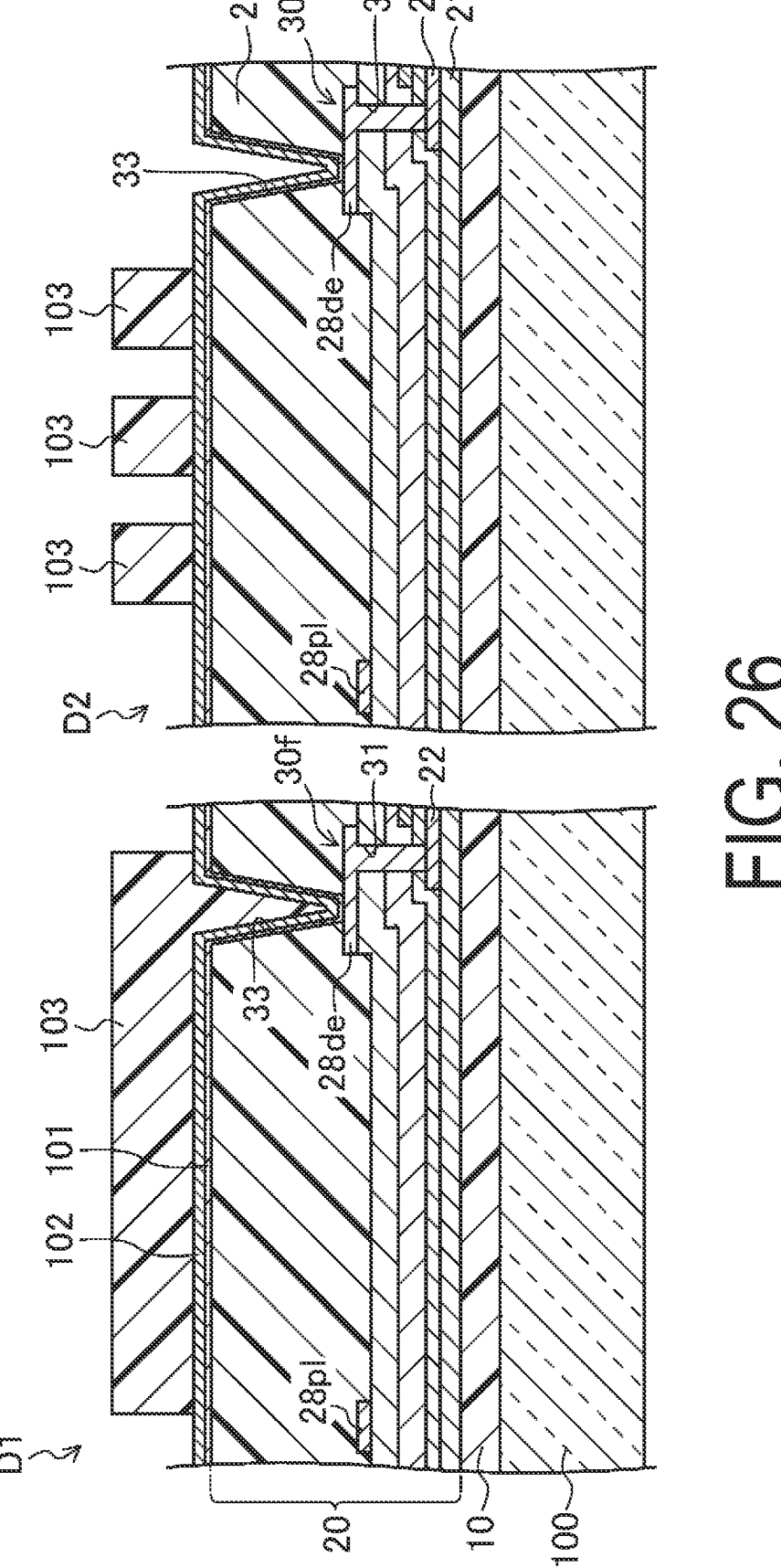

FIG. 26 is a cross-sectional view illustrating main portions of the substrate on which a resist layer has been formed in a first patterning step in the method of manufacturing the organic EL display device according to the second embodiment.

Figure 27:
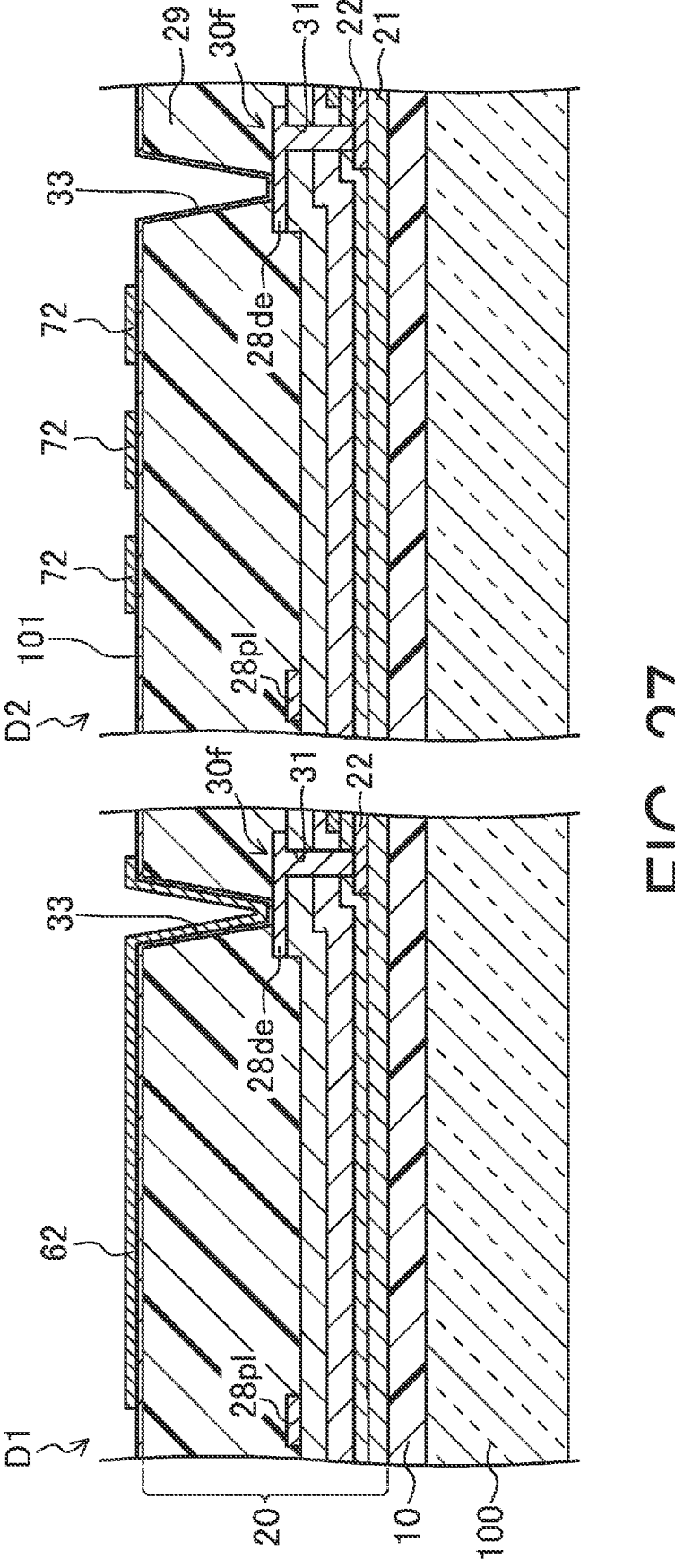

FIG. 27 is a cross-sectional view illustrating main portions of the substrate on which patterning has been performed in the first patterning step in the method of manufacturing the organic EL display device according to the second embodiment.

Figure 28:
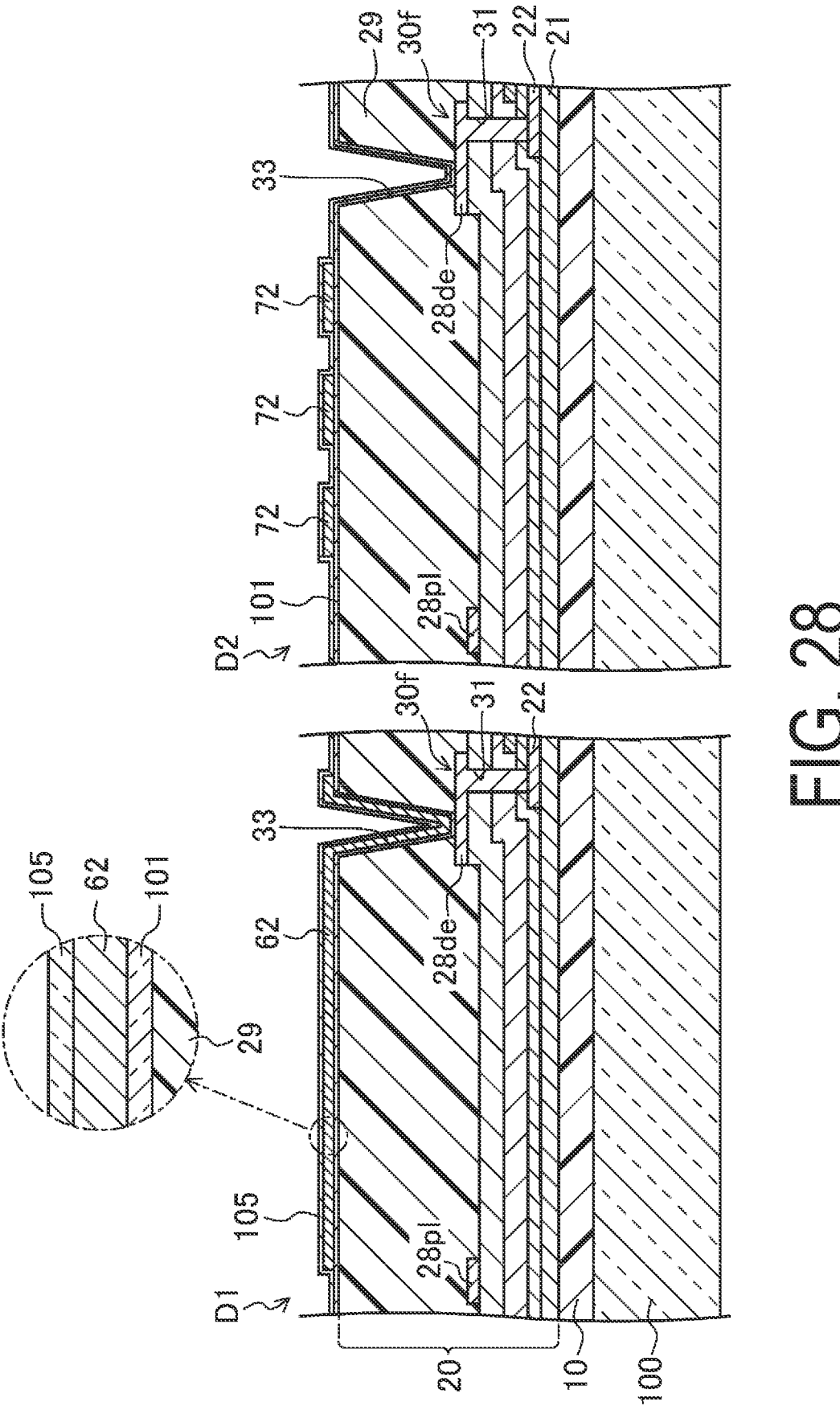

FIG. 28 is a cross-sectional view illustrating main portions of the substrate on which film formation has been performed in a second film forming step in the method of manufacturing the organic EL display device according to the second embodiment.

Figure 29:
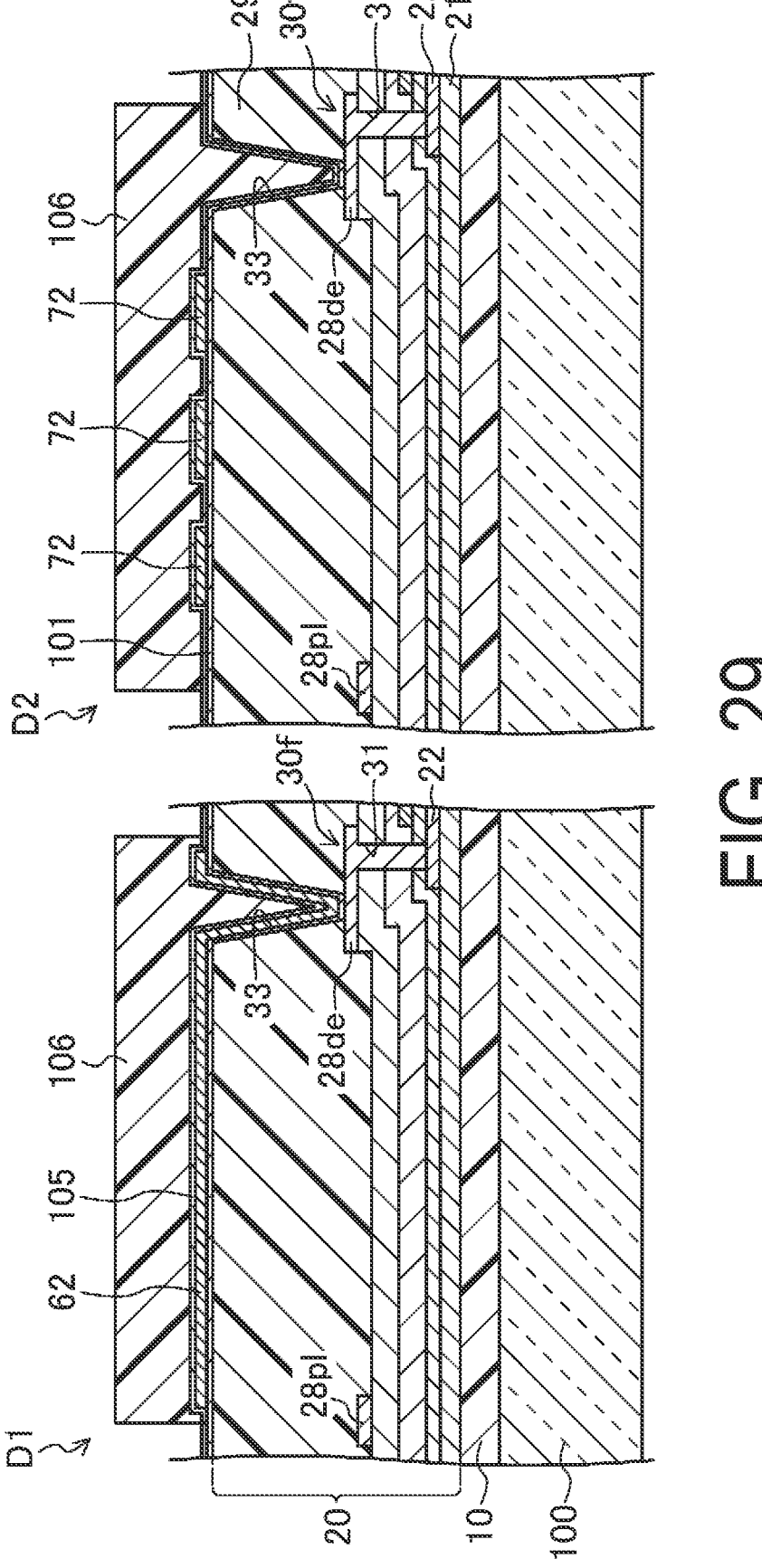

FIG. 29 is a cross-sectional view illustrating main portions of the substrate on which a resist layer has been formed in a second patterning step in the method of manufacturing the organic EL display device according to the second embodiment.

Figure 30:
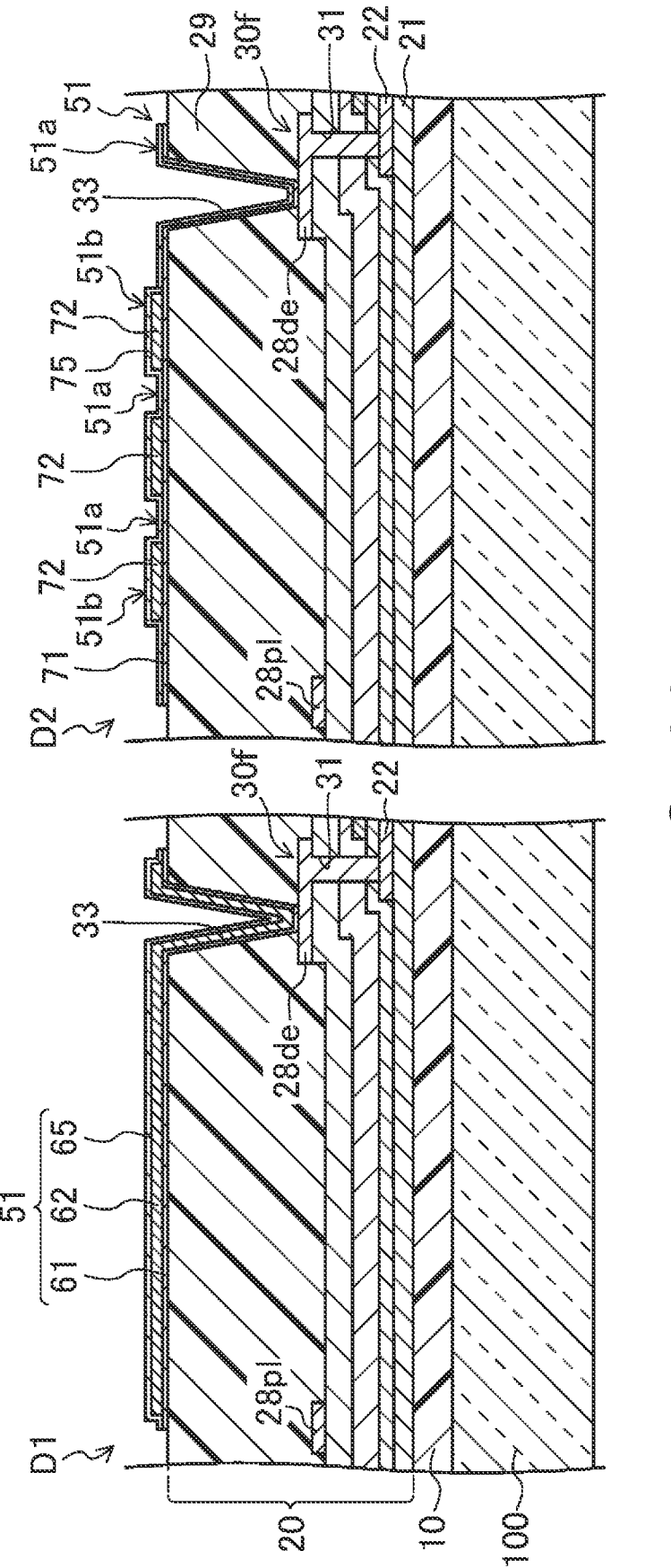

FIG. 30 is a cross-sectional view illustrating main portions of the substrate on which patterning has been performed in the second patterning step in the method of manufacturing the organic EL display device according to the second embodiment.

Figure 31:
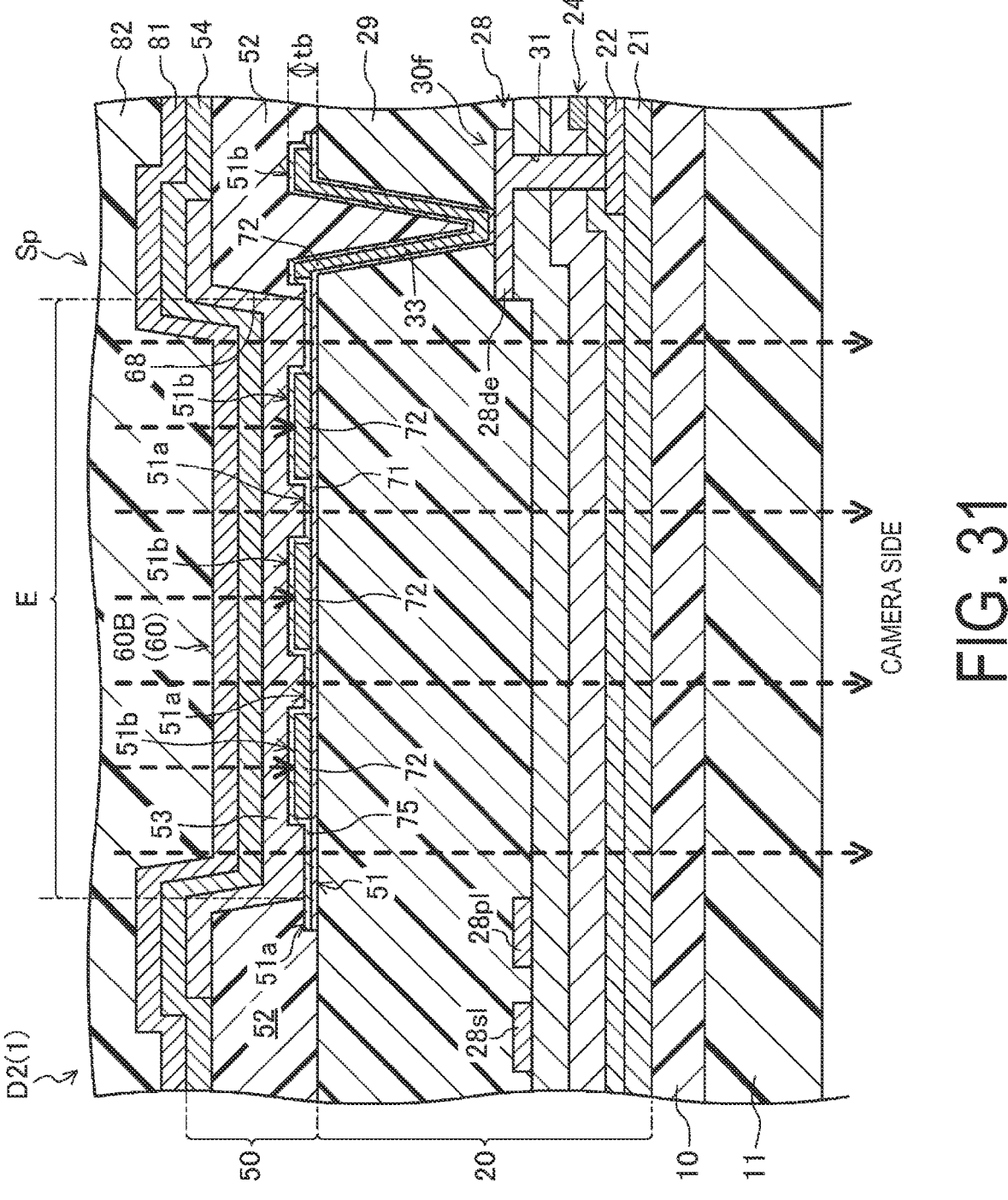

FIG. 31 is a cross-sectional view illustrating main portions in the second display region of the organic EL display device according to a first modification example of the second embodiment.

Figure 32:
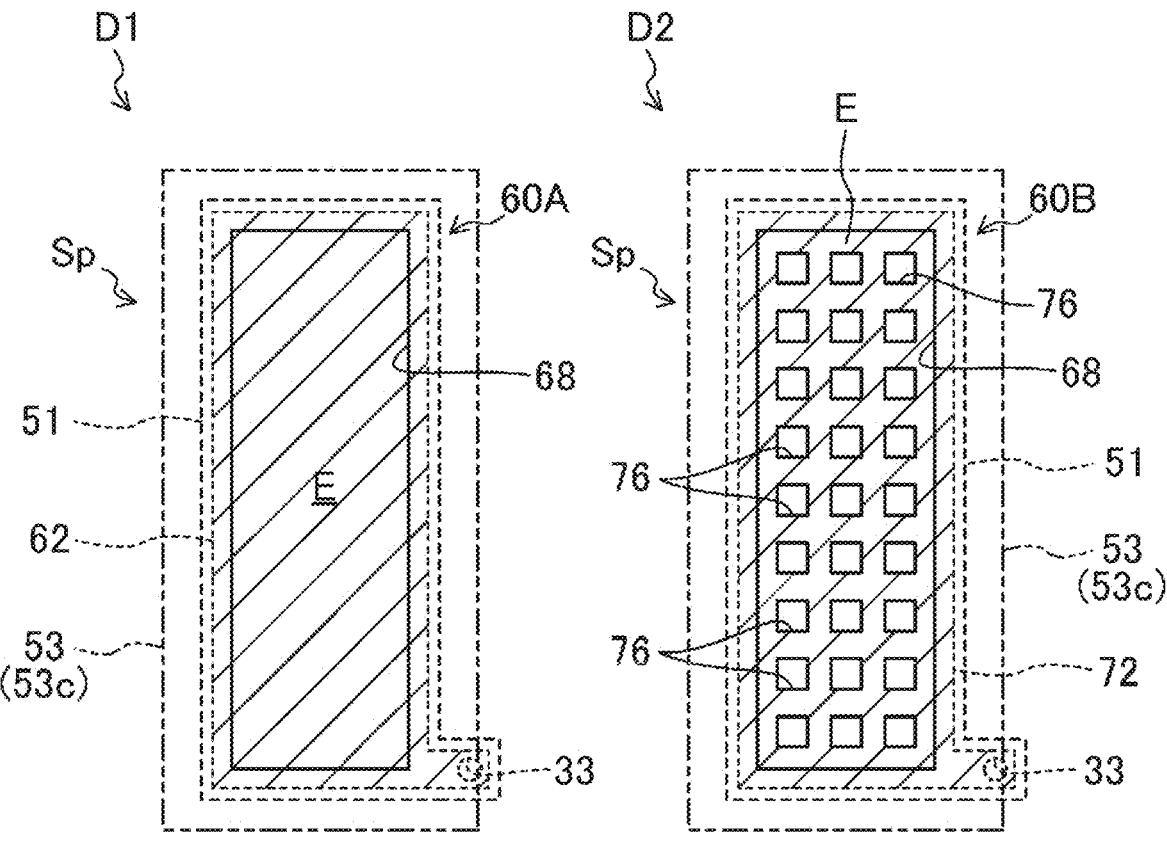

FIG. 32 is a plan view illustrating configurations of light-emitting regions and the peripheral configurations thereof in the first display region and the second display region of the organic EL display device according to a second modification example of the second embodiment.

Figure 33:
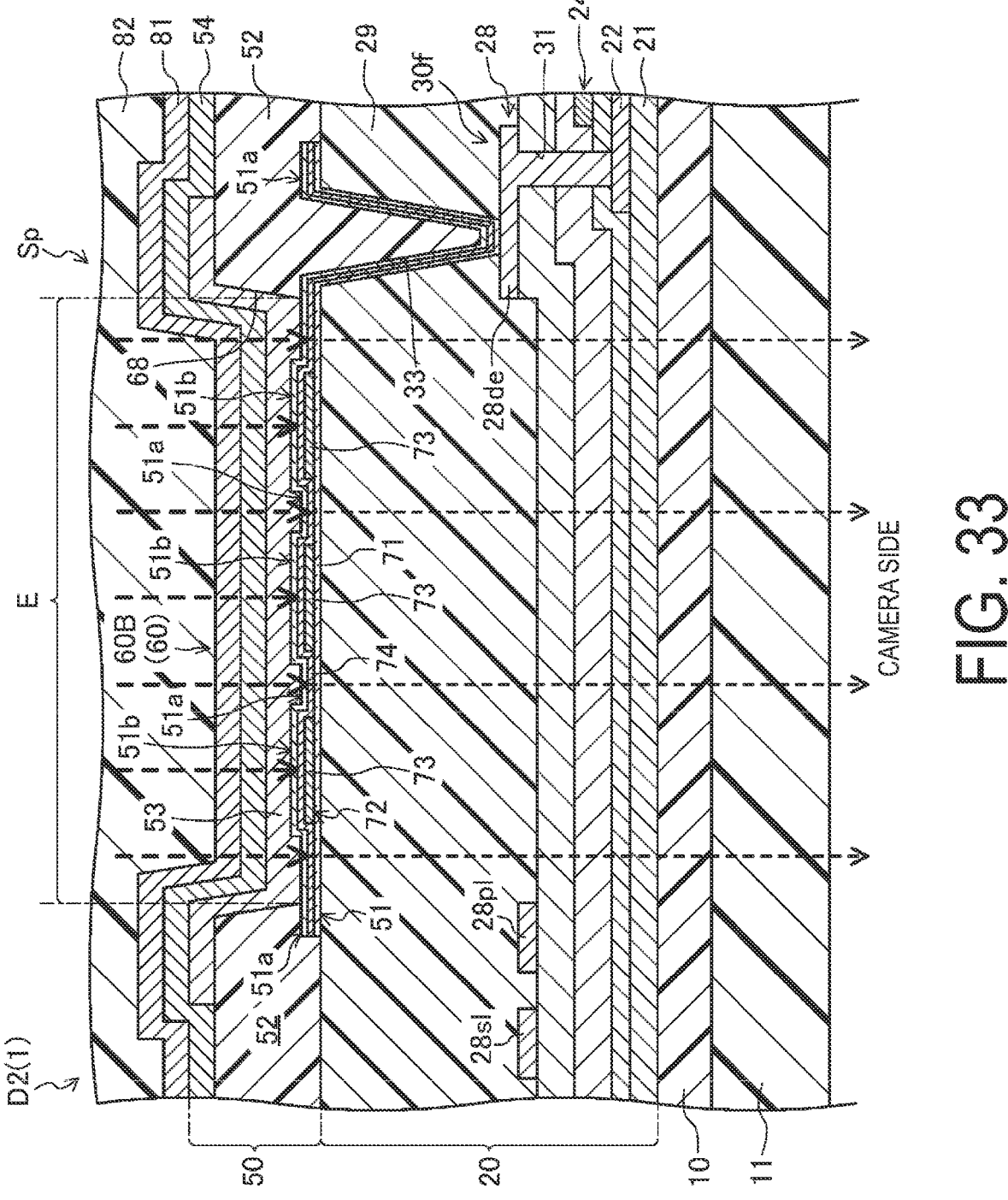

FIG. 33 is a cross-sectional view illustrating main portions in a second display region of an organic EL display device according to a third embodiment.

Figure 34:
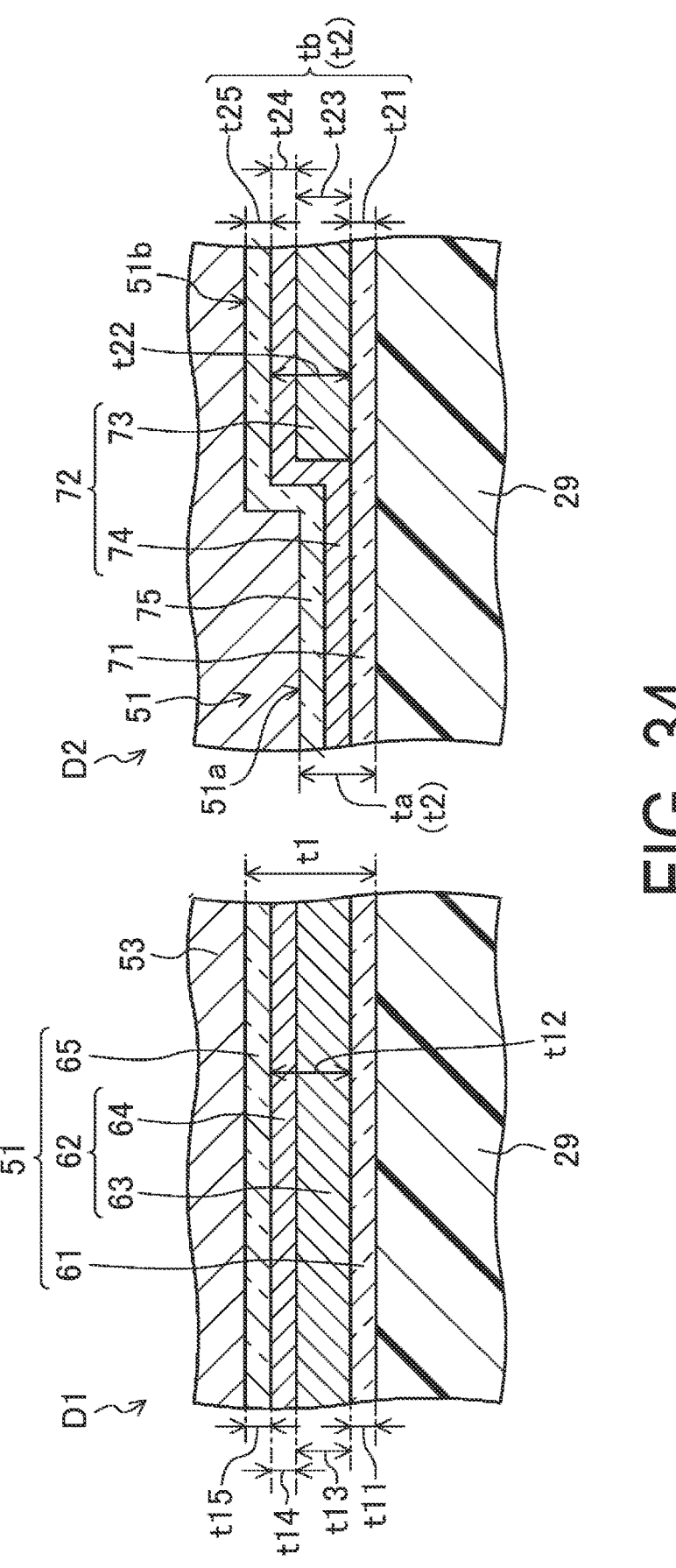

FIG. 34 is a cross-sectional view illustrating a layered structure of first electrodes in the first display region and the second display region of the organic EL display device according to the third embodiment.

Figure 35:
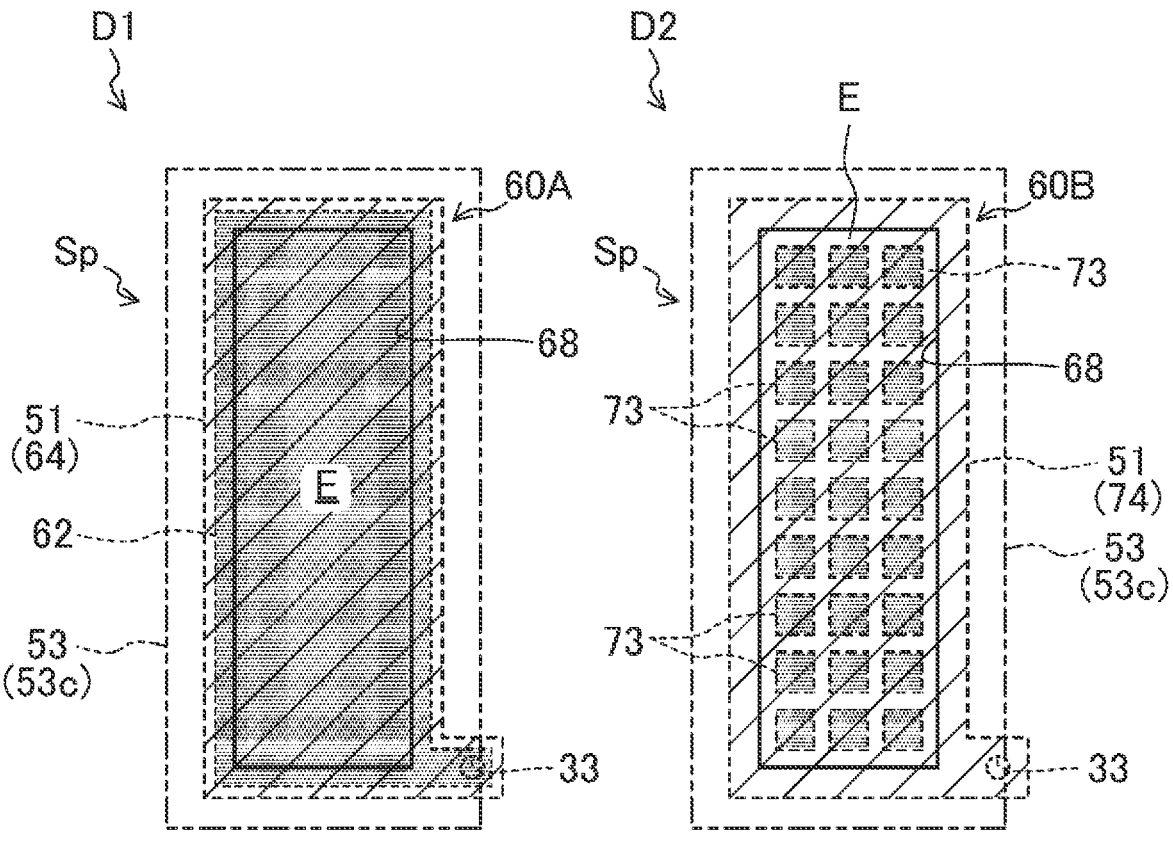

FIG. 35 is a plan view illustrating configurations of light-emitting regions and the peripheral configurations thereof in the first display region and the second display region of the organic EL display device according to the third embodiment.

Figure 36:
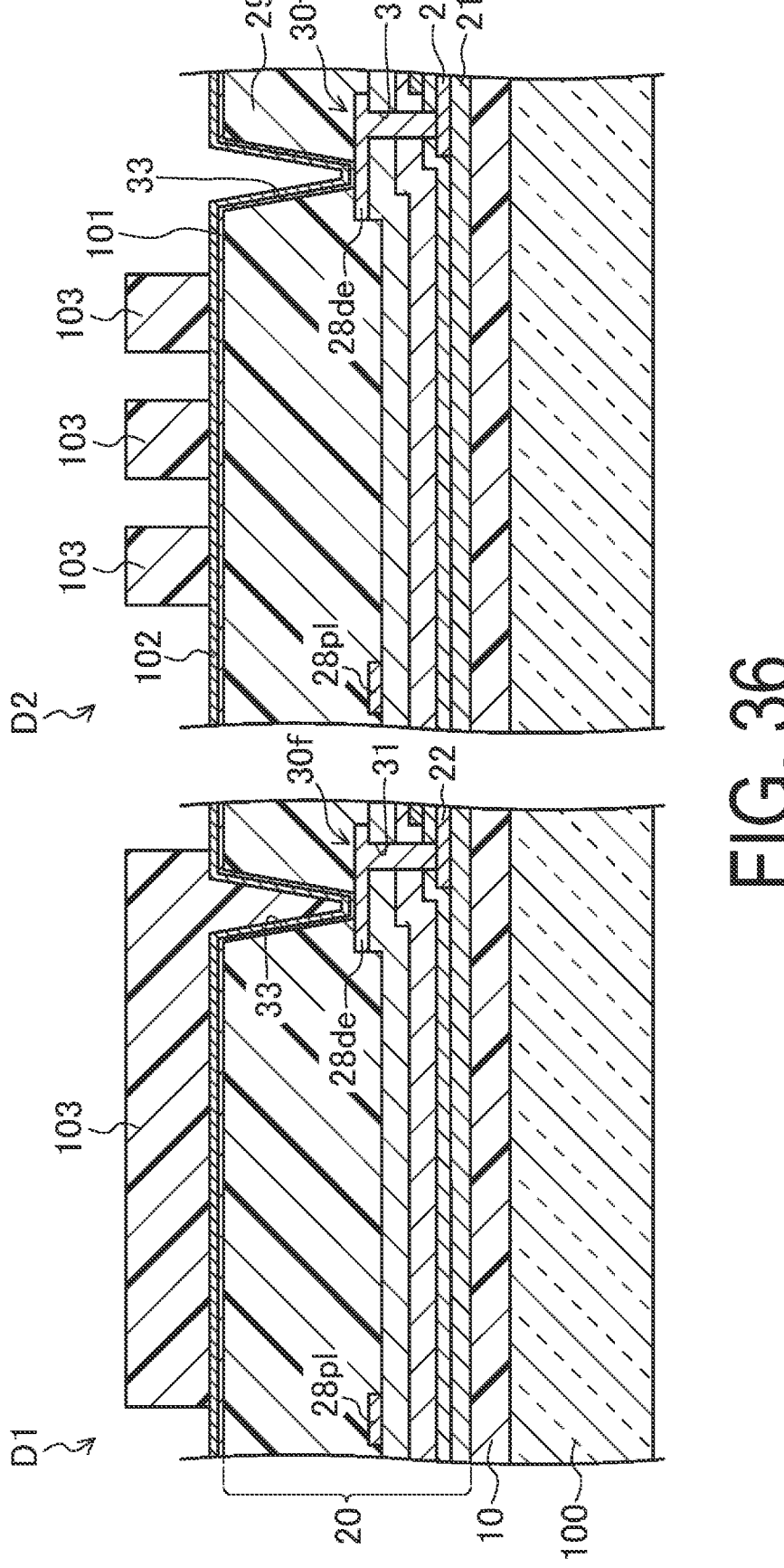

FIG. 36 is a cross-sectional view illustrating main portions of the substrate on which a resist layer has been formed in a first patterning step in the method of manufacturing the organic EL display device according to the third embodiment.

Figure 37:
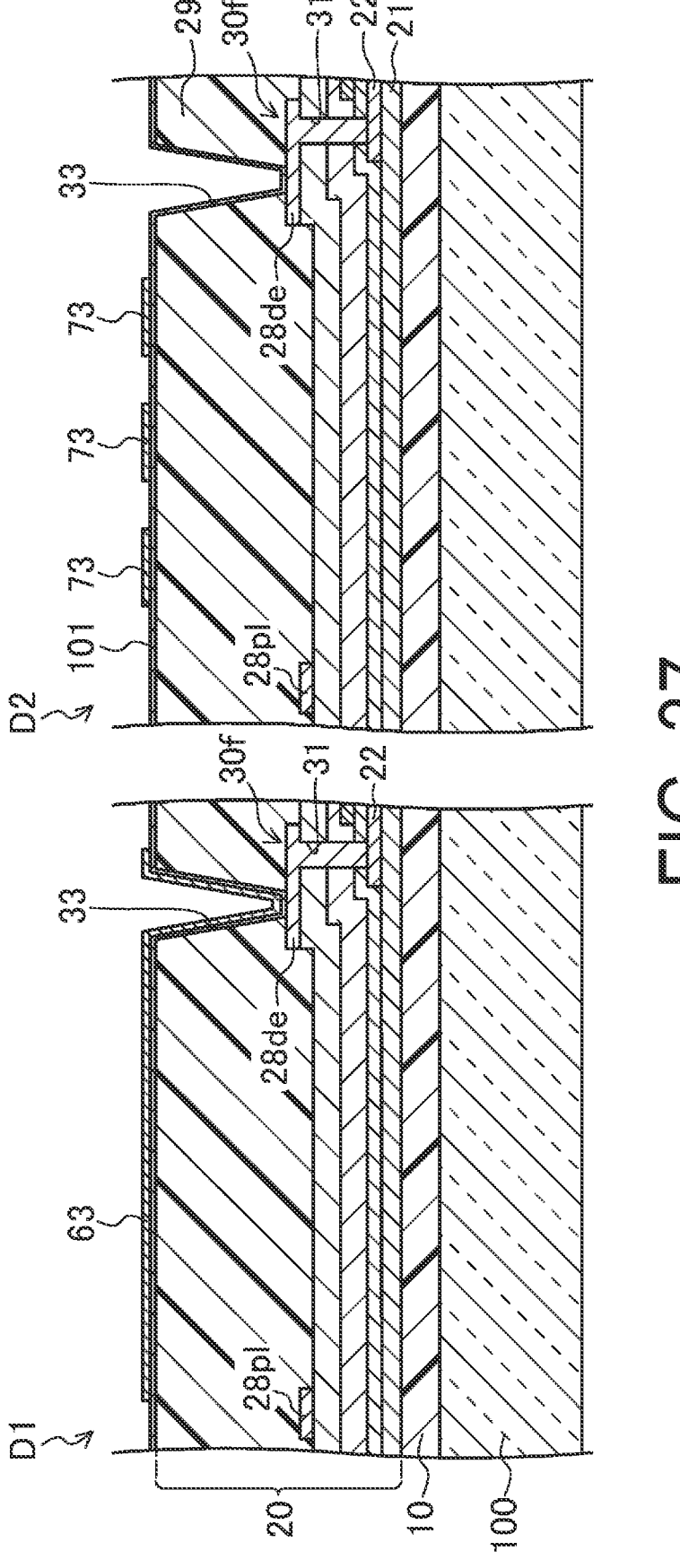

FIG. 37 is a cross-sectional view illustrating main portions of the substrate on which patterning has been performed in the first patterning step in the method of manufacturing the organic EL display device according to the third embodiment.

Figure 38:
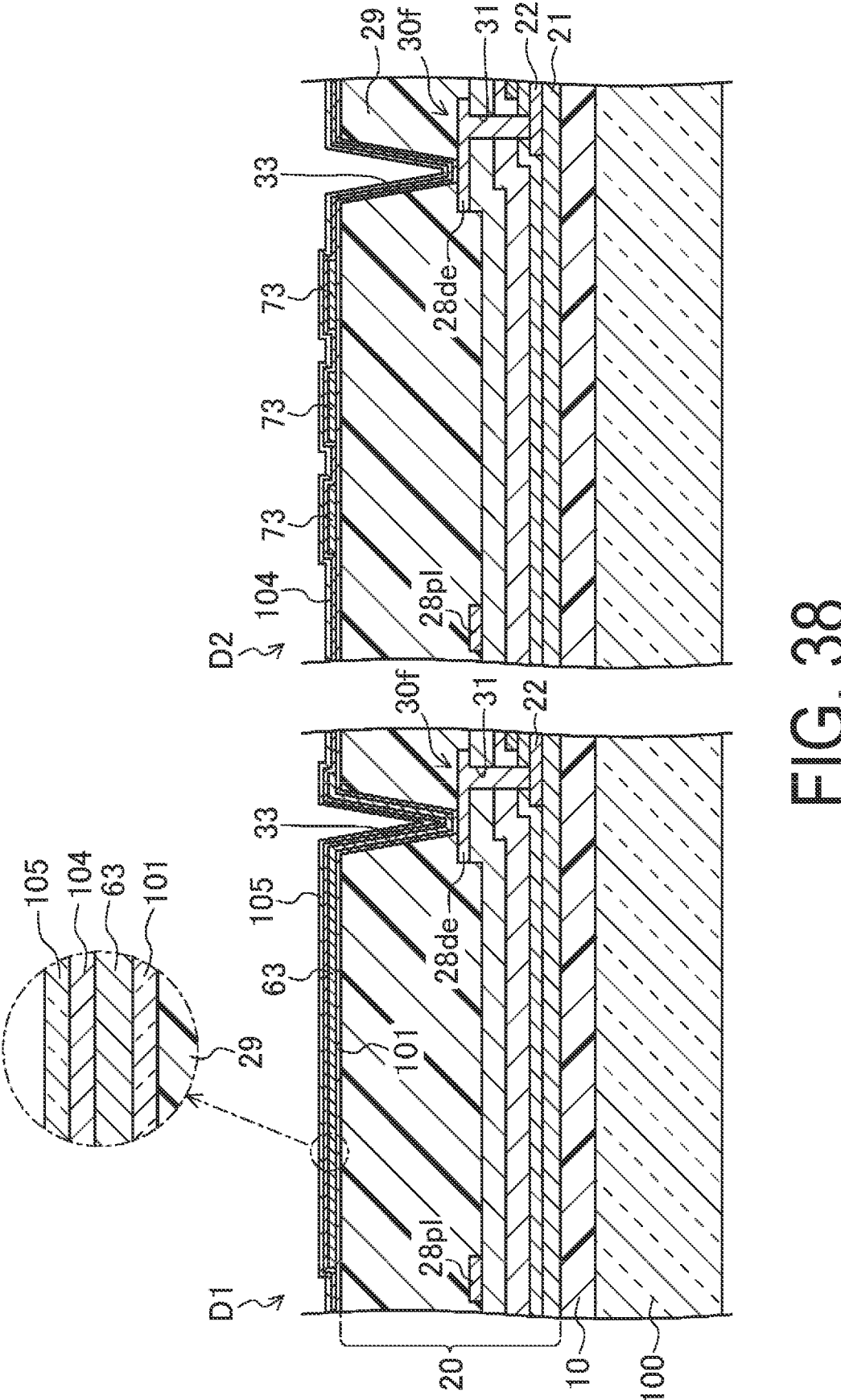

FIG. 38 is a cross-sectional view illustrating main portions of the substrate on which film formation has been performed in a second film forming step in the method of manufacturing the organic EL display device according to the third embodiment.

Figure 39:
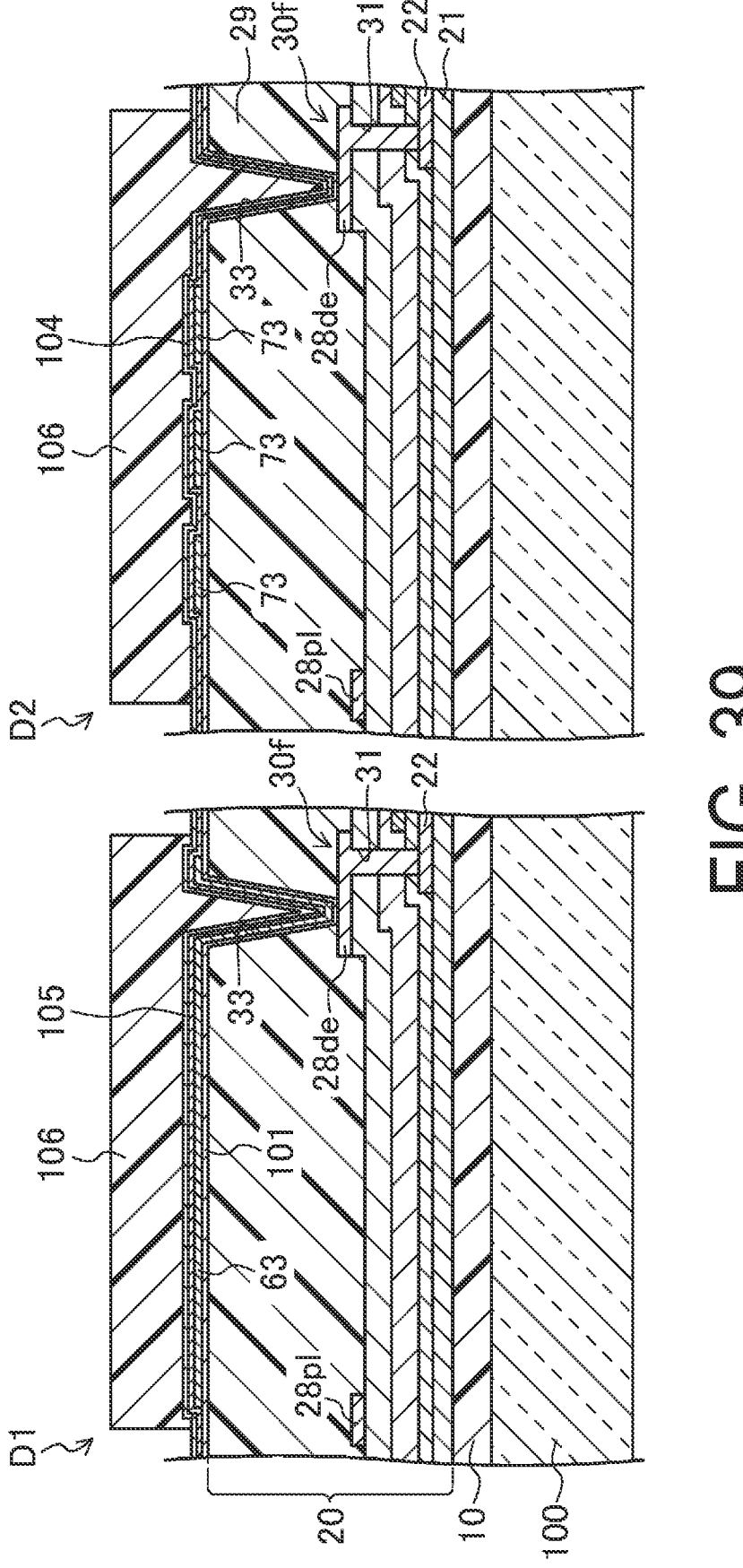

FIG. 39 is a cross-sectional view illustrating main portions of the substrate on which a resist layer has been formed in a second patterning step in the method of manufacturing the organic EL display device according to the third embodiment.

Figure 40:
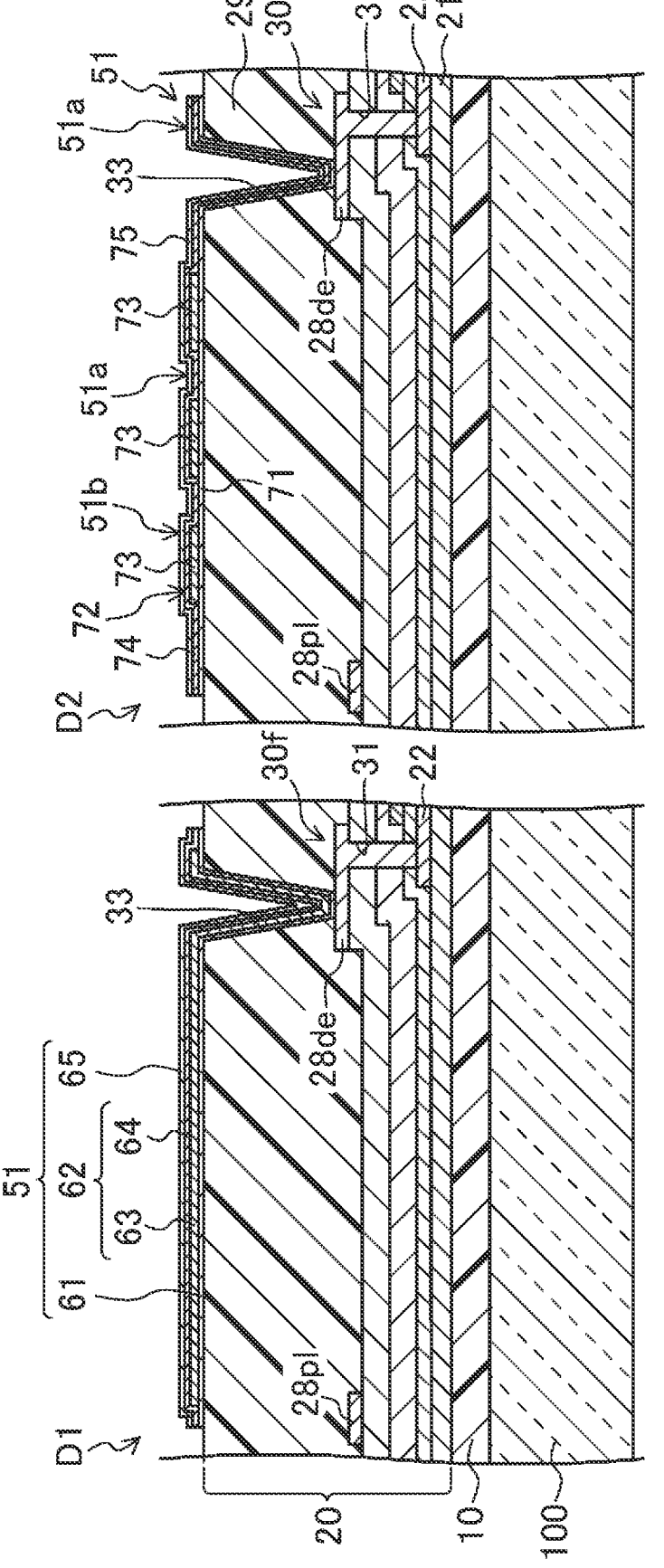

FIG. 40 is a cross-sectional view illustrating main portions of the substrate on which patterning has been performed in the second patterning step in the method of manufacturing the organic EL display device according to the third embodiment.

Figure 41:
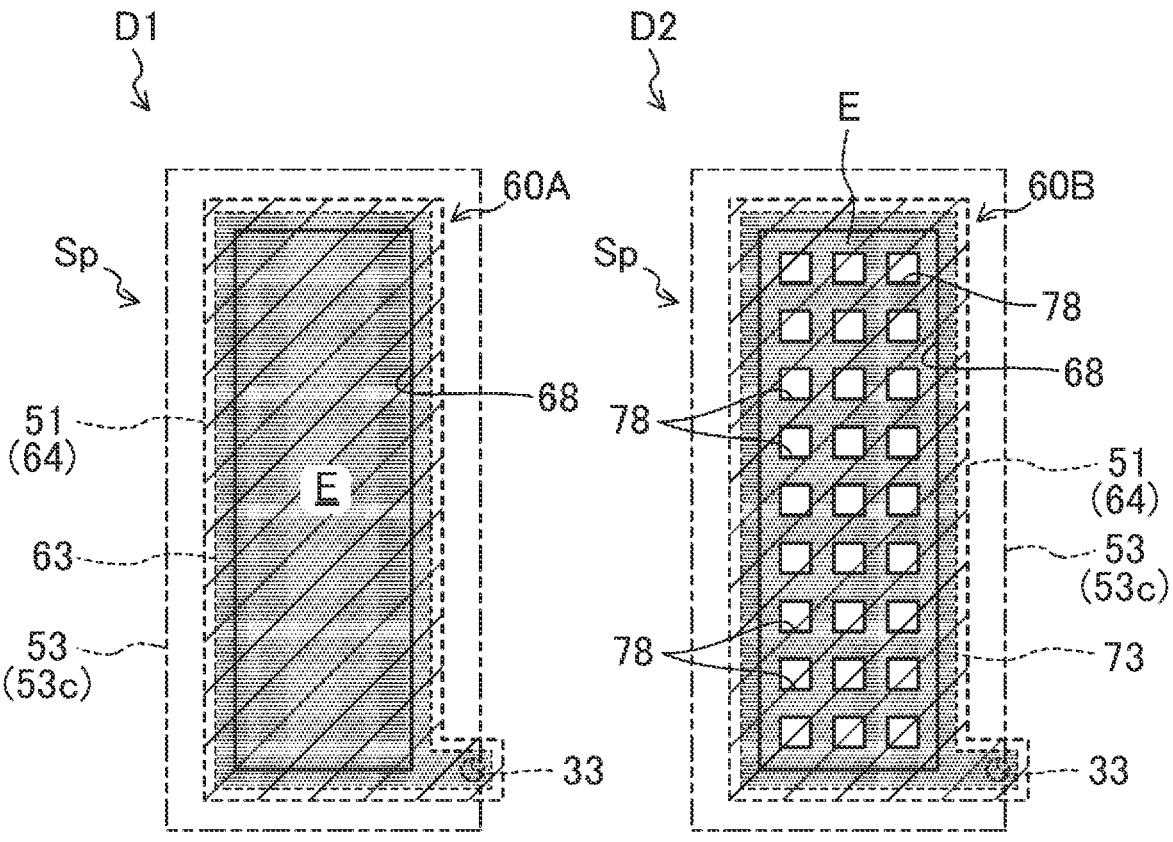

FIG. 41 is a plan view illustrating configurations of light-emitting regions and the peripheral configurations thereof in the first display region and the second display region of the organic EL display device according to a modification example of the third embodiment.

DESCRIPTION OF EMBODIMENTS

Exemplary embodiments will be described below in detail with reference to the drawings. In the following embodiments, an organic EL display device including organic EL elements will be described as an example of a display device according to the technique of the disclosure.

Note that, in the following embodiments, a description stating that a constituent element such as a film, layer, element, or the like is provided or formed on another constituent element such as another film, layer, element, or the like means not only a case in which a constituent element is provided directly on another constituent element, but also a case in which still another constituent element such as still another film, layer, element, or the like is interposed between the constituent element and the other constituent element.

Further, in the following embodiments, a description stating that a constituent element such as a film, layer, element, or the like is connected to another constituent element such as another film, layer, element, or the like means that the constituent element and the other constituent element are electrically connected to each other unless otherwise stated. This description means, without departing from the gist of the technique of the disclosure, not only a case in which a constituent element is directly connected to another constituent element, but also a case in which a constituent element and another constituent element are indirectly connected to each other with still another constituent element such as still another film, layer, element, or the like interposed therebetween. This description also includes a case in which a constituent element is integrated with another constituent element, namely, a part of a constituent element constitutes another constituent element.

Further, in the following embodiments, a description stating that a constituent element such as a film, layer, element, or the like is in the same layer as another constituent element such as another film, layer, element, or the like means that the constituent element and the other constituent element are formed by the same process. A description stating that a constituent element such as a film, layer, element, or the like is in a layer below another constituent element such as another film, layer, element, or the like means that the constituent element is formed by an earlier process than that of the other constituent element. A description stating that a constituent element such as a film, layer, element, or the like is in a layer above another constituent element such as another film, layer, element, or the like means that the constituent element is formed by a later process than that of the other constituent element.

Further, in the following embodiments, a description stating that a constituent element such as a film, layer, element, or the like is identical or equivalent to another constituent element such as another film, layer, element, or the like means not only a state in which the constituent element and the other constituent element are completely identical or completely equivalent to each other, but also a state in which the constituent element and the other constituent element are substantially identical or substantially equivalent to each other within a range in which they vary due to manufacturing variations or tolerable errors.

Further, in the following embodiments, the terms "first", "second", "third". . . are used to distinguish the objects to which those terms are attached, and do not limit the number of objects or the order of the objects in any way.

First Embodiment

Figure 1:
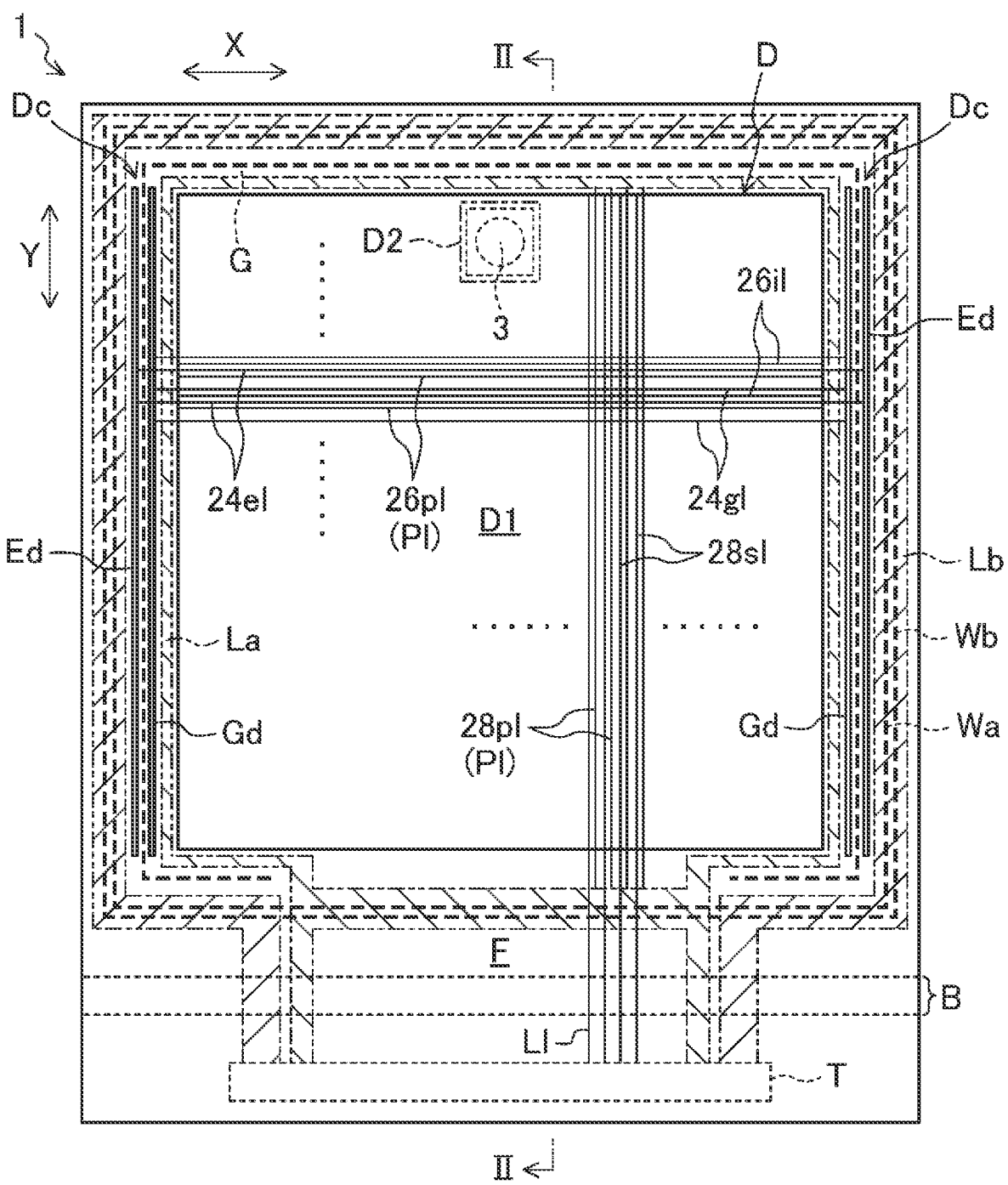
FIG. 1 is a plan view illustrating a schematic configuration of an organic EL display device according to a first embodiment.
Figure 2:
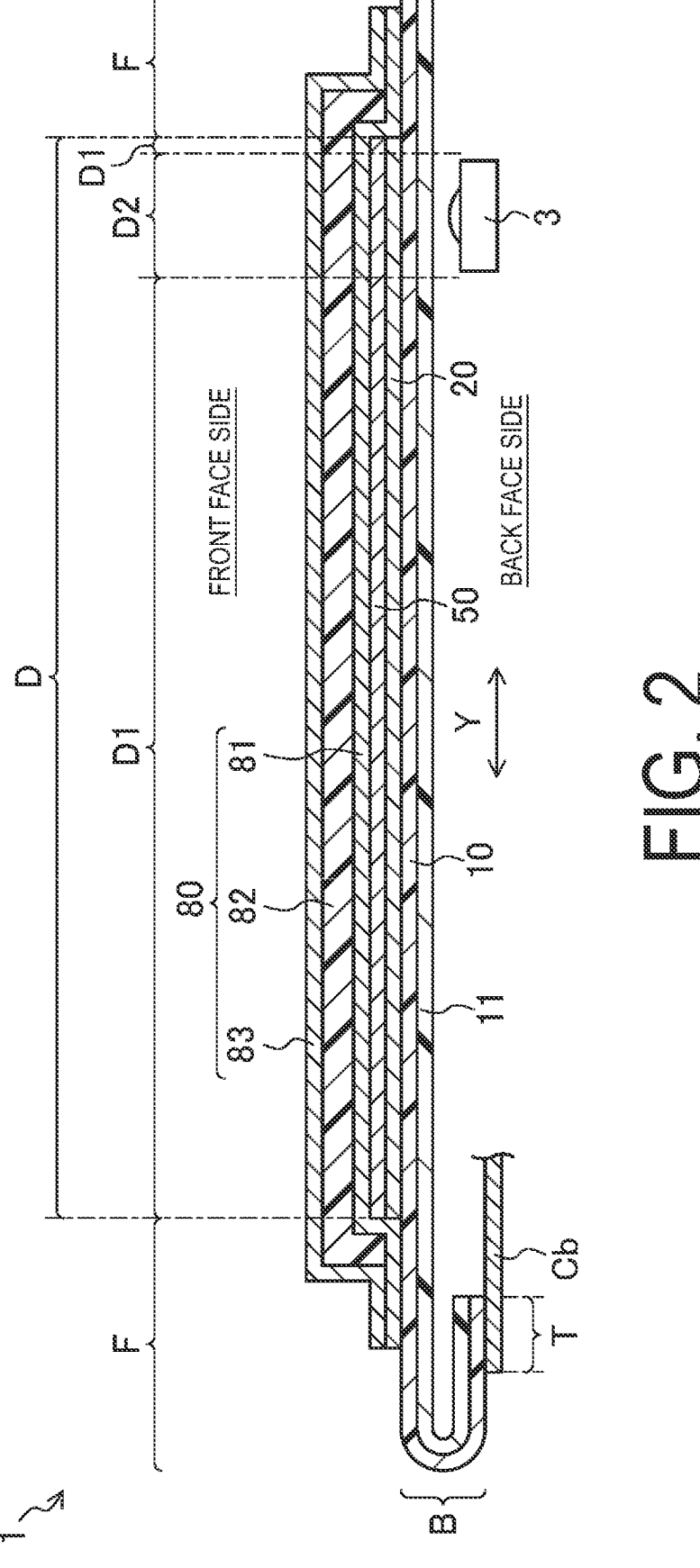
FIG. 2 is a cross-sectional view of the organic EL display device in a part along line II-II in FIG. 1.
Figure 3:
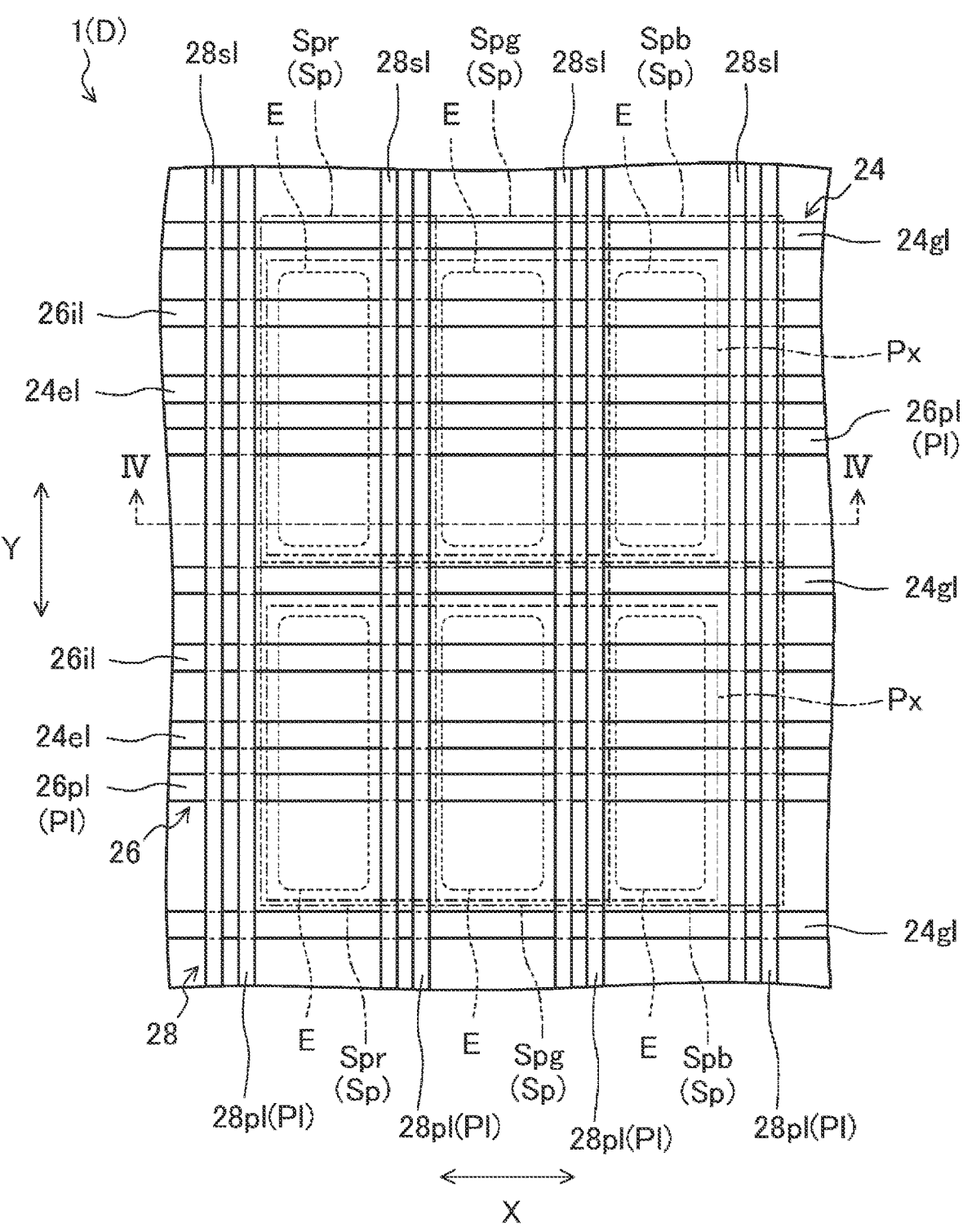
FIG. 3 is a plan view illustrating pixels and various display wiring lines which constitute a display region of the organic EL display device.
Figure 4:
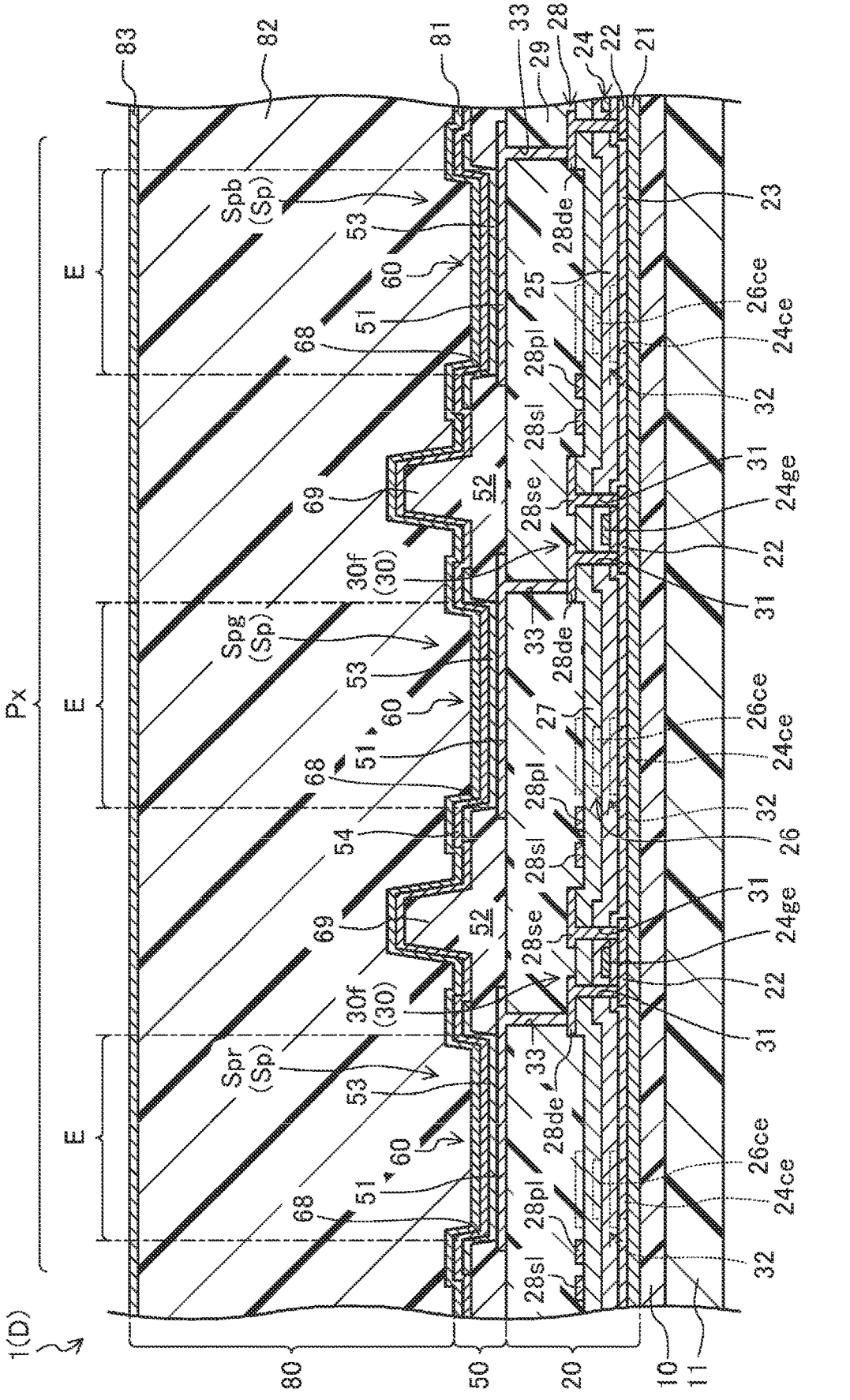
FIG. 4 is a cross-sectional view of the organic EL display device in a part along line IV-IV in FIG. 3.

FIG. 1 to FIG. 4 illustrate an example of an organic EL display device 1 according to the technique of the disclosure. FIG. 1 is a plan view illustrating a schematic configuration of the organic EL display device 1 according to a first embodiment. FIG. 2 is a cross-sectional view of the organic EL display device 1 in a part along line II-II in FIG. 1. FIG. 3 is a plan view illustrating pixels Px and various display wiring lines which constitute a display region D of the organic EL display device 1. FIG. 4 is a cross-sectional view of the organic EL display device 1 in a part along line IV-IV in FIG. 3.

Configuration of Organic EL Display Device

As illustrated in FIG. 1 and FIG. 2, the organic EL display device 1 constitutes a display device, provided with an in-camera, which is combined with a camera 3 that captures an image of the side in front of a screen. The organic EL display device 1 includes the display region D that displays an image, and a frame region F provided in the periphery of the display region D. The camera 3 is disposed on the back face side of the display region D with respect to a resin substrate layer 10 of the organic EL display device 1, and is provided at a position overlapping the display region D in a plan view.

The camera 3 is an electronic component that uses light for image capture transmitted through a light-emitting element layer 50, a TFT layer 20, and the resin substrate layer 10, which will be described below, from the front face side of the display region D in the organic EL display device 1. For example, the camera 3 includes a charge coupled device (CCD), a complementary metal oxide semiconductor (CMOS) image sensor, or the like. The camera 3 is installed inside a housing (not illustrated) that houses the organic EL display device 1.

The display region D is a rectangular region constituting a screen. Note that, in the present embodiment, although the display region D having a rectangular shape is illustrated as an example, the display region D may have a substantially rectangular shape such as a shape whose sides are arc-shaped, a shape whose corners are arc-shaped, a shape in which a part of a side has a notch, or the like. As illustrated in FIG. 3, the display region D includes a plurality of pixels Px.

The plurality of pixels Px are arrayed in a matrix. Each of the pixels Px is constituted by three subpixels Sp. The three subpixels Sp are a subpixel Spr including a light-emitting region E that emits red light, a subpixel Spg including the light-emitting region E that emits green light, and a subpixel Spb including the light-emitting region E that emits blue light. These three subpixels Spr, SPg, and Spb are arrayed in a stripe shape, for example.

As illustrated in FIG. 1 and FIG. 2, the display region D includes a first display region D1 and a second display region D2. The first display region D1 is a region that occupies a large portion of the display region D. The second display region D2 is located. inside the first display region D1. The second display region D2 is a region including a portion of the display region D that transmits light used for image capture by the camera 3. The second display region D2 is provided in a rectangular island-shape on the upper side of the display region D, for example, and is surrounded by the first display region D1. The second display region D2 may have the substantially rectangular shape as described above, or may have another shape such as a circular shape or an elliptical shape.

The frame region F is a region having a rectangular frame shape and constituting a non-display portion other than the screen. A terminal portion T to be connected to an external circuit is provided in a portion constituting one side of the frame region F. A bending portion B that is bendable with a first direction X, which is the horizontal direction in FIG. 1, as the bending axis is provided between the display region D and the terminal portion T in the frame region F.

The terminal portion T is disposed on the back face side of the organic EL display device 1 by the frame region being bent, for example, by 180 degrees (in a U shape) at a bending portion B. The terminal portion T is connected to a wiring line substrate Cb such as a flexible printed circuit (FPC). A plurality of lead-out wiring lines Ll drawn from the display region D to the terminal portion T are provided in the frame region F. The plurality of lead-out wiring lines Ll are connected to a display control circuit (not illustrated) via the wiring line substrate Cb at the terminal portion T.

In the frame region F, in a flattening film 29 to be described below, a trench G is provided so as to surround the display region D. The trench G extends in a substantially C-shape in a plan view, and is open on the terminal portion T side. The trench G penetrates the flattening film 29, and divides the flattening film 29 into an inner side and an outer side of the frame region F. The trench G plays a role of preventing infiltration of moisture or the like into the display region D. The trench G may be provided over the entire periphery of the display region D.

In the frame region F, a drive circuit Dc including a gate driver Gd and an emission driver Ed is monolithically provided in a portion constituting sides adjacent to the side at which the terminal portion T is provided (both left and right sides in FIG. 1). The gate driver Gd is disposed further to the display region D side than the trench G. The emission driver Ed is disposed further to the outer peripheral side of the frame region F than the trench G. The arrangement of the gate driver Gd and the emission driver Ed with respect to the trench G may be reversed.

The frame region F is provided with a first frame wiring line La (hatched by an upper left diagonal line in FIG. 1) and a second frame wiring line Lb (hatched by an upper right diagonal line in FIG. 1). The first frame wiring line La is provided in a frame shape further to the display region D side than the trench G and the drive circuit Dc. The first frame wiring line La extends to the terminal portion T through the open portion of the trench G in the frame region F. A high-level power supply voltage (ELVDD) is input to the first frame wiring line La. via the wiring line substrate Cb at the terminal portion T. The second frame wiring line Lb is provided in a substantially C-shape further to the outer peripheral side of the frame region F than the trench G and the drive circuit Dc. Both end portions of the second frame wiring line Lb extend to the terminal portion T along the first frame wiring line La. A low-level power supply voltage (ELVSS) is input to the second frame wiring line Lb via the wiring line substrate Cb at the terminal portion T.

A first darn wall Wa and a second dam wall Wb are provided in the frame region F. The first darn wall Wa is provided in a frame shape on the outer side of the trench G. The second dam wall Wb is provided in a frame shape at the outer periphery of the first dam wall Wa. When applying an organic material that forms an organic sealing layer 82 constituting a sealing film 80 during a manufacturing process of the organic EL display device 1, the first dam wall Wa and the second darn wall Wb play a role of holding back an expansion of the organic material to the outer side of the frame region F. Although not illustrated, the first darn wall Wa and the second dam wall Wb are each constituted by a first wall layer and a second wall layer provided on the first wall layer, for example.

The organic EL display device 1 adopts an active matrix driving method in which light emission from each of the subpixels Sp is controlled by a TFT 30 and an image is displayed by the action of the TFT 30. As illustrated in FIG. 2 and FIG. 4, the organic EL display device 1 includes the resin substrate layer 10, the TFT layer 20 provided on the resin substrate layer 10, the light-emitting element layer 50 provided on the TFT layer 20, and the sealing film 80 provided so as to cover the light-emitting element layer 50.

Resin Substrate Layer

The resin substrate layer 10 is an example of a substrate forming a base. The resin substrate layer 10 is formed, for example, of an organic material such as a polyimide resin, a polyamide resin, or an epoxy resin. The resin substrate layer has flexibility. The resin substrate layer 10 may be constituted by a layered film formed by an inorganic insulating layer made of an inorganic material such as silicon oxide, silicon nitride, silicon oxynitride, and a resin layer made of the above-described organic material. A rear surface protection film 11 is bonded to the back face of the resin substrate layer 10.

TFT Layer

The TFT layer 20 includes a base coat film 21, a semiconductor layer 22, a gate insulating film 23, a first conductive layer 24, a first interlayer insulating film 25, a second conductive layer 26, a second interlayer insulating film 27, a third conductive layer 28, the flattening film 29 and the first wall layer which are provided in order on the resin substrate layer 10.

First to Third Conductive Layers

The first conductive layer 24, the second conductive layer 26, and the third conductive layer 28 include various wiring lines and electrodes.

The first conductive layer 24 is provided on the gate insulating film 23. The first conductive layer 24 includes a plurality of gate wiring lines 24*gl*, a plurality of gate electrodes 24*ge*, a plurality of emission control wiring lines 24*el*, a plurality of first capacitance electrodes 24*ce*, and a plurality of first lead-out wiring lines. The gate wiring lines 24*gl*, the gate electrodes 24*ge*, the emission control wiring lines 24*el*, the first capacitance electrodes 24*ce*, and the first lead-out wiring lines are constituted by a single-layer film or a layered film of a metal layer of, for example. aluminum (Al), tungsten (W), molybdenum (Mo), tantalum (Ta), chromium (Cr), titanium (Ti), copper (Cu), or the like, and are each formed of the same material and in the same layer.

The second conductive layer 26 is provided on the first interlayer insulating film 25. The second conductive layer 26 includes a plurality of initialization power source wiring lines 26*il*, a plurality of first power source wiring lines 26*pl*, and a plurality of second capacitance electrodes 26*ce*. The initialization power source wiring lines 26*il*, the first power source wiring lines 26*pl*, and the second capacitance electrodes 26*ce* are constituted by a single-layer film or a layered film of a metal layer of, for example, aluminum (Al), tungsten (W), molybdenum (Mo), tantalum (Ta), chromium (Cr), titanium (Ti), copper (Cu), or the like, and are each formed of the same material and in the same layer.

The third conductive layer 28 is provided on the second interlayer insulating film 27. The third conductive layer 28 includes a plurality of source wiring lines 28*sl*, a plurality of source electrodes 28*se*, a plurality of drain electrodes 28*de*, a plurality of connecting conductive portions 28*cp*, a plurality of second power source wiring lines 28*pl*, a plurality of second lead-out wiring lines, the first frame wiring line La, and the second frame wiring line Lb. The source wiring lines 28*sl*, the source electrodes 28*se*, the drain electrodes 28*de*, the second power source wiring lines 28*pl*, the second lead-out wiring lines, the first frame wiring line La, and the second frame wiring line Lb are constituted by a single-layer film or a layered film of a metal layer of, for example, aluminum (Al), tungsten (W), molybdenum (Mo), tantalum (Ta), chromium (Cr), titanium (Ti), copper (Cu), or the like, and are each formed of the same material and in the same layer.

Various Wiring Lines

As illustrated in FIG. 3, the plurality of gate wiring lines 24*gl* are provided in the display region D and extend parallel to each other in a first direction X. The gate wiring line 24*gl* is a display wiring line that transmits a gate signal and is provided for each row of the subpixels Sp. Each of the gate wiring lines 24*gl* is connected to the gate driver Gd, selected at a predetermined timing, and brought into an active state.

The plurality of emission control wiring lines 24*el* are provided in the display region D and extend parallel to each other in the first direction X. The emission control wiring line 24*el* is a display wiring line that transmits an emission control signal and is provided for each row of the subpixels Sp. The emission control wiring lines 24*el* are connected to the emission driver Ed, selected at a predetermined timing in order, and brought into an inactive state.

The plurality of first lead-out wiring lines are provided in the frame region F and extend parallel to each other in a second direction Y, which is the vertical direction in FIG. 1 orthogonal to the first direction X. Each of the first lead-out wiring lines is a connection wiring line that connects the display wiring line, such as the source wiring line 28*sl*, to the terminal portion T, and constitutes a portion of the lead-out wiring line L1.

The plurality of initialization power source wiring lines 26*il* are provided in the display region D and extend parallel to each other in the first direction X. The initialization power source wiring line 26*il* is a display wiring line that imparts an initialization potential and is provided for each row of the subpixels Sp.

The plurality of first power source wiring lines 26*pl* are provided in the display region D and extend parallel to each other in the first direction X. The first power source wiring line 26*pl* is a display wiring line that imparts a predetermined high-level potential and is provided for each row of the subpixels Sp. Each of the first power source wiring lines 26*pl* is connected to the first frame wiring line La via a contact hole formed in the second interlayer insulating film 27.

The plurality of source wiring lines 28*sl* are provided in the display region D and extend parallel to each other in the second direction Y. The source wiring line 28*sl* is a display wiring line that transmits a source signal and is provided for each column of the subpixels Sp. Each of the source wiring lines 28*sl* is connected to the lead-out wiring line L1, and is connected to the display control circuit via the lead-out wiring line L1 and the terminal portion T.

The plurality of second power source wiring lines 28*pl* are provided in the display region D and extend parallel to each other in the second direction Y. The second power source wiring line 28*pl* is a display wiring line that imparts a predetermined high-level potential and is provided for each column of the subpixels Sp. Each of the second power source wiring lines 28*pl* is connected to the first frame wiring line La, and intersects with each of the first power source wiring lines 26*pl*. Each of the second power source wiring lines 28*pl* is connected to the first power source wiring line 26*pl* at an intersection therebetween via a contact hole (not illustrated) which is formed in the second interlayer insulating film 27. The plurality of second power source wiring lines 28*pl* constitute a high-level power source wiring line Pl together with the plurality of first power source wiring lines 26*pl*.

The plurality of second lead-out wiring lines are provided in the frame region F and extend parallel to each other in the second direction Y. Each of the second lead-out wiring lines is connected to the first lead-out wiring line via a contact hole formed in the first interlayer insulating film 25 and the second interlayer insulating film 27. Each of the second lead-out wiring lines is a connection wiring line that connects the display wiring line such as the source wiring line 28*sl* to the terminal portion T, and constitutes the lead-out wiring line L1 together with the first lead-out wiring line.

Various Electrodes

The plurality of gate electrodes 24*ge*, source electrodes 28*se*, and drain electrodes 28*de* are provided for each of the subpixels Sp, and constitute the TFT 30 together with the gate insulating film 23, the first interlayer insulating film 25, and the second interlayer insulating film 27. At least one of the first capacitance electrodes 24*ce* and at least one of the second capacitance electrodes 26*ce* are provided for each of the subpixels Sp and constitute a capacitor 32 together with the first interlayer insulating film 25.

TFT

A plurality of the TFTs 30 are provided for each of the subpixels Sp. In other words, the TFT layer 20 includes the plurality of TFTs 30. Each of the plurality of TFTs 30 is a top-gate type TFT. Each of the TFTs 30 is constituted by the semiconductor layer 22, the gate insulating film 23, the gate electrode 24*ge*, the first interlayer insulating film 25 and the second interlayer insulating film 27, and the source electrode 28*se* and the drain electrode 28*de*.

The semiconductor layer 22 is provided in an island shape. The semiconductor layer 22 is formed of a low temperature polycrystalline silicon (LTPS), an oxide semiconductor such as an indium gallium zinc oxide (In—Ga—Zn—O based), or the like, for example.

The gate insulating film 23 is provided so as to cover the semiconductor layer 22. The gate insulating film 23 is formed of a single-layer film or a layered film formed by an inorganic insulating layer of, for example, silicon oxide, silicon nitride, silicon oxynitride, or the like. The gate electrode 24*ge* is provided at a position overlapping a part (channel region) of the semiconductor layer 22 via the gate insulating film 23.

The first interlayer insulating film 25 is provided so as to cover the gate wiring lines 240, the gate electrodes 24*ge*, the emission control wiring lines 24*el*, and the first capacitance electrodes 24*ce*. The second interlayer insulating film 27 is provided on the first interlayer insulating film 25 so as to cover the initialization power source wiring lines 26*il*, the first power source wiring lines 26*pl*, and the second capacitance electrodes 26*ce*. Each of the first interlayer insulating film 25 and the second interlayer insulating film 27 is formed of a single-layer film or a layered film formed by an inorganic insulating layer of, for example, silicon oxide, silicon nitride, silicon oxynitride, or the like.

The source electrode 28*se* and the drain electrode 28*de* are separated from each other. The source electrode 28*se* and the drain electrode 28*de* are connected to different portions (source region and drain region) at positions in the semiconductor layer 22, which sandwich a region overlapping the gate electrode 24*ge*, through a contact hole 31 formed in the gate insulating film 23, the first interlayer insulating film 25, and the second interlayer insulating film 27.

Capacitor

At least one of the capacitors 32 is provided for each of the subpixels Sp. In other words, the TFT layer 20 includes a plurality of the capacitors 32. Each of the plurality of capacitors 32 is constituted by the first capacitance electrode 24*ce*, the first interlayer insulating film 25, and the second capacitance electrode 26*ce*.

The first capacitance electrode 24*ce* is connected to three of the TFTs 30 (a first TFT 30*a*, a second TFT 30*b*, and a fourth TFT 30*d*), of the plurality of TFTs 30 provided for each of the subpixels Sp. The second capacitance electrode 26*ce* is provided at a position overlapping the first capacitance electrode 24*ce* via the first interlayer insulating film 25. The second capacitance electrode 26*ce* is connected to the high-level power source wiring line Pl.

Pixel Circuit

Figure 5:
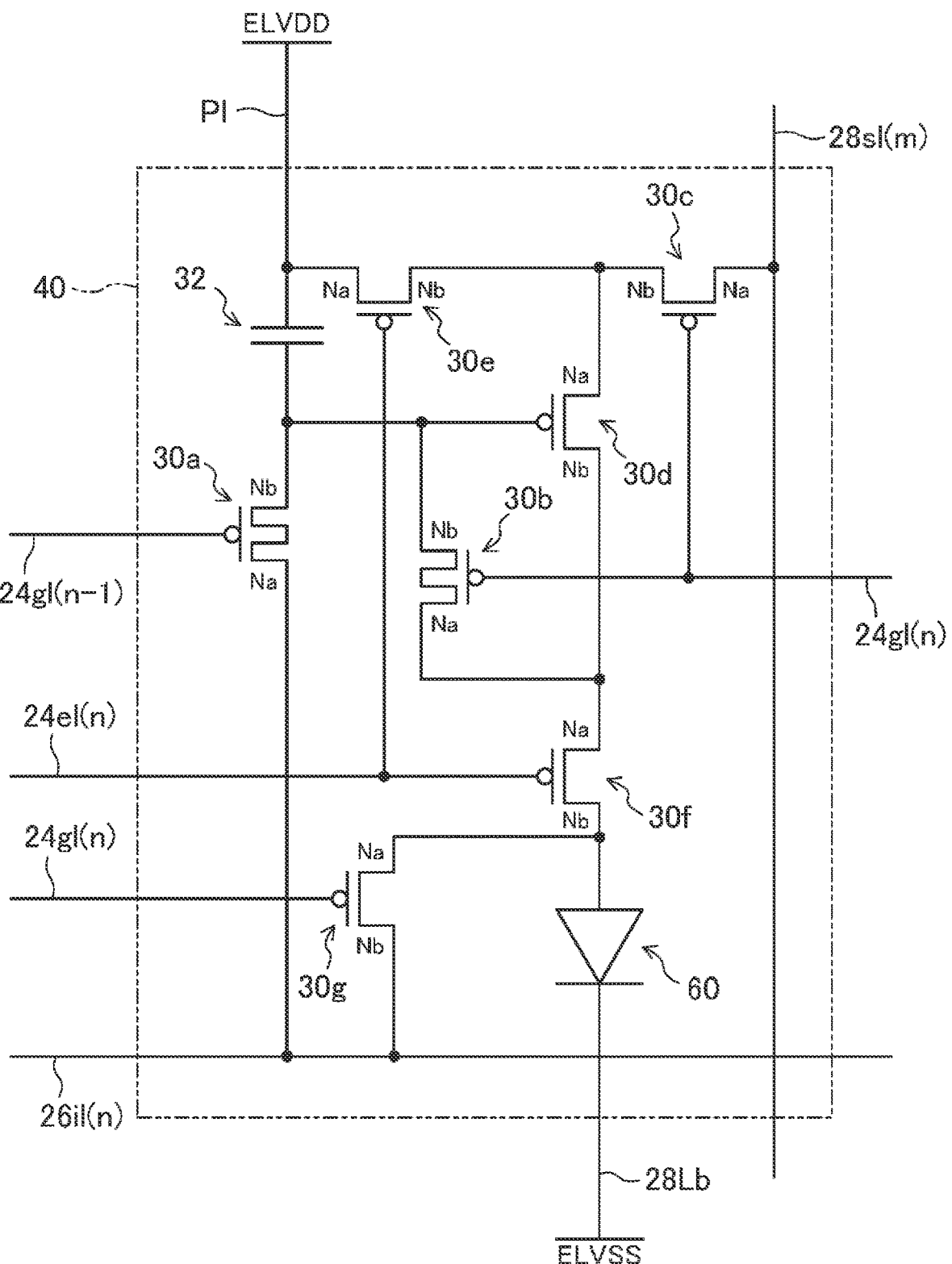
FIG. 5 is an equivalent circuit diagram illustrating a pixel circuit of the organic EL display device according to the first embodiment.

FIG. 5 is an equivalent circuit diagram illustrating a pixel circuit 40.

The plurality of TFTs 30 and the capacitor 32 provided for each of the subpixels Sp constitute the pixel circuit 40, as illustrated in FIG. 5. The pixel circuit 40 controls light emission in the light-emitting region E of the corresponding subpixel Sp based on the gate signal supplied from the gate wiring line 24*gl*, the emission signal supplied from the emission control wiring line 24*el*, the source signal supplied from the source wiring line 28*sl*, the initialization potential supplied from the initialization power source wiring line 26*il*, and the high-level potential supplied from the high-level power source wiring line Pl.

The pixel circuit 40 illustrated in FIG. 5 is the pixel circuit 40 of the subpixel Sp in the m-th row and n-th column (m and n are positive integers). In FIG. 5, the source wiring line 28*sl*, to which (m) is added to the reference numeral thereof, is the source wiring line 28*sl* corresponding to the subpixels Sp in the m-th row. The gate wiring line 24*gl* and the emission control wiring line 24*el*, to which (n) is added to the reference numerals thereof, are the gate wiring line 24*gl* and the emission control wiring line 24*el* corresponding to the subpixels Sp in the n-th column. Further, the gate wiring line 24*gl*, to which (n−1) is added to the reference numeral thereof, is the gate wiring line 24*gl* that is scanned immediately before the gate wiring line 24*gl* in the n-th column.

The plurality of TFTs 30 constituting the pixel circuit 40 include the first TFT 30*a*, the second TFT 30*b*, a third TFT 30*c*, the fourth TFT 30*d*, a fifth TFT 30*e*, a sixth TFT 30*f*, and a seventh TFT 30*g*. These first to seventh TFTs 30*a*, 30*b*, 30*c*, 30*d*, 30*e*, 30*f*, and 30*g* are each, for example, a P-channel type TFT. In the first to seventh TFTs 30*a*, 30*b*, 30*c*, 30*d*, 30*e*, 30*f*, and 30*g*, the gate electrode 24*ge* corresponds to a control terminal, one electrode of the source electrode 28*se* and the drain electrode 28*de* corresponds to a first conduction terminal Na, and the other electrode corresponds to a second conduction terminal Nb.

The first TFT 30*a* is a first initialization TFT provided between the gate wiring line 24*gl*(n−1), the initialization power source wiring line 26*il*, and the capacitor 32. A control terminal of the first TFT 30*a* is connected to the gate wiring line 24*gl*(n−1). The first conduction terminal Na of the first TFT 30*a* is connected to the initialization power source wiring line 26*il*. The second conduction terminal Nb of the first TFT 30*a* is connected to the first capacitance electrode 24*ce* of the capacitor 32. This first TFT 30*a* initializes a voltage applied to a control terminal of the fourth TFT 30*d* by applying a voltage of the initialization power source wiring line 26*il* to the capacitor 32 in response to the selection of the gate wiring line 24*gl*(n−1).

The second TFT 30*b* is a threshold voltage compensation TFT provided between the gate wiring line 24*gl*(n) and the fourth TFT 30*d*. A control terminal of the second TFT 30*b* is connected to the gate wiring line 24*gl*. The first conduction terminal Na of the second TFT 30*b* is connected to the second conduction terminal Nb of the fourth TFT 30*d*. The second conduction terminal Nb of the second TFT 30*b* is connected to the control terminal of the fourth TFT 30*d*. This second TFT 30*b* causes the fourth TFT 30*d* to be in a diode-connected state in response to the selection of the gate wiring line 24*gl*(n), and compensates for a threshold voltage of the fourth TFT 30*d*.

The third TFT 30*c* is a writing control TFT provided between the gate wiring line 24*gl*(n), the source wiring line 28*sl*(m), and the fourth TFT 30*d*. A control terminal of the third TFT 30*c* is connected to the gate wiring line 24*gl*(n). The first conduction terminal Na of the third TFT 30*c* is connected to the source wiring line 28*sl*(m). The second conduction terminal Nb of the third TFT 30*c* is connected to the first conduction terminal Na of the fourth TFT 30*d*. This third TFT 30*c* applies a voltage of the source wiring line 28*sl*(m) to the first conduction terminal Na of the fourth TFT 30*d* in response to the selection of the gate wiring line 24*gl*.

The fourth TFT 30*d* is a driving TFT provided between the first TFT 30*a*, the second TFT 30*b*, the capacitor 32, the third TFT 30*c*, the fifth TFT 30*e*, and the sixth TFT 30*f*. The control terminal of the fourth TFT 30*d* is connected to the second conduction terminal Nb of the second TFT 30*b* and the second conduction terminal Nb of the first TFT 30*a*. The first conduction terminal Na of the fourth TFT 30*d* is connected to the second conduction terminal Nb of the third TFT 30*c* and the second conduction terminal Nb of the fifth TFT 30*e*. The second conduction terminal Nb of the fourth TFT 30*d* is connected to the first conduction terminal Na of the second TFT 30*b* and the first conduction terminal Na of the sixth TFT 30*f*. This fourth TFT 30*d* applies a drive current corresponding to a voltage applied between the control terminal of its own element and the first conduction terminal Na, to the first conduction terminal Na of the sixth TFT 30*f*.

The fifth TFT 30*e* is a power supply TFT provided between an emission control wiring line 24*el*(n), the high-level power source wiring line Pl, and the fourth TFT 30*d*. A control terminal of the fifth TFT 30*e* is connected to the emission control wiring line 24*el*(n). The first conduction terminal Na of the fifth TFT 30*e* is connected to the high-level power source wiring line Pl. The second conduction terminal Nb of the fifth TFT 30*e* is connected to the first conduction terminal Na of the fourth TFT 30*d*. This fifth TFT 30*e* applies a potential of the high-level power source wiring line Pl to the first conduction terminal Na of the fourth TFT 30*d* in response to the selection of the emission control wiring line 24*el*.

The sixth TFT 30*f* is a light emission control TFT provided between the emission control wiring line 24*el*(n), the second TFT 30*b*, the fourth TFT 30*d*, and an organic EL element 60. A control terminal of the sixth TFT 30*f* is connected to the emission control wiring line 24*el*(n). The first conduction terminal Na of the sixth TFT 30*f* is connected to the second conduction terminal Nb of the fourth TFT 30*d*. The second conduction terminal Nb of the sixth TFT 30*f* is connected to a first electrode 51 of the organic EL element 60. This sixth TFT 30*f* applies a drive current to the organic EL element 60 in response to a selection of the emission control wiring line 24*el*(n).

The seventh TFT 30*g* is a second initialization TFT provided between the gate wiring line 24*gl*(n), the initialization power source wiring line 26*il*, and the organic EL element 60. A control terminal of the seventh TFT 30*g* is connected to the gate wiring line 24*gl*(n). The second conduction terminal Nb of the seventh TFT 30*g* is connected to the initialization power source wiring line 26*il*. The first conduction terminal Na of the seventh TFT 30*g* is connected to the first electrode 51 of the organic EL element 60. This seventh TFT 30*g* resets a charge accumulated in the first electrode 51 of the organic EL element 60 in response to the selection of the gate wiring line 24*gl*.

The capacitor 32 is a data holding element provided between the high-level power source wiring line Pl, the first TFT 30*a*, and the fourth TFT 30*d*. The first capacitance electrode 24*ce* of the capacitor 32 is connected to the control terminal of the fourth TFT 30*d*, the second conduction terminal Nb of the first TFT 30*a*, and the second conduction terminal Nb of the second TFT 30*b*. The second capacitance electrode 26*ce* of the capacitor 32 is connected to the high-level power source wiring line Pl. The capacitor 32 is charged at a voltage of the source wiring line 28*sl* when the gate wiring line 24*gl* is in a selected state. The capacitor 32 holds the voltage written by the charging to maintain the voltage applied to the control terminal of the fourth TFT 30*d* when the gate wiring line 24*gl* is in a non-selected state.

Flattening Film

The flattening film 29 covers the third conductive layer 28 (the source wiring lines 28*sl*, the second power source wiring lines 28*pl*, the source electrodes 28*se*, and the drain electrodes 28*de*) except at some of the drain electrodes 28*de* of the sixth TFT 30*f* in the display region D to flatten the surface of the TFT layer 20 so as to reduce a level difference generated due to the surface shape of the first TFT 30*a*, the second TFT 30*b*, the third TFT 30*c*, the fourth TFT 30*d*, the fifth TFT 30*e*, the sixth TFT 30*f*, and the seventh TFT 30*g*. The flattening film 29 is formed of an organic material such as a polyimide resin. A contact hole 33 for connecting the first electrode 51 to the drain electrode 28*de* of the sixth TFT 30*f* is formed for each organic EL element 60 in the flattening film 29.

First Wall Layer

Two of the first wall layers are provided at the outer periphery of the flattening film 29 in the frame region F. Each of the first wall layers is formed in a rectangular frame shape extending along the entire periphery of the flattening film 29. These two first wall layers have geometrically similar shapes and are spaced apart from each other in the width direction of the frame region F. Each of the first wall layers is formed of the same material as that of and in the same layer as the flattening film 29.

Light-Emitting Element Layer

Figure 6:
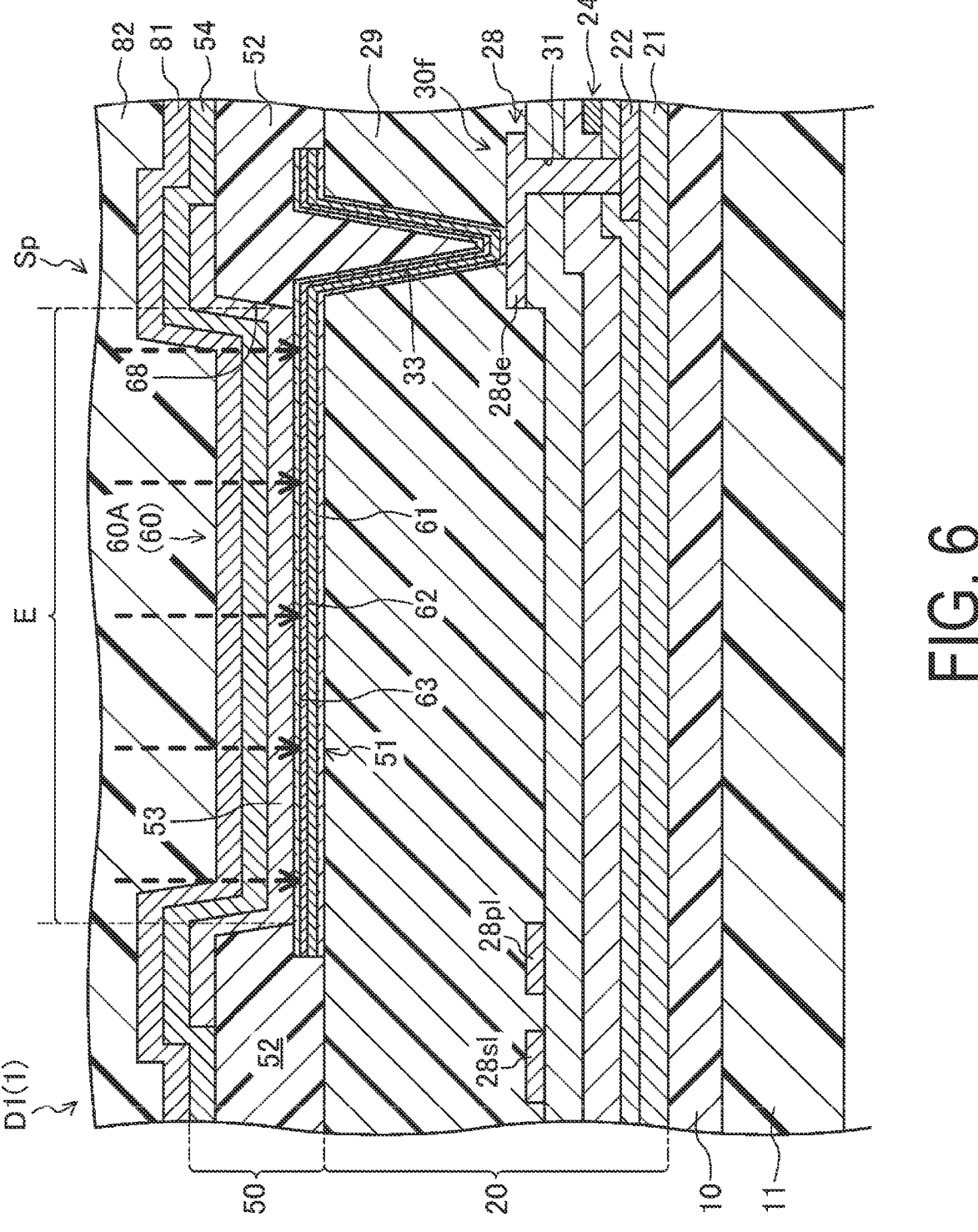
FIG. 6 is a cross-sectional view illustrating main portions in a first display region of the organic EL display device according to the first embodiment.
Figure 7:
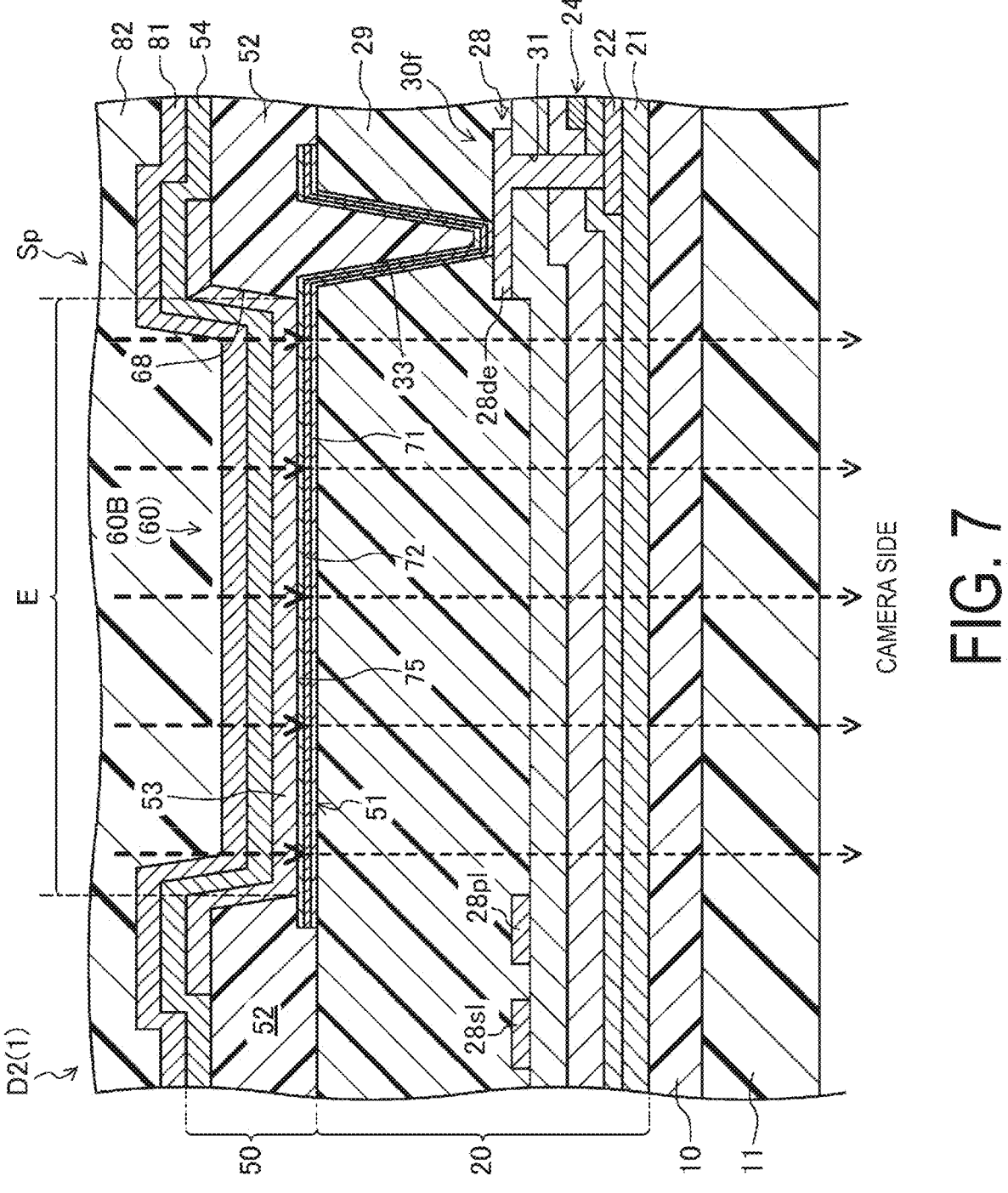
FIG. 7 is a cross-sectional view illustrating main portions in a second display region of the organic EL display device according to the first embodiment.
Figure 8:
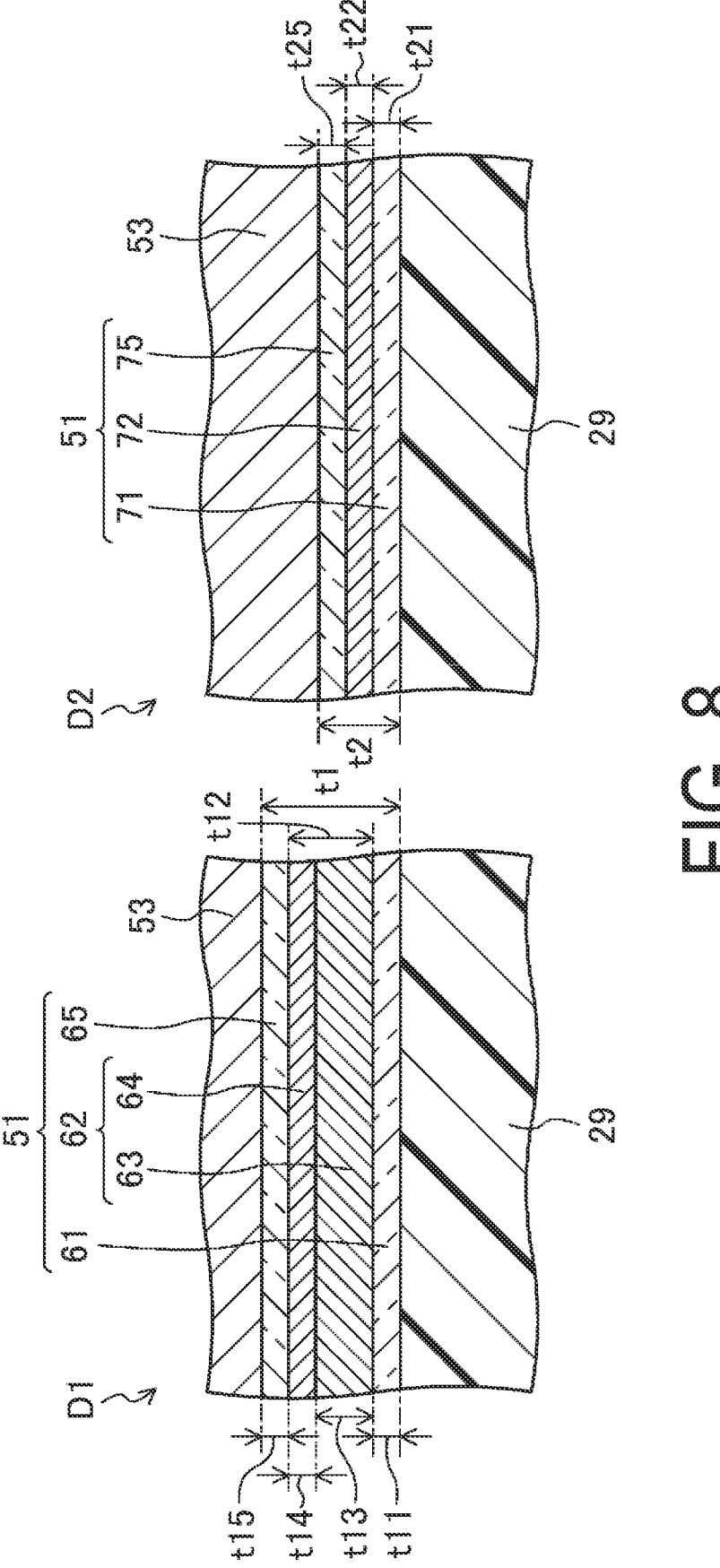
FIG. 8 is a cross-sectional view illustrating a layered structure of first electrodes in the first display region and the second display region of the organic EL display device according to the first embodiment.
Figure 9:
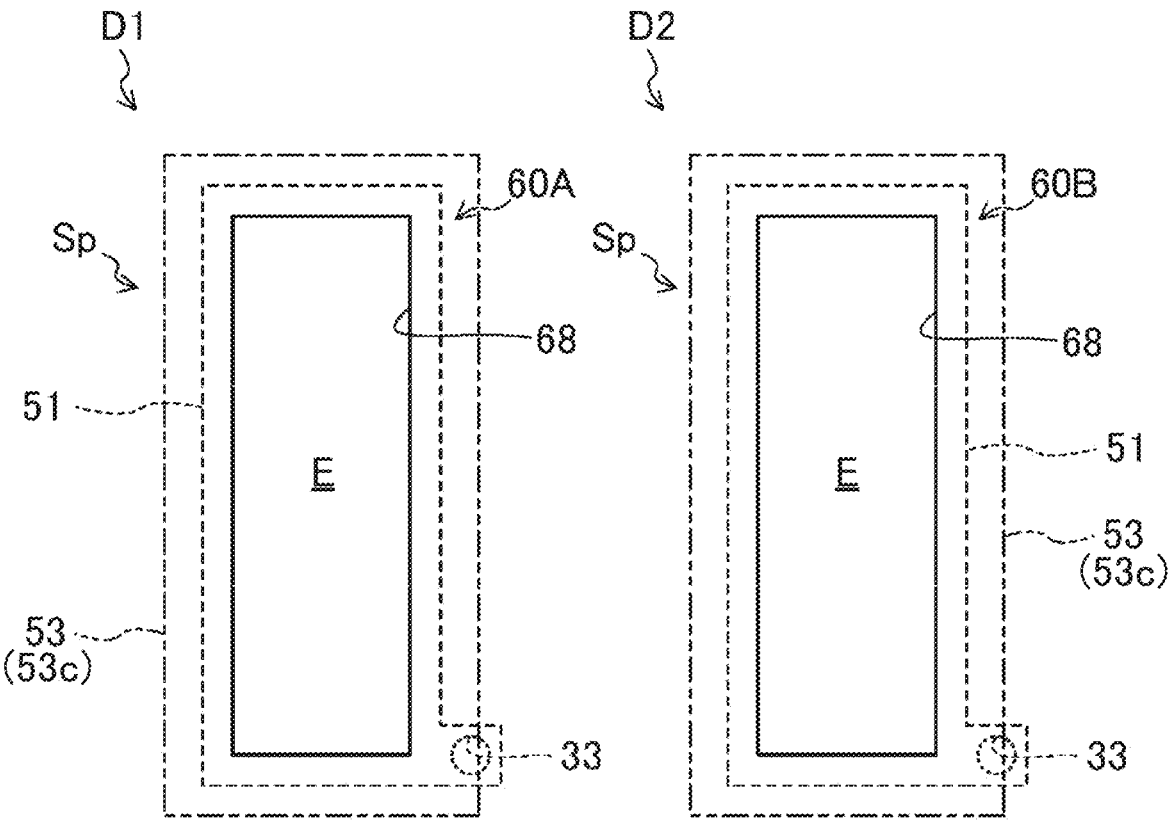
FIG. 9 is a plan view illustrating configurations of light-emitting regions and the peripheral configurations thereof in the first display region and the second display region of the organic EL display device according to the first embodiment.
Figure 10:
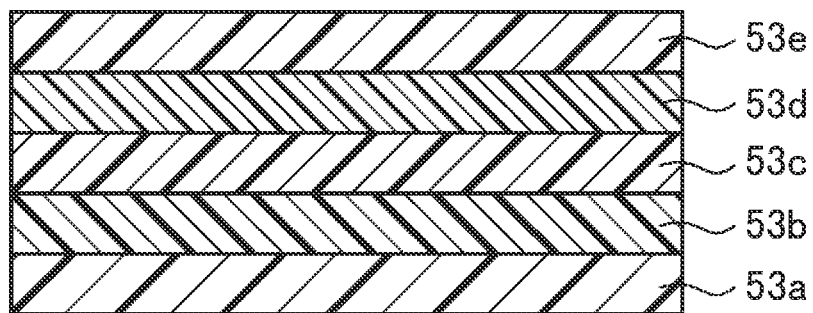
FIG. 10 is a cross-sectional view illustrating a layered structure of an organic EL layer constituting the organic EL display device according to the first embodiment.

FIG. 6 is a cross-sectional view illustrating main portions in the first display region D1 of the organic EL display device 1 according to the first embodiment. FIG. 7 is a cross-sectional view illustrating main portions in the second display region D2 of the organic EL display device 1 according to the first embodiment. FIG. 8 is a cross-sectional view illustrating a layered structure of the first electrodes 51 in the first display region D1 and the second display region D2 of the organic EL display device 1 according to the first embodiment. FIG. 9 is a plan view illustrating configurations of light-emitting regions E and the peripheral configurations thereof in the first display region D1 and the second display region D2 of the organic EL display device 1 according to the first embodiment. FIG. 10 is a cross-sectional view illustrating a layered structure of an organic EL layer 53 constituting the organic EL display device 1 according to the first embodiment.

As illustrated in FIG. 4, FIG. 6, and FIG. 7, the light-emitting element layer 50 includes the first electrode 51, an edge cover 52 and the second wall layer (not illustrated), the organic EL layer 53. and a second electrode 54, which are provided in order on the flattening film 29.

The first electrode 51, the organic EL layer 53, and the second electrode 54 constitute the organic EL element 60. The organic EL element 60 is an example of a light-emitting element. The organic EL element 60 adopts a top-emission type structure. The organic EL element 60 is provided for each of the subpixels Sp. In other words, the light-emitting element layer 50 includes a plurality of the organic EL elements 60.

The plurality of organic EL elements 60 include a plurality of first organic EL elements 60A (see FIG. 6) located in the first display region D1, and a plurality of second organic EL elements 60B (see FIG. 7) located in the second display region D2. Each of the first organic EL element 60A and the second organic EL element 60B includes the first electrode 51, the organic EL layer 53, and the second electrode 54.

First Electrode

The first electrode 51 is provided for each organic EL element 60 (for each of the subpixels Sp). The first electrode 51 is connected to the drain electrodes 28de of the sixth TFT 30f in the corresponding subpixel Sp via the contact hole 33 formed in the flattening film 29. The first electrode 51 functions as an anode that injects positive holes (holes) into the organic EL layer 53. The first electrode 51. is preferably formed of a material having a large work function to improve the efficiency of hole injection into the organic EL layer 53.

The first electrode 51 is formed such that the transmittance of light is different between the first organic EL element 60A and the second organic EL element 60B. The first electrode 51 of the first organic EL element 60A and the first electrode 51 of the second organic EL element 60B have a structure in which a plurality of conductive layers are layered, and the layer configurations of each other are different. As illustrated in FIG. 9, the first electrode 51 of the first organic EL element 60A and the first electrode 51 of the second organic EL element 60B have the same shape and an equal area in a plan view.

First Electrode of First Organic EL Element

As illustrated in FIG. 6 and FIG. 8, the first electrode 51 of the first organic EL element 60A includes a first lower transparent conductive layer 61, a first reflective conductive layer 62, and a first upper transparent conductive layer 65 which are provided in order on the flattening film 29.

The first lower transparent conductive layer 61 is a layer for suppressing corrosion of the first reflective conductive layer 62 and improving the adhesion of the first electrode 51 to the flattening film 29. The first lower transparent conductive layer 61 has light transmittance to transmit light. The first lower transparent conductive layer 61 is formed of, for example, at least one transparent conductive oxide selected from among indium tin oxide (ITO) and indium zinc oxide (IZO). A thickness t11 of the first lower transparent conductive layer 61 is, for example, approximately 10 nm to 20 nm.

The first reflective conductive layer 62 is provided on the first lower transparent conductive layer 61. The first reflective conductive layer 62 includes a first lower reflective conductive layer 63 and a first upper reflective conductive layer 64 provided on the first lower reflective conductive layer 63. Both the first lower reflective conductive layer 63 and the first upper reflective conductive layer 64 have light reflectivity to reflect light. Each of the first lower reflective conductive layer 63 and the first upper reflective conductive layer 64 is formed of at least one metal material selected from among silver (Ag), a silver alloy, aluminum (Al), and an aluminum alloy. The first upper reflective conductive layer 64 is thinner than the first lower reflective conductive layer 63 (t14<t13). A thickness t13 of the first lower reflective conductive layer 63 is, for example, approximately 70 nm to 90 nm. A thickness t14 of the first upper reflective conductive layer 64 is, for example, approximately 10 nm to 50 nm. The first reflective conductive layer 62 totally reflects or almost totally reflects light (conceptually indicated by a dashed arrow in FIG. 6) which is incident from the front face side of the display region D.

The first upper transparent conductive layer 65 is provided on the first reflective conductive layer 62. The first upper transparent conductive layer 65 is a layer for suppressing corrosion of the first reflective conductive layer 62. The first upper transparent conductive layer 65 has light transmittance to transmit light. The first upper transparent conductive layer 65 is formed of, for example, at least one transparent conductive oxide selected from among indium tin oxide (ITO) and indium zinc oxide (IZO). A thickness t15 of the first upper transparent conductive layer 65 is, for example, approximately 10 nm to 20 nm.

The first lower transparent conductive layer 61, the first lower reflective conductive layer 63, the first upper reflective conductive layer 64, and the first upper transparent conductive layer 65 have the same shape and an equal area in a plan view. The peripheral end surfaces of the first lower transparent conductive layer 61, the first lower reflective conductive layer 63, the first upper reflective conductive layer 64, and the first upper transparent conductive layer 65 are aligned in a direction in which the first lower transparent conductive layer 61, the first lower reflective conductive layer 63, the first upper reflective conductive layer 64, and the first upper transparent conductive layer 65 are layered (the thickness direction of the first electrode 51). The first reflective conductive layer 62 is constituted by the first lower reflective conductive layer 63 and the first upper reflective conductive layer 64 throughout the entire inner side of an opening 68 of the edge cover 52.

The first lower transparent conductive layer 61, the first upper reflective conductive layer 64, and the first upper transparent conductive layer 65 are formed using wet etching by the same patterning step. The first lower reflective conductive layer 63 is formed using wet etching in a patterning step different from those for the first lower transparent conductive layer 61, the first upper reflective conductive layer 64, the first upper transparent conductive layer 65, and the like. It is preferable that the thickness t11 of the first lower transparent conductive layer 61 and the thickness t15 of the first upper transparent conductive layer 65 be equal to each other from the perspective of stabilizing the shape controllability of the first electrode 51 by wet etching.

First Electrode of Second Organic EL Element

As illustrated in FIG. 7 and FIG. 8, the first electrode 51 of the second organic EL element 60B includes a second lower transparent conductive layer 71, a second reflective conductive layer 72, and a second upper transparent conductive layer 75 which are provided in order on the flattening film 29.

The second lower transparent conductive layer 71 is a layer for suppressing corrosion of the second reflective conductive layer 72 and improving the adhesion of the first electrode 51 to the flattening film 29. The second lower transparent conductive layer 71 has light transmittance and allows light to be transmitted therethrough. The second lower transparent conductive layer 71 is formed of the same material as that of and in the same layer as the first lower transparent conductive layer 61, for example, at least one transparent conductive oxide selected from among indium tin oxide (ITO) and indium zinc oxide (IZO). A thickness t21 of the second lower transparent conductive layer 71 is, for example, approximately 10 nm to 20 nm.

The second reflective conductive layer 72 is provided on the second lower transparent conductive layer 71. The second reflective conductive layer 72 has light reflectivity to reflect light. The second reflective conductive layer 72 is formed of the same material as that of and in the same layer as the first upper reflective conductive layer 64, for example, at least one metal material selected from among silver (Ag), a silver alloy, aluminum (Al), and an aluminum alloy. The second reflective conductive layer 72 is thinner than the first reflective conductive layer 62 (t22<t12). Thus, the first electrode 51 of the second organic EL element 60B is thinner than the first electrode 51 of the first organic EL element 60A (t2<t1). A thickness t22 of the second reflective conductive layer 72 is, for example, approximately 10 nm to 50 nm. The second reflective conductive layer 72 transmits a portion of light incident from the front face side of the display region D (conceptually indicated by a dashed arrow in FIG. 7) and reflects a portion of the light.

The second upper transparent conductive layer 75 is provided on the second reflective conductive layer 72. The second upper transparent conductive layer 75 is a layer for suppressing corrosion of the second reflective conductive layer 72. The second upper transparent conductive layer 75 has light transmittance to transmit light. The second upper transparent conductive layer 75 is formed of the same material as that of and in the same layer as the first upper transparent conductive layer 65, for example, at least one transparent conductive oxide selected from among indium tin oxide (ITO) and indium zinc oxide (IZO). A thickness t25 of the second upper transparent conductive layer 75 is, for example, approximately 10 nm to 20 nm.

The second lower transparent conductive layer 71, the second reflective conductive layer 72, and the second upper transparent conductive layer 75 have the same shape and an equal area in a plan view. The peripheral end surfaces of the second lower transparent conductive layer 71, the second reflective conductive layer 72, and the second upper transparent conductive layer 75 are aligned in a direction in which the second lower transparent conductive layer 71, the second reflective conductive layer 72, and the second upper transparent conductive layer 75 are layered (the thickness direction of the first electrode 51). The second reflective conductive layer 72 is provided being thinner than the first reflective conductive layer 62 throughout the entire inner side of the opening 68 of the edge cover 52.

The second lower transparent conductive layer 71, the second reflective conductive layer 72, and the second upper transparent conductive layer 75 are formed using wet etching by the same patterning step as for the first lower transparent conductive layer 61, the first upper reflective conductive layer 64, and the first upper transparent conductive layer 65. It is preferable that the thickness t21 of the second lower transparent conductive layer 71 and the thickness t25 of the second upper transparent conductive layer 75 be equal to each other from the perspective of stabilizing the shape controllability of the first electrode 51 by wet etching.

Edge Cover

The edge cover 52 is common to the first display region D1 and the second display region D2. As illustrated in FIG. 4, the edge cover 52 partitions the first electrodes 51 of the adjacent subpixels Sp. The edge cover 52 is formed in a lattice pattern as a whole, and covers a peripheral edge portion of each of the first electrodes 51. Examples of the material of the edge cover 52 include an organic material such as a polyimide resin, an acrylic resin, a polysiloxane resin, and a novolak resin. A part of the surface of the edge cover 52 protrudes upward to form a photo spacer 69.

Some TFTs 30 among the first TFT 30a, the second TFT 30b, the third TFT 30c, the fourth TFT 30d, the fifth TFT 30e, the sixth TFT 30f, and the seventh TFT 30g, for example, the plurality of TFTs 30 including the sixth TFT 30f, are positioned at locations overlapping the edge cover 52 in a plan view. The opening 68 that exposes the first electrode 51 is formed for each organic EL element 60 in the edge cover 52. The organic EL element 60 has a structure in which the first electrode 51 and the second electrode 54 face each other through the organic EL layer 53 in a region corresponding to the opening 68 of the edge cover 52, and emits light in the region.

A region corresponding to the opening 68 of the edge cover 52 in the subpixel Sp constitutes the light-emitting region E in which the organic EL element 60 emits light. As illustrated in FIG. 9, the opening 68 that exposes the first electrode 51 of the first organic EL element 60A in the edge cover 52 and the opening 68 that exposes the first electrode 51 of the second organic EL element 60B have the same shape and an equal area in a plan view. That is, the light-emitting region E in each subpixel Sp in the first display region D1 and the light-emitting region E in each subpixel Sp in the second display region D2 have the same shape and an equal area.

Second Wall Layer

The second wall layer is layered on each of the two first wall layers. In other words, each of the second wall layers is formed in a rectangular frame shape extending along the entire periphery of the flattening film 29. These two second wall layers have geometrically similar shapes and are spaced apart from each other in the width direction of the frame region F. Each of the second wall layers is formed by the same material as that of and in the same layer as the edge cover 52.

Organic EL Layer

The organic EL layer 53 has the same configuration in the first display region D1 and in the second display region D2. The organic EL layer 53 is an example of a light-emitting function layer. As illustrated in FIG. 7 and FIG. 8, the organic EL layer 53 is provided on the first electrode 51 on the inner side of each of the openings 68 of the edge cover 52. As illustrated in FIG. 9, the organic EL layer 53 of the first organic EL element 60A and the organic EL layer 53 of the second organic EL element 60B have the same shape and an equal area in a plan view.

As illustrated in FIG. 10, the organic EL layer 53 includes a hole injection layer 53*a*, a hole transport layer 53*b*, a light-emitting layer 53*c*, an electron transport layer 53*d*, and an electron injection layer 53*e* which are provided in order on the first electrode 51. Some layers of the hole injection layer 53*a*, the hole transport layer 53*b*, the electron transport layer 53*d*, and the electron injection layer 53*e* may be provided in common for the plurality of subpixels Sp as a continuous layer.

The hole injection layer 53*a* is also referred to as an anode buffer layer. The hole injection layer 53*a* reduces an energy level difference between the first electrode 51 and the organic EL layer 53 to improve the efficiency of hole injection into the organic EL layer 53 from the first electrode 51. Examples of the material of the hole injection layer 53*a* include a triazole derivative, an oxadiazole derivative, an imidazole derivative, a polyarylalkane derivative, a pyrazoline derivative, a phenylenediamine derivative, an oxazole derivative, a styrylanthracene derivative, a fluorenone derivative, a hydrazone derivative, a stilbene derivative, and the like.

The hole transport layer 53*b* has a function of efficiently moving holes to the light-emitting layer 53*c*. Examples of the material of the hole transport layer 53*b* include a porphyrin derivative, an aromatic tertiary amine compound, a styrylamine derivative, polyvinylcarbazole, poly-p-phenylenevinylene, polysilane, a triazole derivative, an oxadiazole derivative, an imidazole derivative, a polyarylalkane derivative, a pyrazoline derivative, a pyrazolone derivative, a phenylenediamine derivative, an arylamine derivative, an amine-substituted chalcone derivative, an oxazole derivative, a styrylanthracene derivative, a fluorenone derivative, a hydrazone derivative, a stilbene derivative, hydrogenated amorphous silicon, hydrogenated amorphous silicon carbide, zinc sulfide, zinc selenide, and the like.

When a voltage is applied by the first electrode 51 and the second electrode 54, the light-emitting layer 53*c* recombines positive holes injected from the first electrode 51 with electrons injected from the second electrode 54 and emits light. The light-emitting layer 53*c* is formed of a different material depending on the luminescent color (red, green, or blue) of the organic EL element 60 in each individual subpixel Sp, for example.

Examples of the material of the light-emitting layer 53*c* include a metal oxinoid compound (8-hydroxyquinoline metal complexes), a naphthalene derivative, an anthracene derivative, a diphenylethylene derivative, a vinyl acetone derivative, a triphenylamine derivative, a butadiene derivative, a coumarin derivative, a benzoxazole derivative, an oxadiazole derivative, an oxazole derivative, a benzimidazole derivative, a thiadiazole derivative, a benzothiazole derivative, a styryl derivative, a styrylamine derivative, a bisstyrylbenzene derivative, a trisstyrylbenzene derivative, a perylene derivative, a perinone derivative, an aminopyrene derivative, a pyridine derivative, a rhodamine derivative, an aquidine derivative, phenoxazone, a quinacridone derivative, rubrene, poly-p-phenylenevinylene, polysilane, and the like.

The electron transport layer 53*d* efficiently moves electrons to the light-emitting layer 53*c*. Examples of the material of the electron transport layer 53*d* include an oxadiazole derivative, a triazole derivative, a benzoquinone derivative, a naphthoquinone derivative, an anthraquinone derivative, a tetracyanoanthraquinodimethane derivative, a diphenoquinone derivative, a fluorenone derivative, a silole derivative, a metal oxinoid compound, and the like.

Note that the electron injection layer 53*e* is also referred to as a cathode buffer layer. The electron injection layer 53*e* reduces an energy level difference between the second electrode 54 and the organic EL layer 53 to improve the efficiency of electron injection into the organic EL layer 53 from the second electrode 54. Examples of the material of the electron injection layer 53*e* include inorganic alkaline compounds such as lithium fluoride (LiF), magnesium fluoride (MgF2), calcium fluoride (CaF2), strontium fluoride (SrF2), and barium fluoride (BaF2), aluminum oxide (Al2O3), strontium oxide (SrO), and the like.

Second Electrode

The second electrode 54 has the same configuration in the first display region D1 and in the second display region D2. The second electrode 54 is provided in common for the plurality of subpixels Sp. The second electrode 54 covers the organic EL layer 53 and the edge cover 52, and overlaps the first electrode 51 with the organic EL layer 53 interposed therebetween. The second electrode 54 functions as a cathode electrode that injects electrons into the organic EL layer 53. The second electrode 54 has light transmittance to transmit light.

Examples of the material of the second electrode 54 include silver (Ag), aluminum (Al), vanadium (V), calcium (Ca), titanium (Ti), yttrium (Y), sodium (Na), manganese (Mn), indium (In), magnesium (Mg), lithium (Li), ytterbium (Yb), and lithium fluoride (LiF).

The second electrode 54 may be formed of an alloy such as magnesium (Mg)-copper (Cu), magnesium (Mg)-silver (Ag), sodium (Na)-potassium (K), astatine (At)-astatine oxide (AtO2), lithium (Li)-aluminum (Al), lithium (Li)-calcium (Ca)-aluminum (Al), lithium fluoride (LiF)-calcium (Ca)-aluminum (Al) and the like, for example.

The second electrode 54 may be formed of a conductive oxide, such as tin oxide (SnO), zinc oxide (ZnO), indium tin oxide (ITO), and indium zinc oxide (IZO), for example. The second electrode 54 is preferably formed of a material having a low work function to improve the efficiency of electron injection into the organic EL layer 53. The second electrode 54 may be formed by layering a plurality of layers formed of any of the materials described above.

Sealing Film

As illustrated in FIG. 4, the sealing film 80 is provided so as to cover the plurality of organic EL elements 60. The sealing film 80 protects the organic EL layer 53 of each of the organic EL elements 60 from moisture, oxygen, or the like. The sealing film 80 includes a first inorganic sealing layer 81 provided so as to cover the second electrode 54, an organic sealing layer 82 provided on the first inorganic sealing layer 81, and a second inorganic sealing layer 83 provided on the organic sealing layer 82.

The first inorganic sealing layer 81 and the second inorganic sealing layer 83 are formed of, for example, an inorganic insulating film such as a silicon oxide film, a silicon nitride film, and a silicon oxynitride film. The organic sealing layer 82 is formed of an organic material such as an acrylic resin, an epoxy resin, a silicone resin, a polyurea resin, a parylene resin, a polyimide resin, and a polyamide resin, for example. The sealing film 80 is covered by a surface protection film (not illustrated) bonded to the front face side of the organic EL display device 1.

Operation of Organic EL Display Device

In the organic EL display device 1 having the configuration described above, first, in each of the subpixels Sp, the organic EL element 60 is brought into a non-light emission state when the corresponding emission control wiring line 24*el* is selected to be brought into the inactive state. Then, when the gate wiring line 24*gl* that is to be scanned immediately before the gate wiring line 24*gl* corresponding to the organic EL element 60 in the non-light emission state is selected, the gate signal is input to the first TFT 30*a* via that gate wiring line 24*gl*, the first TFT 30*a* and the fourth TFT 30*d* are brought into an on state, and the voltage of the initialization power source wiring line 26*il* is applied to the capacitor 32. As a result, the charge of the capacitor 32 is discharged, and the voltage applied to the gate electrode 24*ge* of the fourth TFT 30*d* is initialized.

Subsequently, when the gate wiring line 240. corresponding to the organic EL element 60 in the non-light emission state is selected to be brought into the active state, the second TFT 30*b* and the third TFT 30*c* are brought into the on state, and a predetermined voltage corresponding to the source signal transmitted via the source wiring line 28*sl* is written to the capacitor 32 via the fourth TFT 30*d* in the diode-connected state. Further, the seventh TFT 30*g* is brought into the on state, the voltage of the initialization power source wiring line 26*il* is applied to the first electrode 51 of the organic EL element 60, and the charge accumulated in the first electrode 51 is reset.

Thereafter, when the emission control wiring line 24*el* corresponding to the organic EL element 60 in the non-light emission state is unselected to be brought into the active state, the fifth TFT 30*e* and the sixth TFT 30*f* are brought into the on state, and a drive current corresponding to the voltage applied to the gate electrode 24*ge* of the fourth TFT 30*d* is supplied from the high-level power source wiring line Pl to the organic EL element 60. In this way, each of the organic EL elements 60 emits light at a luminance corresponding to the drive current. As a result, an image is displayed in the display region D of the organic EL display device 1.

Method of Manufacturing Organic EL Display Device

Figure 11:
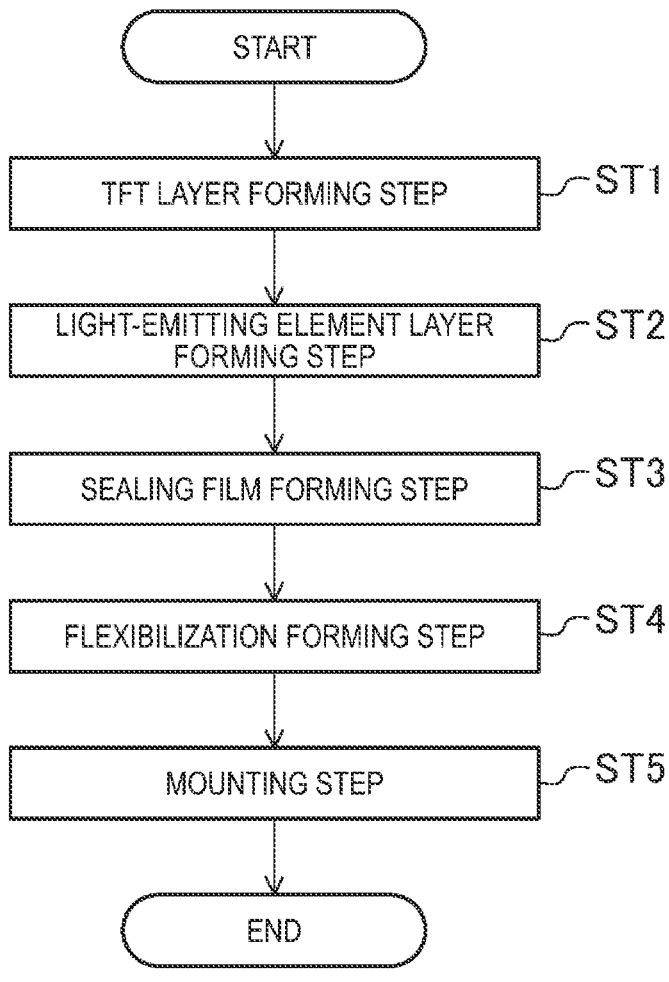
FIG. 11 is a flowchart schematically illustrating a method of manufacturing the organic EL display device according to the first embodiment.
Figure 12:
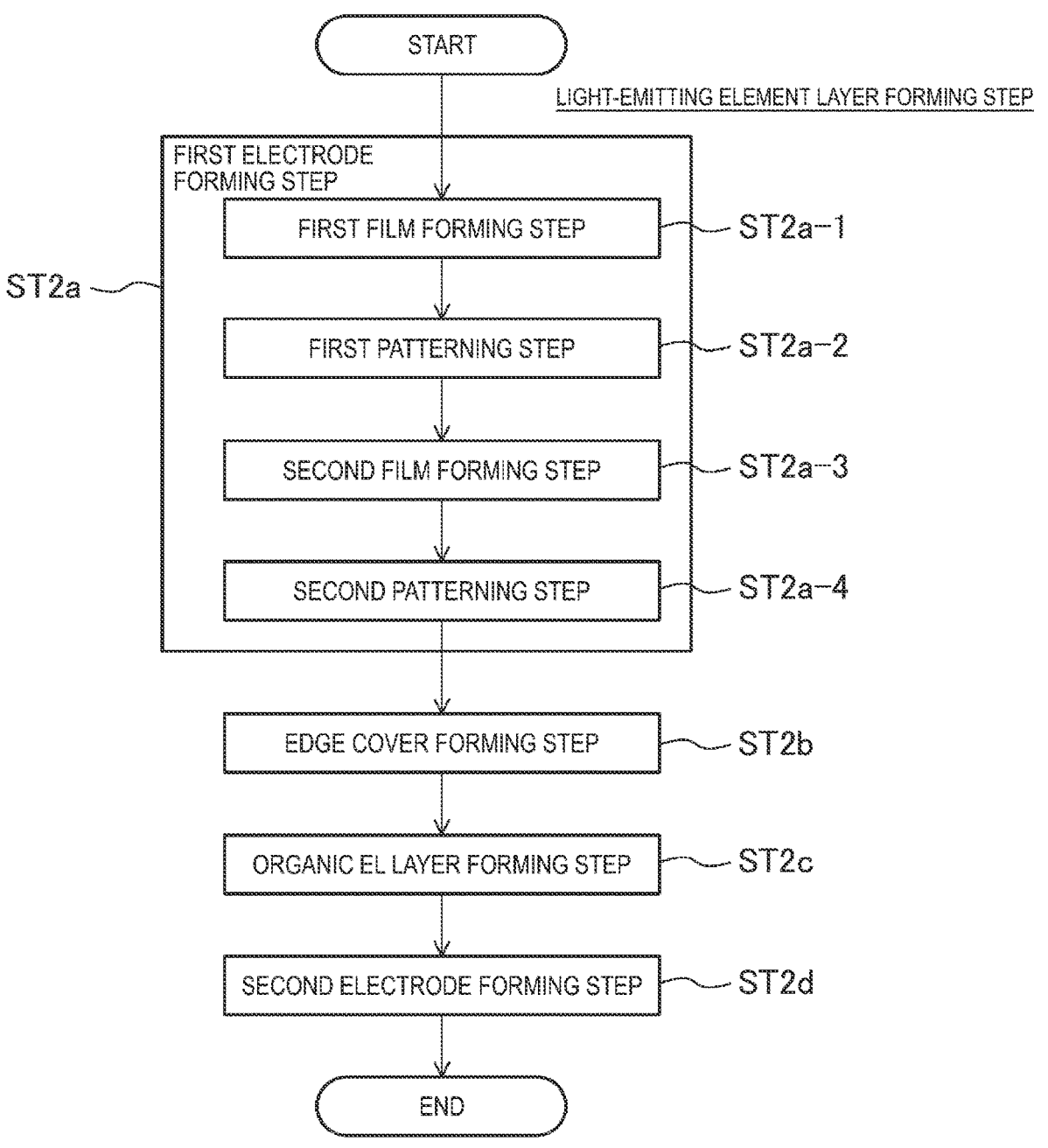
FIG. 12 is a flowchart schematically illustrating a light-emitting element layer forming step in the method of manufacturing the organic EL display device according to the first embodiment.

A method of manufacturing the organic EL display device 1 according to the first embodiment will be described below. FIG. 11 is a flowchart schematically illustrating a method of manufacturing the organic EL display device 1. FIG. 12 is a flowchart schematically illustrating a light-emitting element layer forming step ST2.

As illustrated in FIG. 11, a method of manufacturing the organic EL display device 1 includes a TFT layer forming step ST1, a light-emitting element layer forming step ST2, a sealing film forming step ST3, a flexibilization step ST4, and a mounting step ST5.

TFT Layer Forming Step

In the TFT layer forming step ST1, first, a resin substrate layer 10 is formed on a glass substrate 100 by applying a resin material, or the like. Thereafter, the base coat film 21, the semiconductor layer 22, the gate insulating film 23, the first conductive layer 24 (the gate wiring lines 24*gl*, the gate electrodes 24*ge*, the emission control wiring lines 24*el*, the first capacitance electrodes 24*ce*, and the first lead-out wiring lines), the first interlayer insulating film 25, the second conductive layer 26 (the initialization power source wiring lines 26*il*, the first power source wiring lines 26*pl*, and the second capacitance electrodes 26*ce*), the second interlayer insulating film 27, the third conductive layer 28 (the source wiring lines 28*sl*, the source electrodes 28*se*, the drain electrodes 28*de*, the second power source wiring lines 28*pl*, the second lead-out wiring lines, the first frame wiring lines La, and the second frame wiring lines Lb), and the flattening film 29 are formed in order on the substrate formed by the resin substrate layer 10 using a known film formation technique such as a plasma Chemical Vapor Deposition (CVD) method and a sputtering method, or a patterning technique such as photolithography.

In this manner, in the TFT layer forming step ST1, the TFT layer 20 including the plurality of TFTs 30 is formed on the resin substrate layer 10.

Light-Emitting Element Layer Forming Step

The light-emitting element layer forming step ST2 is performed after the TFT layer forming step ST1. As illustrated in FIG. 12, the light-emitting element layer forming step ST2 includes a first electrode forming step ST2*a*, an edge cover forming step ST2*b*, an organic EL layer forming step ST2*c*, and a second electrode forming step ST2*d*.

First Electrode Forming Step

In the first electrode forming step ST2*a*, the first electrode 51 is formed for each organic EL element 60. The first electrode forming step ST2*a* includes a first film forming step ST2*a*-1, a first patterning step ST2*a*-2, a second film forming step ST2*a*-3, and a second patterning step ST2*a*-4.

First Film Forming step

Figure 13:
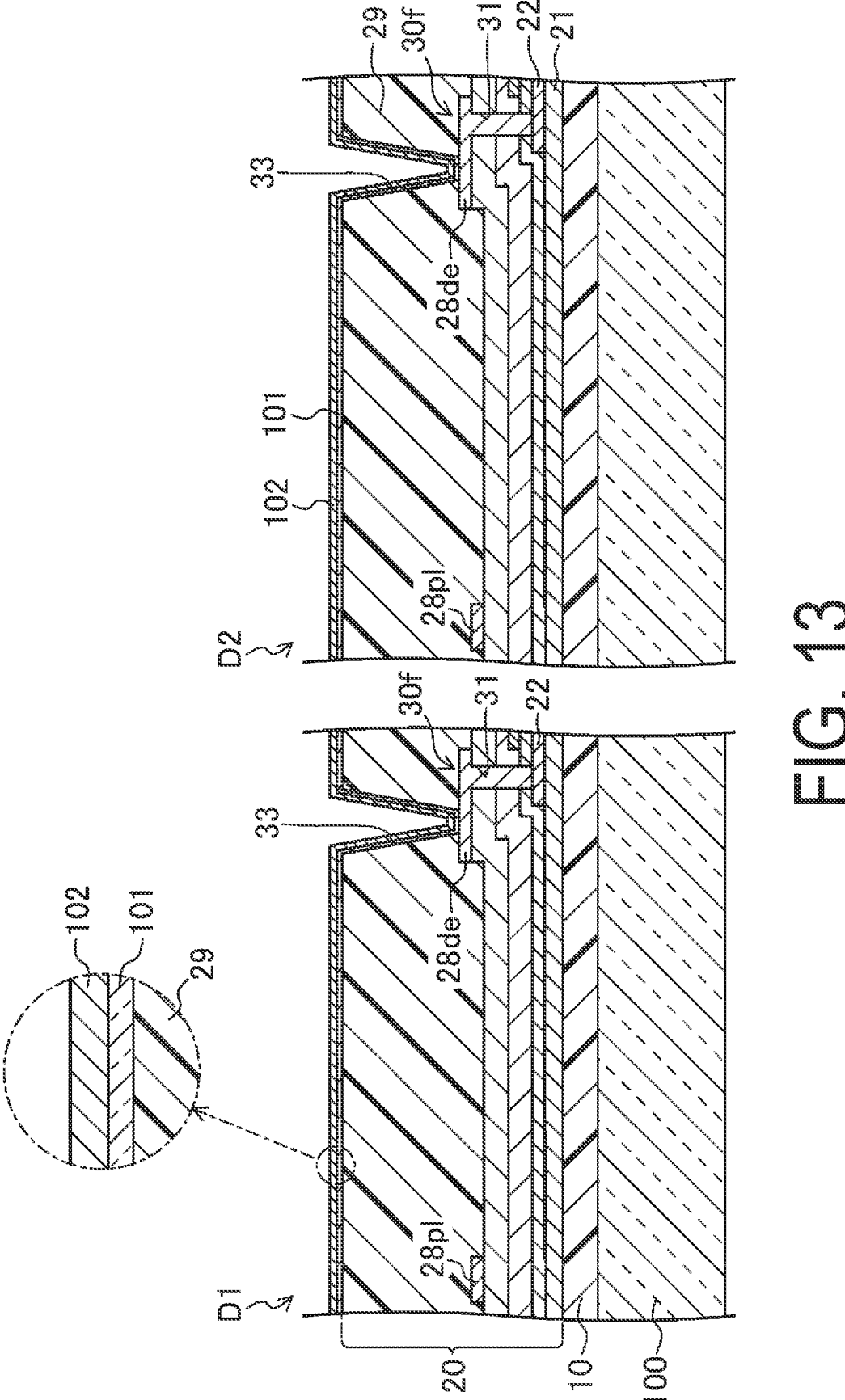
FIG. 13 is a cross-sectional view illustrating main portions of a substrate on which film formation has been performed in a first film forming step in the method of manufacturing the organic EL display device according to the first embodiment.

FIG. 13 is a cross-sectional view illustrating main portions of a substrate on which film formation has been performed in the first film forming step ST2*a*-1 in the method of manufacturing the organic EL display device 1 according to the first embodiment.

As illustrated in FIG. 13, in the first film forming step ST2*a*-1, the first transparent conductive film 101 and the first reflective conductive film 102 are formed in order on the substrate on which the TFT layer 20 has been formed, for example, by a sputtering method so that each of the films is formed as a single layer or a plurality of layers of each of the films are layered. The thickness of the first transparent conductive film 101 that is formed here is set to, for example, approximately 10 nm to 20 nm. The thickness of the first reflective conductive film 102 is set to, for example, approximately 70 nm to 90 nm.

First Patterning Step

Figure 14:
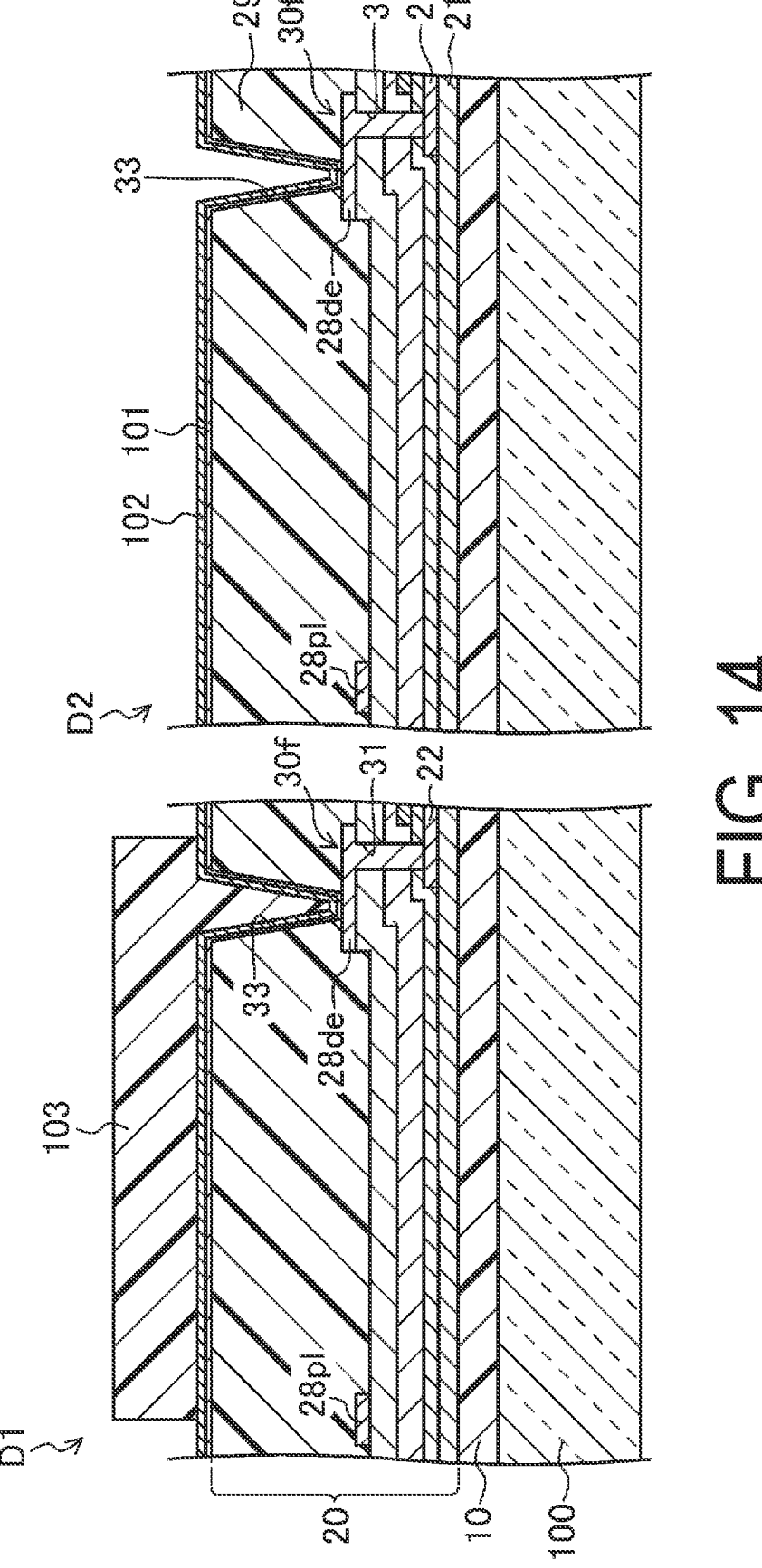
FIG. 14 is a cross-sectional view illustrating main portions of the substrate on which a resist layer has been formed in a first patterning step in the method of manufacturing the organic EL display device according to the first embodiment.
Figure 15:
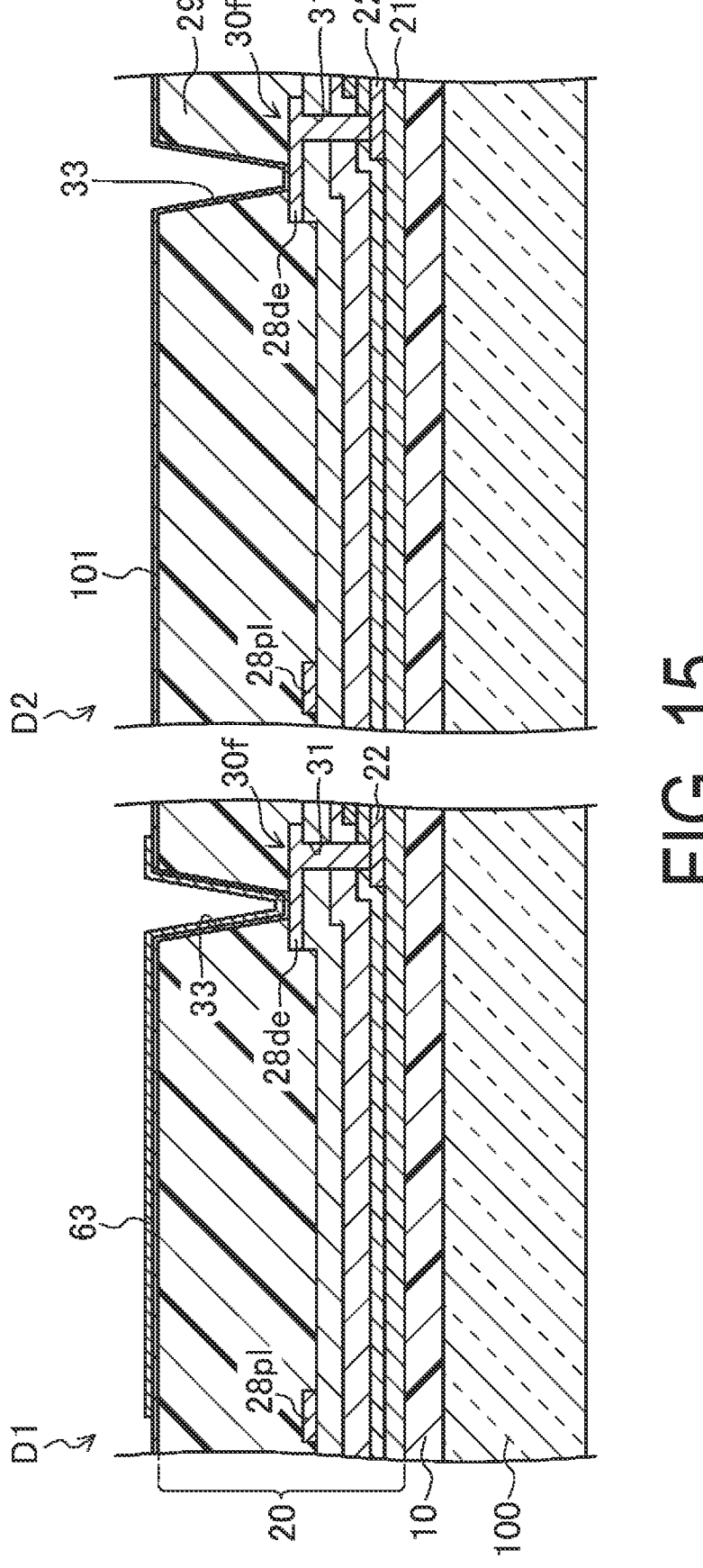
FIG. 15 is a cross-sectional view illustrating main portions of the substrate on which patterning has been performed in the first patterning step in the method of manufacturing the organic EL display device according to the first embodiment.

FIG. 14 is a cross-sectional view illustrating main portions of the substrate on which a resist layer 103 has been formed in the first patterning step ST2*a*-2 in the method of manufacturing the organic EL display device 1 according to the first embodiment. FIG. 15 is a cross-sectional view illustrating main portions of the substrate on which patterning has been performed in the first patterning step ST2*a*-2 in the method of manufacturing the organic EL display device 1 according to the first embodiment.

The first patterning step ST2a-2 is performed after the first film forming step ST2a-1. In the first patterning step ST2a-2, the first reflective conductive film 102 is patterned by photolithography to form a plurality of first lower reflective conductive layers 63 from the first reflective conductive film 102 in a predetermined pattern in the first display region D1 of the display region D.

First, a photosensitive resin material is applied to the substrate on which the first transparent conductive film 101 and the first reflective conductive film 102 have been formed, for example, by a known coating method such as a spin coating method. Subsequently, the coating film of the photosensitive resin material is pre-baked, exposed, developed, and post-baked to pattern the coating film, thereby forming the island-shaped resist layer 103 in each region for forming the first electrode 51 in the first display region D1 as illustrated in FIG. 14.

Next, the first reflective conductive film 102 is subjected to wet etching by being exposed to an etching solution using the resist layer 103 as a mask. As the etching solution in this case, a type of etching solution having a relatively high selection ratio of the material of the first reflective conductive film 102 with respect to the material of the first transparent conductive film 101 is used. The first reflective conductive film 102 is patterned by being selectively corroded and dissolved by wet etching using such an etching solution. Subsequently, the resist layer 103 is removed by ashing. Thus, as illustrated in FIG. 15, the first lower reflective conductive layers 63 are formed from the first reflective conductive film 102 in the first display region D1.

Second Film Forming Step

Figure 16:
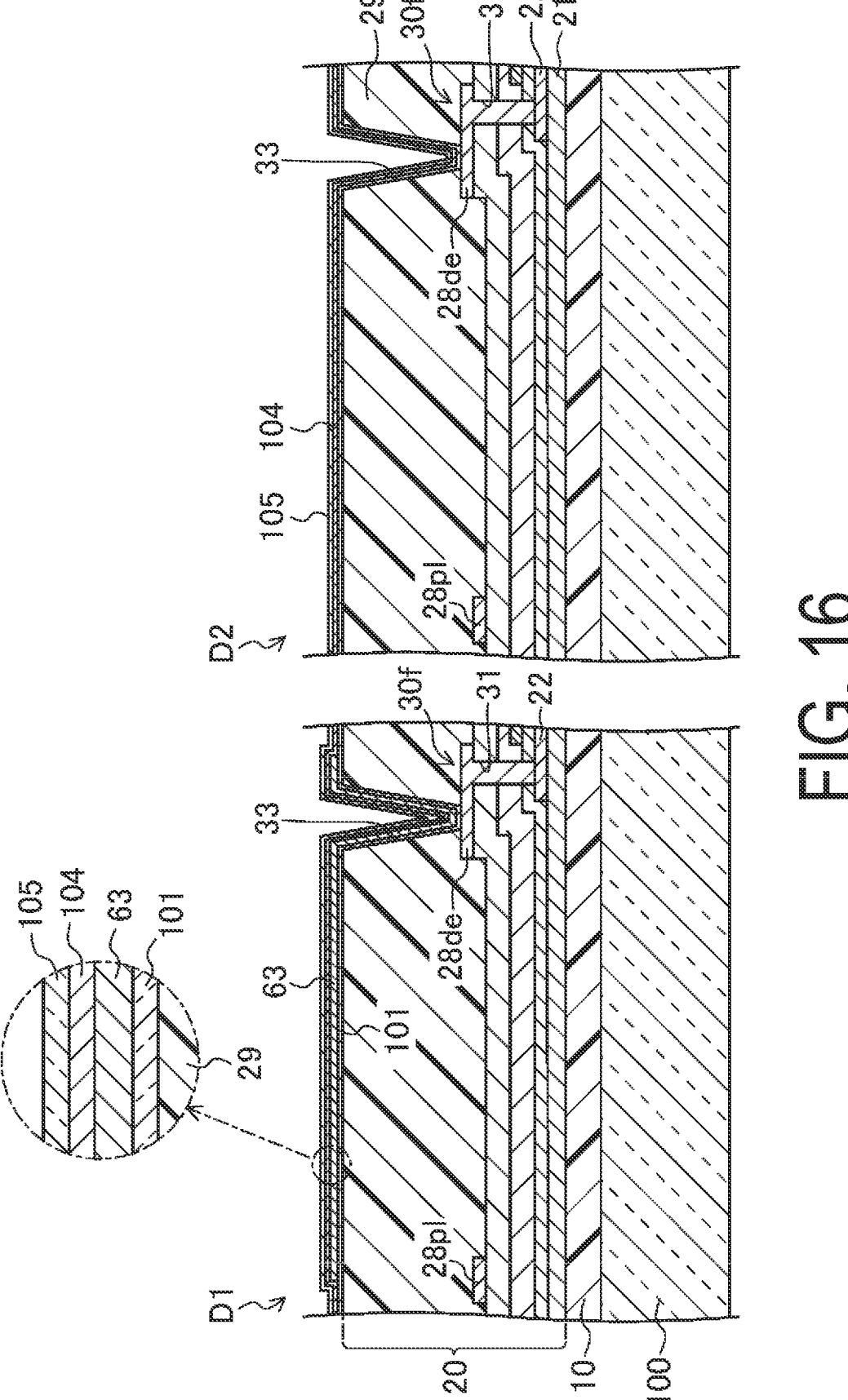
FIG. 16 is a cross-sectional view illustrating main portions of the substrate on which film formation has been performed in a second film forming step in the method of manufacturing the organic EL display device according to the first embodiment.

FIG. 16 is a cross-sectional view illustrating main portions of the substrate on which film formation has been performed in the second film forming step ST2a-3 in the method of manufacturing the organic EL display device 1 according to the first embodiment.

The second film forming step ST2a-3 is performed after the first patterning step ST2a-2. In the second film forming step ST2a-3, the second reflective conductive film 104 and the second transparent conductive film 105 are formed in order on the substrate on which the first lower reflective conductive layer 63 has been formed, for example, by a sputtering method so that each of the films is formed as a single layer or a plurality of layers of each of the films are layered. The thickness of the second reflective conductive film 104 that is formed here is set to, for example, approximately 10 nm to 50 nm. The thickness of the second transparent conductive film 105 is equal to the thickness of the first transparent conductive film 101 (for example, approximately 10 nm to 20 nm).

Second Patterning Step

Figure 17:
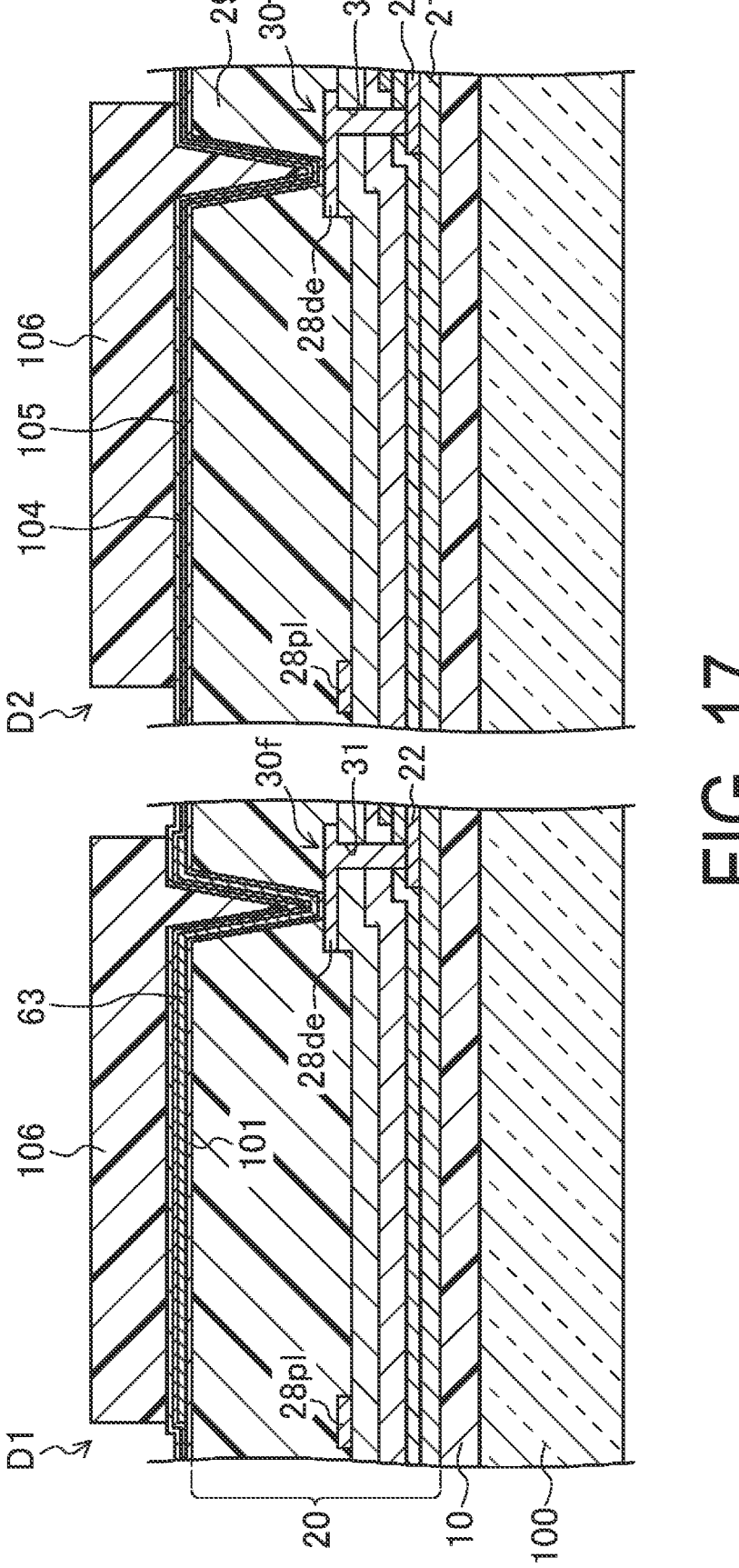
FIG. 17 is a cross-sectional view illustrating main portions of the substrate on which a resist layer has been formed

FIG. 17 is a cross-sectional view illustrating main portions of the substrate on which a resist layer 106 has been formed in the second patterning step ST2a-4 in the method of manufacturing the organic EL display device 1 according to the first embodiment, FIG. 18 is a cross-sectional view illustrating main portions of the substrate on which patterning has been performed in the second patterning step ST2a-4 in the method of manufacturing the organic EL display device 1 according to the first embodiment.

The second patterning step ST2a-4 is performed after the second film forming step ST2a-3. In the second patterning step ST2a-4, the first transparent conductive film 101, the second reflective conductive film 104, and the second transparent conductive film 105 are patterned by photolithography to form a plurality of first electrodes 51 in a predetermined pattern in each of the first display region D1 and the second display region D2.

First, a photosensitive resin material is applied to the substrate on which the second reflective conductive film 104 and the second transparent conductive film 105 have been formed, for example, by a known coating method such as a spin coating method. Subsequently, the coating film of the photosensitive resin material is pre-baked, exposed, developed, and post-baked to pattern the coating film, thereby forming the island-shaped resist layer 106 in each region for forming the first electrodes 51 in the first display region D1 and the second display region D2 as illustrated in FIG. 17.

Next, the first transparent conductive film 101, the second reflective conductive film 104, and the second transparent conductive film 105 are subjected to wet etching by being exposed to an etching solution using the resist layer 106 as a mask. As the etching solution in this case, a type of etching solution having a relatively low selection ratio between the materials of the first transparent conductive film 101 and the second transparent conductive film 105 and the material of the second reflective conductive film 104 is used. The first transparent conductive film 101, the second reflective conductive film 104, and the second transparent conductive film 105 are patterned by being collectively corroded and dissolved by wet etching using such an etching solution. Subsequently, the resist layer 106 is removed by ashing.

By patterning the first transparent conductive film 101, the second reflective conductive film 104, and the second transparent conductive film 105, the first lower transparent conductive layer 61, the first upper reflective conductive layer 64, and the first upper transparent conductive layer 65 are formed from the first transparent conductive film 101, the second reflective conductive film 104, and the second transparent conductive film 105, respectively, so as to overlap the first lower reflective conductive layer 63 in the first display region D1 as illustrated in FIG. 18. In addition, along with the formation of the first lower transparent conductive layer 61 and the like, the second lower transparent conductive layer 71, the second reflective conductive layer 72, and the second upper transparent conductive layer 75 are formed from the first transparent conductive film 101, the second reflective conductive film 104, and the second transparent conductive film 105, respectively, so as to overlap each other in the second display region D2.

At this time, in a case where the thickness of the first transparent conductive film 101 and the thickness of the second transparent conductive film 105 are different, a difference is generated between an etching rate of the first transparent conductive film 101 and an etching rate of the second transparent conductive film 105, and thus the amount of inward shift of the outer peripheral portions of the first lower transparent conductive layer 61 and the second lower transparent conductive layer 71 and the amount of inward shift of the outer peripheral portions of the first upper transparent conductive layer 65 and the second upper transparent conductive layer 75 are different. As a result, there is a concern that the shapes of the first lower transparent conductive layer 61 and the first upper transparent conductive layer 65, and the shapes of the second lower transparent conductive layer 71 and the second upper transparent conductive layer 75 do not match. On the other hand, in the present embodiment, the thickness of the first transparent conductive film 101 and the thickness of the second transparent conductive film 105 are equal, and thus the etching rate of the first transparent conductive film 101 and the etching rate of the second transparent conductive film 105 are equal to each other. For this reason, it is easy to make the shapes of the first lower transparent conductive layer 61 and the first upper transparent conductive layer 65 and the shapes of the second lower transparent conductive layer 71 and the second upper transparent conductive layer 75 match each other.

In this manner, a plurality of first electrodes 51 in each of which the first lower transparent conductive layer 61, the first lower reflective conductive layer 63, the first upper reflective conductive layer 64, and the first upper transparent conductive layer 65 are layered are formed in the first display region D1. In addition, a plurality of first electrodes 51 in each of which the second lower transparent conductive layer 71, the second reflective conductive layer 72, and the second upper transparent conductive layer 75 are layered are formed in the second display region D2.

Edge Cover Forming Step

The edge cover forming step ST2b is performed after the first electrode forming step ST2a. In the edge cover forming step ST2b, a photosensitive resin material is applied to the substrate on which the first electrode 51 has been formed, for example, by a known coating method such as a spin coating method. Subsequently, the coating film of the photosensitive resin material is pre-baked, exposed, developed, and post-baked to pattern the coating film, thereby forming the edge cover 52 and the second wall layer.

Organic El Layer Forming Step

The organic EL layer forming step ST2c is performed after the edge cover forming step ST2b. In the organic EL layer forming step ST2c, the hole injection layer 53a, the hole transport layer 53b, the light-emitting, layer 53c, the electron transport layer 53d, and the electron injection layer 53e are formed in order on the substrate on which the edge cover 52 has been formed, for example, by a vacuum deposition method using a film forming mask called a fine metal mask (FMM) capable of performing patterning in units of subpixels, thereby forming the organic EL layer 53 on an individual first electrode 51. Note that some of the hole injection layer 53a, the hole transport layer 53b, the electron transport layer 53d, and the electron injection layer 53e may be formed using a film forming mask called a common metal mask (CMM) capable of performing patterning in units of display panels or an open mask.

Second Electrode Forming Step

The second electrode forming step ST2d is performed after the organic EL layer forming step ST2c. In the second electrode forming step ST2d, the second electrode 54 is formed by forming a metal film as a single layer or layering a plurality of metal films on the substrate on which the organic EL layer 53 has been performed, for example, by a vacuum deposition method using a CMM (open mask) as a film forming mask.

In this manner, in the light-emitting element layer forming step ST2, the light-emitting element layer 50 including the plurality of organic EL elements 60 is formed on the TFT layer 20.

Sealing Film Forming Step

The sealing film forming step ST3 is performed after the light-emitting element layer forming step ST2. In the sealing film forming step ST3, first, the first inorganic sealing layer 81 is formed by forming an inorganic insulating film as a single layer or layering a plurality of inorganic insulating films on the substrate on which the light-emitting element layer 50 has been formed, for example, by a plasma CVD method using a CMM (open mask) as a film forming mask.

Subsequently, an organic material is applied to the substrate on which the first inorganic sealing layer 81 has been formed, for example, by an ink-jet method, thereby forming the organic sealing layer 82.

Next, the second inorganic sealing layer 83 is formed by forming an inorganic insulating film as a single layer or layering a plurality of inorganic insulating films on the substrate on which the organic sealing layer 82 has been formed, for example, by a plasma CVD method using a CMM (open mask) as a film forming mask.

in this manner, in the sealing film forming step ST3, the sealing film 80 in which the first inorganic sealing layer 81, the organic sealing layer 82, and the second inorganic sealing layer 83 are layered is formed.

Flexibilization Step

The flexibilization step ST4 is performed after the sealing film forming step ST3. In the flexibilization step ST4, the glass substrate 100 is peeled off from the lower surface of the resin substrate layer 10 by irradiating the lower surface of the resin substrate layer 10 with laser light from the glass substrate 100 side. Then, a rear surface protection film 11 is bonded to the lower surface of the resin substrate layer 10 from which the glass substrate 100 has been peeled off. Further, a surface protection film is bonded to the front surface of the substrate on which the sealing film 80 has been formed.

Mounting Step

The mounting step ST5 is performed after the flexibilization step ST4. In the mounting step ST5, the wiring line substrate Cb is connected to the terminal portion T of the substrate from which the glass substrate 100 has been peeled off by using a conductive material such as an anisotropic conductive film (ACF) or an anisotropic conductive paste (ACP), and thus an external circuit such as a display control circuit is mounted together with the wiring line substrate Cb by allowing electrical conduction between the wiring line substrate Cb and the terminal portion T.

Thereafter, the organic EL display device 1 is accommodated in the housing together with the camera 3, and the camera 3 is installed at a position overlapping the second display region D2 in a plan view on the back face side of the organic EL display device 1.

The organic EL display device 1 according to the present embodiment can be manufactured as described above.

Characteristics and Effects of First Embodiment

A characteristic (1) of the organic EL display device 1 according to the first embodiment is that the first electrode 51 of the first organic EL element 60A includes the first lower transparent conductive layer 61, the first reflective conductive layer 62 provided on the first lower transparent conductive layer 61, and the first upper transparent conductive layer 65 provided on the first reflective conductive layer 62, the first electrode 51 of the second organic EL element 60B includes the second lower transparent conductive layer 71 formed of the same material as that of and in the same layer as the first lower transparent conductive layer 61, the second reflective conductive layer 72 formed of the same material as that of and in the same layer as the first reflective conductive layer 62 (strictly, the first upper reflective conductive layer 64) on the second lower transparent conductive layer 71, and the second upper transparent conductive layer 75 formed of the same material as that of and in the same layer as the first upper transparent conductive layer 65 on the second reflective conductive layer 72, and the second reflective conductive layer 72 is thinner than the first reflective conductive layer 62 on the inner side of the opening 68 of the edge cover 52.

According to the characteristic (1) of the organic EL display device 1 according to the first embodiment, the second reflective conductive layer 72 is thinner than the first reflective conductive layer 62 on the inner side of the opening 68 of the edge cover 52, and thus the amount of light that passes through the first electrode 51 of the second organic EL element 60B on the inner side of the opening 68 of the edge cover 52 increases as compared to a case where the thickness t22 of the second reflective conductive layer 72 is the same as the thickness t12 of the first reflective conductive layer 62. Thereby, it is possible to increase the transmittance of light in the second display region D2 that transmits light used in the camera 3 in the display region D.

A characteristic (2) of the organic EL display device 1 according to the first embodiment is that the second reflective conductive layer 72 is provided being thinner than the first reflective conductive layer 62 throughout the entire inner side of the opening 68 of the edge cover 52.

According to the characteristic (2) of the organic EL display device 1 according to the first embodiment, the second reflective conductive layer 72 is thinner than the first reflective conductive layer 62 throughout the entire inner side of the opening 68 of the edge cover 52, and thus it is possible to suitably increase the amount of light that passes through the first electrode 51 on the inner side of the opening 68 of the edge cover 52.

A characteristic (3) of the organic EL display device 1 according to the first embodiment is that the first reflective conductive layer 62 is constituted by the first lower reflective conductive layer 63 and the first upper reflective conductive layer 64 provided on the first lower reflective conductive layer 63 throughout the entire inner side of the opening 68 of the edge cover 52, and the second reflective conductive layer 72 is formed of the same material as that of and in the same layer as the first upper reflective conductive layer 64.

According to the characteristics (3) of the organic EL display device 1 according to the first embodiment, the second reflective conductive layer 72 is formed of the same material as that of and in the same layer as the first upper reflective conductive layer 64 which is one of two conductive layers constituting the first reflective conductive layer 62, and thus the second reflective conductive layer 72 can be easily made thinner than the first reflective conductive layer 62 at the time of manufacturing the organic EL display device 1. Thereby, the second organic EL element 60B including the second reflective conductive layer 72 can be realized by a relatively simple manufacturing flow.

A characteristic (4) of the organic EL display device 1 according to the first embodiment is that each of the first reflective conductive layer 62 and the second reflective conductive layer 72 is formed of at least one metal material selected from among silver (Ag), a silver alloy, aluminum (Al), and an aluminum alloy.

According to the characteristics (4) of the organic EL display device 1 according to the first embodiment, each of the first reflective conductive layer 62 and the second reflective conductive layer 72 is formed of a metal material having a relatively high reflectance of visible light, which is advantageous to an increase in light extraction efficiency of the first organic EL element 60A and the second organic EL element 60B which are top-emission types.

A characteristic (5) of the organic EL display device 1 according to the first embodiment is that each of the first lower transparent conductive layer 61, the second lower transparent conductive layer 71, the first upper transparent conductive layer 65, and the second upper transparent conductive layer 75 is formed of at least one transparent conductive oxide selected from among indium tin oxide (ITO) and indium zinc oxide (IZO).

According to the characteristic (5) of the organic EL display device 1 according to the first embodiment, each of the first lower transparent conductive layer 61, the second. lower transparent conductive layer 71, the first upper transparent conductive layer 65, and the second upper transparent conductive layer 75 is formed of a transparent conductive oxide having a relatively high transmittance of visible light, and thus it is possible to suitably increase the amount of light that passes through the first electrode 51 of the second organic EL element 60B. This is advantageous to an increase in the transmittance of light in the second display region D2.

A characteristic (6) of the organic EL display device 1 according to the first embodiment is that the area of the first electrode 51 of the first organic EL element 60A and the area of the first electrode 51 of the second organic EL element 60B are equal to each other in a plan view.

A characteristic (7) of the organic EL display device 1 according to the first embodiment is that the area of the opening 68 that exposes the first electrode 51 of the first organic EL element 60A in the edge cover 52 and the area of the opening 68 that exposes the first electrode 51 of the second organic EL element 60B are equal to each other in a plan view.

A characteristic (8) of the organic EL display device 1 according to the first embodiment is that the area of the organic EL layer 53 of the first organic EL element 60A and the area of the organic EL layer 53 of the second organic EL element 60B are equal to each other in a plan view.

According to the characteristics (6) to (8) of the organic EL display device 1 according to the first embodiment, the area of the first electrode 51, the area of the opening 68 that exposes the first electrode 51 in the edge cover 52, and the area of the organic EL layer 53 are equal to each other in the first organic EL element 60A and the second organic EL element 60B, and thus it is possible to align the areas of the light-emitting regions E of the subpixels Sp in the first display region D1 and the second display region D2 and make the resolution of the screen uniform.

In addition, according to the characteristic (8) of the organic EL display device 1 according to the first embodiment, each organic EL layer 53 in the first display region D1 and each organic EL layer 53 in the second display region D2 of which the areas are equal in a plan view can be formed together without changing a film forming mask by a vapor deposition method. This contributes to efficiently and inexpensively manufacturing the organic EL display device 1.

Further, the film forming mask used in the vapor deposition method is generally relatively thin and used in a fixed state while being pulled with an appropriate tension. For this reason, when the film forming mask is used, distortion occurs in the shape of an opening through which a film-forming material of the mask passes. When the distortion of the shape of the opening varies, the position of the opening deviates. On the other hand, according to the characteristic (8) of the organic EL display device 1 according to the first embodiment, the shape and size of the opening of the film forming mask can be made uniform, and thus it is possible to suppress a variation in the distortion of the shape of the opening at the time of using the film forming mask and to reduce a positional deviation of the opening.

A characteristic of a method of manufacturing the organic EL display device 1 according to the first embodiment is that the first electrode forming step ST2a includes the first film forming step ST2a-1 of forming the first transparent conductive film 101 and the first reflective conductive film 102 in order on the substrate on which the TFT layer 20 has been formed, the first patterning step ST2a-2 of patterning the first reflective conductive film 102 to form the first lower reflective conductive layer 63 from the first reflective conductive film 102 in the first display region D1, the second film forming step ST2a-3 of forming the second reflective conductive film 104 and the second transparent conductive film 105 in order on the substrate on which the first lower reflective conductive layer 63 has been formed, and the second patterning step ST2a-4 of patterning the first transparent conductive film 101, the second reflective conductive film 104, and the second transparent conductive film 105 to form the first lower transparent conductive layer 61 from the first transparent conductive film 101, form the first upper reflective conductive layer 64 from the second reflective conductive film 104, and form the first upper transparent conductive layer 65 from the second transparent conductive film 105 in the first display region D1 so as to overlap the first lower reflective conductive layer 63, and to form the second lower transparent conductive layer 71 from the first transparent conductive film 101, form the second reflective conductive layer 72 from the second reflective conductive film 104, and form the second upper transparent conductive layer 75 from the second transparent conductive film 105 in the second display region D2 so as to overlap each other.

According to the characteristics of the method of manufacturing the organic EL display device 1 according to the first embodiment, the first lower reflective conductive layer 63 is formed in the first patterning step ST2a-2, and the first lower transparent conductive layer 61, the first upper reflective conductive layer 64, and the first upper transparent conductive layer 65 are formed in the second patterning step ST2a-4, and also the second lower transparent conductive layer 71, the second reflective conductive layer 72, and the second upper transparent conductive layer 75 are formed in the second patterning step ST2a-4, and thus the first electrode 51 of the first organic EL element 60A and the first electrode 51 of the second organic EL element 60B having different layer configurations can be formed together. This contributes to efficiently and inexpensively manufacturing the organic EL display device 1.

According to the characteristics of the method of manufacturing the organic EL display device 1 according to the first embodiment, after the second reflective conductive film 104 and the second transparent conductive film 105 are formed in order in the second film forming step ST2a-3, the second reflective conductive film 104 and the second transparent conductive film 105 are patterned in the second patterning step ST2a-4, and thus both the surface of the first reflective conductive layer 62 which reflects light from the organic EL layer 53 and the surface of the second reflective conductive layer 72 which reflects light from the organic EL layer 53 are covered with the second transparent conductive film 105 until the second reflective conductive film 104 is formed and then patterned, and are not exposed to the atmosphere.

The surface of the first reflective conductive layer 62 and the surface of the second reflective conductive layer 72 being exposed to the atmosphere without being covered with a transparent conductive film or the like causes an event in which the surfaces are oxidized or become rough due to a reaction with oxygen in the atmosphere or the like. Such an event reduces the reflectance of light from the organic EL layer 53 by the first reflective conductive layer 62 and the second reflective conductive layer 72. This results in a situation where the light extraction efficiency of the first organic EL element 60A and the second organic EL element 60B is reduced.

On the other hand, in the present embodiment, the surface of the first upper reflective conductive layer 64 and the surface of the second reflective conductive layer 72 are not exposed to the atmosphere by being covered with the second transparent conductive film 105 until the second reflective conductive film 104 is formed and then patterned, and thus it is possible to prevent the surfaces of the first upper reflective conductive layer 64 and the second reflective conductive layer 72 from being oxidized or becoming rough due to a reaction with oxygen in the atmosphere or the like. Thereby, it is possible to increase the light extraction efficiency of the first organic EL element 60A and the second organic EL element 60B.

First Modification Example of First Embodiment

FIG. 19 is a cross-sectional view illustrating main portions in the first display region D1 of the organic EL display device 1 according to a first modification example of the first embodiment.

Although the area of the first lower transparent conductive layer 61, the area of the first lower reflective conductive layer 63, the area of the first upper reflective conductive layer 64, and the area of the first upper transparent conductive layer 65 are equal to each other in a plan view in the organic EL display device 1 according to the first embodiment, the area of the first lower reflective conductive layer 63 is smaller than the area of the first lower transparent conductive layer 61, the area of the first upper reflective conductive layer 64, and the area of the first upper transparent conductive layer 65 in a plan view in the organic EL display device 1 according to the present modification example as illustrated in FIG. 19.

The peripheral end surface of the first lower reflective conductive layer 63 is covered with the first upper reflective conductive layer 64. The area of the first lower transparent conductive layer 61, the area of the first upper reflective conductive layer 64, and the area of the first upper transparent conductive layer 65 are equal to each other in a plan view. The peripheral end surfaces of the first lower transparent conductive layer 61, the first upper reflective conductive layer 64, and the first upper transparent conductive layer 65 are aligned in a direction in which the first lower transparent conductive layer 61, the first upper reflective conductive layer 64, and the first upper transparent conductive layer 65 are layered (the thickness direction of the first electrode 51).

Characteristics and Effects of First Modification Example of First Embodiment

A characteristic of the organic EL display device 1 according to the first modification example is that the peripheral end surface of the first lower reflective conductive layer 63 is covered with the first upper reflective conductive layer 64, and the peripheral end surfaces of the first lower transparent conductive layer 61, the first upper reflective conductive layer 64, and the first upper transparent conductive layer 65 are aligned in a direction in which the first lower transparent conductive layer 61, the first upper reflective conductive layer 64, and the first upper transparent conductive layer 65 are layered.

According to the characteristic of the organic EL display device 1 according to the first modification example, since the peripheral end surface of the first lower reflective conductive layer 63 is covered with the first upper reflective conductive layer 64, it is sufficient to etch a relatively thin film of only the first upper reflective conductive film 104 for the first reflective conductive layer 62 at the time of forming the first lower transparent conductive layer 61, the first upper reflective conductive layer 64, and the first upper transparent conductive layer 65 in the second patterning step ST2*a*-4 when manufacturing the organic EL display device 1, and thus it is possible to suppress a side shift due to the etching and shorten an etching time.

Second Modification Example of First Embodiment

FIG. 20 is a plan view illustrating configurations of the light-emitting regions E and the peripheral configurations thereof in the first display region D1 and the second display region D2 of the organic EL display device 1 according to a second modification example of the first embodiment.

Although the area of the light-emitting region E of the subpixel Sp in the first display region D1 and the area of the light-emitting region E of the subpixel Sp in the second display region D2 are equal to each other in a plan view in the organic EL display device 1 according to the first embodiment, the area of the light-emitting region E of the subpixel Sp in the first display region D1 and the area of the light-emitting region E of the subpixel Sp in the second display region D2 are different from each other in a plan view in the organic EL display device 1 according to the present modification example as illustrated in FIG. 20.

The first electrode 51 of the first organic EL element 60A and the first electrode 51 of the second organic EL element 60B have the same shape in a plan view, and the area of the first electrode 51 of the second organic EL element 60B is smaller than the area of the first electrode 51 of the first organic EL element 60A. The organic EL layer 53 of the first organic EL element 60A and the organic EL layer 53 of the second organic EL element 60B have the same shape in a plan view, and the area of the organic EL layer 53 of the first organic EL element 60A and the area of the organic EL layer 53 of the second organic EL element 60B are equal to each other. Here, the "area of the organic EL layer 53" refers to the area of a region in which the individual light-emitting layer 72 is provided in the organic EL layer 53 in a plan view.

The area of the opening 68 that exposes the first electrode 51 of the first organic EL element 60A in the edge cover 52 is larger than the area of the opening 68 that exposes the first electrode 51 of the second organic EL element 60B in a plan view. Both the openings 68 have the same shape in a plan view. The area of the light-emitting region E of the subpixels Sp in the first display region D1 is larger than the area of the light-emitting region E of the subpixels Sp in the second display region D2 in a plan view.

Characteristics and Effects of Second Modification Example of First Embodiment

A characteristic (1) of the organic EL display device 1 according to a second modification example is that the area of the first electrode 51 of the second organic EL element 60B is smaller than the area of the first electrode 51 of the first organic EL element 60A in a plan view.

According to the characteristic (1) of the organic EL display device 1 according to the second modification example, the area of the first electrode 51 of the second organic EL element 60B is smaller than the area of the first electrode 51 of the first organic EL element 60A, and thus it is possible to reduce a region in which light from the front face side is blocked by the first electrode 51 in the second display region D2 and increase the amount of light passing through the subpixel Sp from the front face side to the back face side. This contributes to an increase in the amount of light that can be used for image capture by the camera 3 and an improvement in image capture performance of the in-camera 3 which is combined with the organic EL display device 1.

A characteristic (2) of the organic EL display device 1 according to the second modification example is the same as the characteristic (8) of the organic EL display device 1 according to the first embodiment, and the same effects as those of the characteristic (8) of the organic EL display device 1 according to the first embodiment can be obtained.

A characteristic (3) of the organic EL display device 1 according to the second modification example is that the area of the opening 68 exposing the first electrode 51 of the first organic EL element 60A is larger than the area of the opening 68 exposing the first electrode 51 of the second organic EL element 60B in the edge cover 52.

According to the characteristic (3) of the organic EL display device 1 according to the second modification example, the area of the light-emitting region E of the subpixel Sp in the first display region D1 is larger than the area of the light-emitting region E of the subpixel Sp in the second display region D2, and thus it is possible to make the luminance in the subpixel Sp in the first display region D1 higher than the luminance in the subpixel Sp in the second display region D2. Thus, it is possible to secure the brightness of image display in the first display region D1.

Second Embodiment

An organic EL display device 1 according to a second embodiment is different from that in the first embodiment in a configuration of a first electrode 51 of a first organic EL element 60A and a configuration of a first electrode 51 of a second organic EL element 60B. Note that, in the present embodiment, the organic EL display device 1 is configured in the same manner as that in the first embodiment except that the configurations of the first electrodes 51 of the first organic EL element 60A and the second organic EL element 60B are different from those in the first embodiment, and thus a detailed description of the same components as those in the first embodiment will be omitted by replacing the description with the description in the first embodiment.

Configuration of Organic EL Display Device

FIG. 21 is a cross-sectional view illustrating main portions in the first display region D1 of the organic EL display device 1 according to the second embodiment. FIG. 22 is a cross-sectional view illustrating main portions in the second display region D2 of the organic EL display device 1 according to the second embodiment. FIG. 23 is a cross-sectional view illustrating a layered structure of the first electrodes 51 in the first display region D1 and the second display region D2 of the organic EL display device 1 according to the second embodiment. FIG. 24 is a plan view illustrating configurations of light-emitting regions E and the peripheral configurations thereof in the first display region D1 and the second display region D2 of the organic EL display device 1 according to the second embodiment.

First Electrode of First Organic EL Element

As illustrated in FIG. 21 and FIG. 23, in the organic EL display device 1 according to the second embodiment, the first electrode 51 of the first organic EL element 60A includes a first lower transparent conductive layer 61, a first reflective conductive layer 62, and a first upper transparent conductive layer 65 which are provided in order on a flattening film 29. Configurations of the first lower transparent conductive layer 61 and the first upper transparent conductive layer 65 are the same as those in the first embodiment. A configuration of the first reflective conductive layer 62 is different from that in the first embodiment.

The first reflective conductive layer 62 is provided on the first lower transparent conductive layer 61. The first reflective conductive layer 62 is formed of, for example, at least one metal material selected from among silver (Ag), a silver alloy, aluminum (Al), and an aluminum alloy. A thickness t12 of the first reflective conductive layer 62 is, for example, approximately 80 nm to 100 nm. The first reflective conductive layer 62 totally reflects or almost totally reflects light (conceptually indicated by a dashed arrow in FIG. 21) which is incident from the front face side of the display region D. The first reflective conductive layer 62 is sealed between the first lower transparent conductive layer 61 and the first upper transparent conductive layer 65.

As illustrated in FIG. 24, the area of the first reflective conductive layer 62 (hatched by an upper right diagonal lines in the drawing) is smaller than the area of the first lower transparent conductive layer 61 and the area of the first upper transparent conductive layer 65 in a plan view. As illustrated in FIG. 21, the peripheral end surface of the first reflective conductive layer 62 is covered with the first upper transparent conductive layer 65. The first lower transparent conductive layer 61 and the first upper transparent conductive layer 65 are in contact with each other on the outer periphery of the first reflective conductive layer 62. The peripheral end surfaces of the first lower transparent conductive layer 61 and the first upper transparent conductive layer 65 are aligned in a direction in which the first lower transparent conductive layer 61 and the first upper transparent conductive layer 65 are layered (the thickness direction of the first electrode 51).

First Electrode of Second Organic EL Element

As illustrated in FIG. 22 and FIG. 23, in the organic EL display device 1 according to the second embodiment, the first electrode 51 of the second organic EL element 60B includes a second lower transparent conductive layer 71, a second reflective conductive layer 72, and a second upper transparent conductive layer 75 which are provided in order on the flattening film 29. Configurations of the second lower transparent conductive layer 71 and the second upper transparent conductive layer 75 are the same as those in the first embodiment. A configuration of the second reflective conductive layer 72 is different from that in the first embodiment.

The second reflective conductive layer 72 is provided on the second lower transparent conductive layer 71. A plurality of second reflective conductive layers 72 are provided in an island shape on the inner side of an opening 68 of an edge cover 52. The second reflective conductive layer 72 is not provided at a position overlapping the edge cover 52. The second reflective conductive layer 72 is formed of the same material as that of and in the same layer as the first reflective conductive layer 62, for example, at least one metal material selected from among silver (Ag), a silver alloy, aluminum (Al), and an aluminum alloy. A thickness t22 of the second reflective conductive layer 72 is equal to the thickness t12 of the first reflective conductive layer 62 on the inner side of the opening 68 of the edge cover 52, and is, for example, approximately 80 nm to 100 nm.

As illustrated in FIG. 24, a plurality of second reflective conductive layers 72 (hatched by an upper right diagonal lines in the drawing) are disposed in a matrix on the inner side of the opening 68 of the edge cover 52. The plurality of second reflective conductive layers 72 may be aligned in a row or may be provided in another arrangement. A predetermined gap is provided between the adjacent second reflective conductive layers 72. As illustrated in FIG. 22, the peripheral end surface of the second reflective conductive layer 72 is covered with the second upper transparent conductive layer 75. The second lower transparent conductive layer 71 and the second upper transparent conductive layer 75 are in contact with each other in the gap between the adjacent second reflective conductive layers 72 on the inner side of the opening 68 of the edge cover 52.

The second reflective conductive layer 72 is sealed between the second lower transparent conductive layer 71 and the second upper transparent conductive layer 75. The second lower transparent conductive layer 71 and the second upper transparent conductive layer 75 constitute a portion of the first electrode 51 of the second organic EL element 60B which overlaps the edge cover 5 in a plan view, and are in contact with each other at a location overlapping the peripheral edge portion of the opening 68 of the edge cover 52. The peripheral end surfaces of the second lower transparent conductive layer 71 and the second upper transparent conductive layer 75 are aligned in a direction in which the second lower transparent conductive layer 71 and the second upper transparent conductive layer 75 are layered (the thickness direction of the first electrode 51).

The second reflective conductive layer 72 is partially provided on the inner side of the opening 68 of the edge cover 52. The first electrode 51 of the second organic EL element 60B has a portion in which the second reflective conductive layer 72 is not provided, on the inner side of the opening 68 of the edge cover 52. Thus, the first electrode 51 of the second organic EL element 60B includes a thin layer portion 51a and a plurality of thick layer portions 51b (tb>ta) each of which is thicker than the thin layer portion 51a on the inner side of the opening 68 of the edge cover 52.

The thin layer portion 51a in the first electrode 51 of the second organic EL element 60B is a portion in which the second reflective conductive layer 72 is not provided, and is constituted by the second lower transparent conductive layer 71 and the second upper transparent conductive layer 75. The thin layer portion 51a extends in a lattice pattern between the adjacent second reflective conductive layers 72 on the inner side of the opening 68 of the edge cover 52. Further, the thin layer portion 51a constitutes a portion of the first electrode 51 which overlaps the edge cover 52 and is also provided in a region including the inside of the contact hole 33. The first electrode 51 of the second organic EL element 60B almost transmits light incident from the front face side of the display region D (conceptually illustrated by a dashed arrow in FIG. 22) in the thin layer portion 51*a*.

The thick layer portions 51*b* in the first electrode 51 of the second organic EL element 60B are portions in which the second reflective conductive layer 72 is provided, and are disposed in a matrix. A thickness tb of the thick layer portion 51*b* is equal to the thickness t1 of a portion of the first electrode 51 of the first organic EL element 60A which is positioned on the inner side of the opening 68 of the edge cover 52. The first electrode 51 of the second organic EL element 60B totally reflects or almost totally reflects light incident from the front face side of the display region D (conceptually illustrated by a dashed arrow in FIG. 22) in the thick layer portion 51*b*.

Method of Manufacturing Organic EL Display Device

A method of manufacturing the organic EL display device 1 according to the second embodiment will be described below.

The method of manufacturing the organic EL display device 1 according to the second embodiment includes a TFT layer forming step ST1, a light-emitting element layer forming step ST2, a sealing film forming step ST3, a flexibilization step ST4, and a mounting step ST5. Among these steps, the TFT layer forming step ST1, the sealing film forming step ST3, the flexibilization step ST4, and the mounting step ST5 are the same as those in the first embodiment.

The light-emitting element layer forming step ST2 includes a first electrode forming step ST2*a*, an edge cover forming step ST2*b*, an organic EL layer forming step ST2*c*, and a second electrode forming step ST2*d*. Among these steps, the edge cover forming step ST2*b*, the organic EL layer forming step ST2*c*, and the second electrode forming step ST2*d* are the same as those in the first embodiment.

The first electrode forming step ST2*a* includes a first film forming step ST2*a*-1, a first patterning step ST2*a*-2, a second film forming step ST2*a*-3, and a second patterning step ST2*a*-4.

First Film Forming Step

FIG. 25 is a cross-sectional view illustrating main portions of a substrate on which film formation has been performed in the first film forming step ST2*a*-1 in the method of manufacturing the organic EL display device 1 according to the second embodiment.

As illustrated in FIG. 2, in the first film forming step ST2*a*-1, the first transparent conductive film 101 and the first reflective conductive film 102 are formed in order on the substrate on which the TFT layer 20 has been formed, for example, by a sputtering method so that each of the films is formed as a single layer or a plurality of layers of each of the films are layered. The thickness of the first transparent conductive film 101 that is formed here is set to, for example, approximately 10 nm to 20 nm. The thickness of the first reflective conductive film 102 is set to, for example, approximately 80 nm to 100 nm.

First Patterning Step

FIG. 26 is a cross-sectional view illustrating main portions of the substrate on which a resist layer 103 has been formed in the first patterning step ST2*a*-2 in the method of manufacturing the organic EL display device 1 according to the second embodiment. FIG. 27 is a cross-sectional view illustrating main portions of the substrate on which patterning has been performed in the first patterning step ST2*a*-2 in the method of manufacturing the organic EL display device 1 according to the second embodiment.

The first patterning step ST2*a*-2 is performed after the first film forming step ST2*a*-1. In the first patterning step ST2*a*-2, the first reflective conductive film 102 is patterned by photolithography to form a plurality of first reflective conductive layers 62 from the first reflective conductive film 102 in a predetermined pattern in the first display region D1 of the display region D and form a plurality of second reflective conductive layers 72 from the first reflective conductive film 102 in a predetermined pattern in the second display region D2 of the display region D.

First, a photosensitive resin material is applied to the substrate on which the first transparent conductive film 101 and the first reflective conductive film 102 have been formed, for example, by a known coating method such as a spin coating method. Subsequently, the coating film of the photosensitive resin material is pre-baked, exposed, developed, and post-baked to pattern the coating film, thereby forming the island-shaped resist layer 103 in each region for forming the first reflective conductive layer 62 in the first display region D1 and each region for forming the second reflective conductive layer 72 in the second display region D2 as illustrated in FIG. 26.

Next, the first reflective conductive film 102 is subjected to wet etching by being exposed to an etching solution using the resist layer 103 as a mask. As the etching solution in this case, a type of etching solution having a relatively high selection ratio of the material of the first reflective conductive film 102 with respect to the material of the first transparent conductive film 101 is used. The first reflective conductive film 102 is patterned by being selectively corroded and dissolved by wet etching using such an etching solution. Subsequently, the resist layer 103 is removed by ashing. Thus, as illustrated in FIG. 27, the first reflective conductive layers 62 are formed from the first reflective conductive film 102 in the first display region D1, and the second reflective conductive layers 72 are formed from the first reflective conductive film 102 in the second display region D2.

Second Film Forming Step

FIG. 28 is a cross-sectional view illustrating main portions of the substrate on which film formation has been performed in the second film forming step ST2*a*-3 in the method of manufacturing the organic EL display device 1 according to the second embodiment.

The second film forming step ST2*a*-3 is performed after the first patterning step ST2*a*-2. As illustrated in FIG. 28, in the second film forming step ST2*a*-3, the second transparent conductive film 105 is formed on a substrate on which the first reflective conductive layer 62 and the second reflective conductive layer 72 have been formed, for example, by a sputtering method so that the second transparent conductive film 105 is formed as a single layer or a plurality of second transparent conductive films 105 are layered. The thickness of the second transparent conductive film 105 that is formed here is equal to the thickness of the first transparent conductive film 101 (for example, approximately 10 nm to 20 nm).

Second Patterning Step

FIG. 29 is a cross-sectional view illustrating main portions of the substrate on which a resist layer 106 has been formed in the second patterning step ST2*a*-4 in the method of manufacturing the organic EL display device 1 according to the second embodiment. FIG. 30 is a cross-sectional view illustrating main portions of the substrate on which patterning has been performed in the second patterning step ST2*a*-4 in the method of manufacturing the organic EL display device 1 according to the second embodiment.

The second patterning step ST2*a*-4 is performed after the second film forming step ST2*a*-3. In the second patterning step ST2*a*-4, the first transparent conductive film 101 and the second transparent conductive film 105 are patterned by photolithography to form a plurality of first electrodes 51 in a predetermined pattern in each of the first display region D1 and the second display region D2.

First, a photosensitive resin material is applied to the substrate on which the second transparent conductive film 105 has been formed, for example, by a known coating method such as a spin coating method. Subsequently, the coating film of the photosensitive resin material is pre-baked, exposed, developed, and post-baked to pattern the coating film, thereby forming the island-shaped resist layer 106 in each region for forming the first electrodes 51 in the first display region D1 and the second display region D2 as illustrated in FIG. 29.

Next, by subjecting the first transparent conductive film 101 and the second transparent conductive film 105 are subjected to wet etching by being exposed to an etching solution using the resist layer 106 as a mask. As the etching solution in this case, a type of etching solution having a relatively low selection ratio between the material of the first transparent conductive film 101 and the material of the second transparent conductive film 105 is used. The first transparent conductive film 101 and the second transparent conductive film 105 are patterned by being collectively corroded and dissolved by wet etching using such an etching solution. Subsequently, the resist layer 106 is removed by ashing.

By patterning the first transparent conductive film 101 and the second transparent conductive film 105, the first lower transparent conductive layer 61 and the first upper transparent conductive layer 65 are formed from the first transparent conductive film 101 and from the second transparent conductive film 105, respectively, so as to overlap the first reflective conductive layer 62 in the first display region D1 as illustrated in FIG. 30. In addition, along with the formation of the first lower transparent conductive layer 61 and the like, the second lower transparent conductive layer 71 and the second upper transparent conductive layer 75 are formed from the first transparent conductive film 101 and the second transparent conductive film 105, respectively, so as to overlap the second reflective conductive layer 72 in the second display region D2.

In this manner, a plurality of first electrodes 51 in each of which the first lower transparent conductive layer 61, the first reflective conductive layer 62, and the first upper transparent conductive layer 65 are layered are formed in the first display region D1. In addition, a plurality of first electrodes 51 in each of which the second lower transparent conductive layer 71, the second reflective conductive layer 72, and the second upper transparent conductive layer 75 are layered are formed in the second display region D2.

Characteristics and Effects of Second Embodiment

A characteristic (1) of the organic EL display device 1 according to the second embodiment is that the first electrode 51 of the first organic EL element 60A includes the first lower transparent conductive layer 61, the first reflective conductive layer 62 provided on the first lower transparent conductive layer 61, and the first upper transparent conductive layer 65 provided on the first reflective conductive layer 62, the first electrode 51 of the second organic EL element 60B includes the second lower transparent conductive layer 71 formed of the same material as that of and in the same layer as the first lower transparent conductive layer 61, the second reflective conductive layer 72 formed of the same material as that of and in the same layer as the first reflective conductive layer 62 on the second lower transparent conductive layer 71, and the second upper transparent conductive layer 75 formed of the same material as that of and in the same layer as the first upper transparent conductive layer 65 on the second reflective conductive layer 72, and the second reflective conductive layer 72 is partially provided on the inner side of the opening 68 of the edge cover 52.

According to the characteristic (1) of the organic EL display device 1 according to the second embodiment, the second reflective conductive layer 72 is partially provided on the inner side of the opening 68 of the edge cover 52, and thus light passes through a portion of the first electrode 51 of the second organic EL element 60B in which the second reflective conductive layer 72 is not provided on the inner side of the opening 68 of the edge cover 52, and the amount of light that passes through the first electrode 51 on the inner side of the opening 68 of the edge cover 52 increases. Thereby, it is possible to increase the transmittance of light in the second display region 12 that transmits light used in the camera 3 in the display region D.

A characteristic (2) of the organic EL display device 1 according to the second embodiment is that the first electrode 51 of the second organic EL element 60B includes the thin layer portion 51*a* and the thick layer portion 51*b* on the inner side of the opening 68 of the edge cover 52, the thin layer portion 51*a* being a portion in which the second reflective conductive layer 72 is not provided, and the thick layer portion 51*b* being a portion which is thicker than the thin layer portion 51*a* and in which the second reflective conductive layer 72 is provided, and the thickness tb of the thick layer portion 51*b* is equal to the thickness t1 of a portion of the first electrode 51 of the first organic EL element 60A which is positioned on the inner side of the opening 68 of the edge cover 52.

According to the characteristic (2) of the organic EL display device 1 according to the second embodiment, the thickness tb of the thick layer portion 51*b* of the first electrode 51 of the first organic EL element 60A which is positioned on the inner side of the opening 68 of the edge cover 52 is equal to the thickness t1 of the portion of the first electrode 51 of the second organic EL element 60B which is positioned on the inner side of the opening 68 of the edge cover 52, and thus it is possible to reflect light from the organic EL layer 53 by the thick layer portion 51*b* in the same manner as the first electrode 51 of the second organic EL element 60B to suppress a decrease in luminance in the second display region D2 while increasing the transmittance of light in the second display region D2 by the thin layer portion 51*a* in the first electrode 51 of the second organic EL element 60B.

A characteristic (3) of the organic EL display device 1 according to the second embodiment is that the thickness t22 of the second reflective conductive layer 72 on the inner side of the opening 68 of the edge cover 52 is equal to the thickness t12 of the first reflective conductive layer 62 on the inner side of the opening 68 of the edge cover 52, and the second lower transparent conductive layer 71 and the second upper transparent conductive layer 75 are in contact with each other on the inner side of the opening 68 of the edge cover 52.

According to the characteristic (3) of the organic EL display device 1 according to the second embodiment, the thickness t12 of the first reflective conductive layer 62 on the inner side of the opening 68 of the edge cover 52 are equal to the thickness t22 of the second reflective conductive layer 72, and thus the first reflective conductive layer 62 and the second reflective conductive layer 72 can be formed together from the same film by photolithography. In addition, the second lower transparent conductive layer 71 and the second upper transparent conductive layer 75 are in contact with each other on the inner side of the opening 68 of the edge cover 52, and thus the second reflective conductive layer 72 is not provided. Thus, a location where the second lower transparent conductive layer 71 and the second upper transparent conductive layer 75 are in contact with each other has an excellent in transparency and a relatively high light transmittance. Thereby, it is possible to increase sensitivity at the time of image capture by the camera 3. Further, in the manufacture of the organic EL display device 1, an exposed region of the outer peripheral end surface of the second reflective conductive layer 72 can be eliminated after the second transparent conductive film 105 is formed, and thus it is possible to prevent corrosion such as oxidation and sulfurization from occurring in the second reflective conductive layer 72 due to the retention of an etching solution in the first electrode forming step ST2a and the subsequent upper layer steps.

A characteristic (4) of the organic EL display device 1 according to the second embodiment is that the peripheral end surface of the first reflective conductive layer 62 is covered with the first upper transparent conductive layer 65, and the first lower transparent conductive layer 61 and the first upper transparent conductive layer 65 are in contact with each other on the outer periphery of the first reflective conductive layer 62.

According to the characteristic (4) of the organic EL display device 1 according to the second embodiment, the first reflective conductive layer 62 is sealed by the first lower transparent conductive layer 61 and the first upper transparent conductive layer 65, and thus corrosion of the first reflective conductive layer 62 can be suitably suppressed. Further, in the manufacture of the organic EL display device 1, when the first lower transparent conductive layer 61 and the first upper transparent conductive layer 65 are formed, the peripheral end surface of the first reflective conductive layer 62 can be prevented from being exposed to a developing solution used for development processing or an etching solution used for wet etching and shifting inward.

A characteristic (5) of the organic EL display device 1 according to the second embodiment is that a plurality of second reflective conductive layers 72 are provided in an island shape on the inner side of the opening 68 of the edge cover 52.

According to the characteristic (5) of the organic EL display device 1 according to the second embodiment, the plurality of second reflective conductive layers 72 are provided in an island shape on the inner side of the opening 68 of the edge cover 52, and thus it is possible to reduce a region in which light from the front face side in the second display region D2 is blocked by the first electrode 51, as compared to a case where the second reflective conductive layer 72 is formed throughout the entire inner side of the opening 68 of the edge cover 52. This contributes to an improvement in image capture performance of the in-camera 3 which is combined with the organic EL display device 1.

A characteristic (6) of the organic EL display device 1 according to the second embodiment is that the second lower transparent conductive layer 71 and the second upper transparent conductive layer 75 are in contact with each other at a location overlapping the peripheral edge portion of the opening 68 of the edge cover 52.

According to the characteristic (6) of the organic EL display device 1 according to the second embodiment, the second reflective conductive layer 72 is not provided in a portion of the first electrode 51 which is covered with the edge cover 52, and thus it is easy to cover the peripheral edge portion of the first electrode 51 with the edge cover 52. In addition, a location where the second lower transparent conductive layer 71 and the second upper transparent conductive layer 75 are in contact with each other has an excellent transparency and a relatively high light transmittance. Thereby, it is possible to increase sensitivity at the time of image capture by the camera 3. In addition, the smaller the size of the second reflective conductive layer 72, the less the influence of reflection of the second reflective conductive layer 72 at the time of image capture by the camera 3, and thus high-definition patterning of the second reflective conductive layer 72 by photolithography becomes effective.

A characteristic of a method of manufacturing the organic EL display device 1 according to the second embodiment is that the first electrode forming step ST2a includes the first film forming step ST2a-1 of forming the first transparent conductive film 101 and the first reflective conductive film 102 in order on the substrate on which the TFT layer 20 has been formed, the first patterning step ST2a-2 of patterning the first reflective conductive film 102 to form the first reflective conductive layer 62 from the first reflective conductive film 102 so as to cover the entire inner side of the opening 68 of the edge cover 52 in the first display region D1 and to form the second reflective conductive layer 72 from the first reflective conductive film 102 so as to expose the first transparent conductive film 101 in a portion on the inner side of the opening 68 of the edge cover 52 in the second display region D2, the second film forming step ST2a-3 of forming the second transparent conductive film 105 on the substrate on which the first reflective conductive layer 62 and the second reflective conductive layer 72 have been formed, and the second patterning step ST2a-4 of patterning the first transparent conductive film 101 and the second transparent conductive film 105 to form the first lower transparent conductive layer 61 from the first transparent conductive film 101 and form the first upper transparent conductive layer 65 from the second transparent conductive film 105 in the first display region D1 so as to overlap first reflective conductive layer 62, and to form the second lower transparent conductive layer 71 from the first transparent conductive film 101 and form the second upper transparent conductive layer 75 from the second transparent conductive film 105 in the second display region D2 so as to overlap the second reflective conductive layer 72.

According to the characteristics of the method of manufacturing the organic EL display device 1 according to the second embodiment, the first reflective conductive layer 62 and the second reflective conductive layer 72 are formed in the first patterning step ST2a-2, and the first lower transparent conductive layer 61, the first upper transparent conductive layer 65, the second lower transparent conductive layer 71, and the second upper transparent conductive layer 75 are formed in the second patterning step ST2a-4, and thus the first electrode 51 of the first organic EL element 60A and the first electrode 51 of the second organic EL element 60B having different layer configurations can be formed together, This contributes to efficiently and inexpensively manufacturing the organic EL display device 1.

First Modification Example of Second Embodiment

FIG. 31 is a cross-sectional view illustrating main portions in the second display region D2 of the organic EL display device 1 according to a first modification example of the second embodiment.

In the organic EL display device 1 according to the second embodiment, a portion of the first electrode 51 of the second organic EL element 60B which overlaps the edge cover 52 is the thin layer portion 51a constituted by the second lower transparent conductive layer 71 and the second upper transparent conductive layer 75, the thin layer portion 51a being a portion in which the second reflective conductive layer 72 is not provided, but as illustrated in FIG. 31, in the organic EL display device 1 according to the present modification example, a portion of the first electrode 51 of the second organic EL element 60B which overlaps the edge cover 52 includes a thin layer portion 51a in which the second reflective conductive layer 72 is not provided, and a thick layer portion 51b in which the second reflective conductive layer 72 is provided.

The thick layer portion 51b in the first electrode 51 of the second organic EL element 60B is formed to cover the inside of the contact hole 33 of the flattening film 29 and the periphery of the opening of the contact hole 33. The thick layer portion 51b constitutes a portion connected to the drain electrode 28de of the sixth TFT 30f in the first electrode 51 of the second organic EL element 60B. The thick layer portion 51b is constituted by the second lower transparent conductive layer 71, the second reflective conductive layer 72, and the second upper transparent conductive layer 75. That is, the second reflective conductive layer 72 is provided in a region including the inside of the contact hole 33 of the flattening film 29. The thickness tb of the thick layer portion 51b is equal to a thickness t1 (see FIG. 23) of a portion of the first electrode 51 of the first organic EL element 60A which is positioned on the inner side of the opening 68 of the edge cover 52.

In order to manufacture the organic EL display device 1 according to the present modification example, in the first patterning step ST2a-2 described in the second embodiment, the second reflective conductive layer 72 may be formed from the first reflective conductive film 102 inside the contact hole 33 and in the periphery of the opening in a region for forming the first electrode 51 of the second organic EL element 60B.

Characteristics and Effects of First Modification Example of Second Embodiment A characteristic of the organic EL display device 1 according to the first modification example is that the second reflective conductive layer 72 is provided in a region including the inside of the contact hole 33 formed in the flattening film 29 for connecting the first electrode 51 and the sixth TFT 30f.

According to the characteristic of the organic EL display device 1 according to the first modification example, a portion connected to the drain electrode 28de of the sixth TFT 30f in the first electrode 51 of the second organic EL element 60B is the thick layer portion 51b provided with the second reflective conductive layer 72, and thus it is possible to reduce contact resistance between the first electrode 51 of the second organic EL element 60B and the drain electrode 28de of the sixth TFT 30f.

Second Modification Example of Second Embodiment

FIG. 32 is a plan view illustrating configurations of light-emitting regions E and the peripheral configurations thereof in the first display region D1 and the second display region D2 of the organic EL display device 1 according to a second modification example of the second embodiment.

In the organic EL display device 1 according to the second embodiment, a plurality of second reflective conductive layers 72 in the first electrode 51 of the second organic EL element 60B are provided in an island shape on the inner side of the opening 68 of the edge cover 52, but as illustrated in FIG. 32, in the organic EL display device 1 according to the present modification example, the second reflective conductive layer 72 is provided in a lattice pattern on the inner side of the opening 68 of the edge cover 52. The second reflective conductive layer 72 overlaps the peripheral edge portion of the opening 68 of the edge cover 52 and the entire periphery of the opening 68.

A plurality of rectangular openings 76 are formed in a portion of the second reflective conductive layer 72 which is positioned on the inner side of the opening 68 of the edge cover 52. For example, the plurality of openings 76 are disposed in a matrix. The plurality of openings 76 may be aligned in a row or may be provided in another arrangement such as a zigzag shape. The opening 76 may have any of other shapes such as a circular shape, an elliptical shape, and a slit shape. The second reflective conductive layer 72 overlaps the peripheral edge portion of the opening 68 of the edge cover 52 and the entire periphery of the opening 68.

Characteristics and Effects of Second Modification Example of Second Embodiment A characteristic of the organic EL display device 1 according to the second modification example is that the second reflective conductive layer 72 overlaps the peripheral edge portion of the opening 68 of the edge cover 52 and the entire periphery of the opening 68.

According to the characteristic of the organic EL display device 1 according to the second modification example, light emitted by the organic EL layer 53 at the peripheral edge portion of the edge cover 52 and the vicinity thereof can be reflected by the second reflective conductive layer 72 on the front face side of the display region D. The light emission intensity of the organic EL layer 53 is relatively high at the peripheral edge portion of the edge cover 52 and the vicinity thereof. Thus, it is possible to suppress a decrease in the light extraction efficiency of the second organic EL element 60B due to the second reflective conductive layer 72 being not provided in a portion of the first electrode 51 on the inner side of the edge cover 52.

Third Embodiment

An organic EL display device 1 according to a third embodiment is different from that in the first embodiment in a configuration of a first electrode 51 of a first organic EL element 60A and a configuration of a first electrode 51 of a second organic EL element 60B. Note that, in the present embodiment, the organic EL display device 1 is configured in the same manner as that in the first embodiment except that the configurations of the first electrodes 51 of the first organic EL element 60A and the second organic EL element 60B are different from those in the first embodiment, and thus a detailed description of the same components as those in the first embodiment will be omitted by replacing the description with the description in the first embodiment.

Configuration of Organic EL Display Device

FIG. 33 is a cross-sectional view illustrating main portions in a second display region D2 of the organic EL display device 1 according to the third embodiment. FIG. 34 is a cross-sectional view illustrating a layered structure of the first electrodes 51 in the first display region D1 and the second display region D2 of the organic EL display device 1 according to the third embodiment. FIG. 35 is a plan view illustrating configurations of light-emitting regions E and the peripheral configurations thereof in the first display region D1 and the second display region D2 of the organic EL display device 1 according to the third embodiment.

First Electrode of First Organic EL Element

In the organic EL display device 1 according to the third embodiment, the first electrode 51 of the first organic EL element 60A includes a first lower transparent conductive layer 61, a first reflective conductive layer 62, and a second upper transparent conductive layer 75 which are provided in order on a flattening film 29 as illustrated in FIG. 34. Configurations of the first lower transparent conductive layer 61 and the first upper transparent conductive layer 65 are the same as those in the first embodiment. A configuration of the first reflective conductive layer 62 is the same as that in the first modification example of the first embodiment.

The first reflective conductive layer 62 includes a first lower reflective conductive layer 63 provided on the first lower transparent conductive layer 61 and a first upper reflective conductive layer 64 provided on the first lower reflective conductive layer 63. As illustrated in FIG. 35, the first lower reflective conductive layer 63 (hatched dots in the drawing) is provided throughout substantially the entirety except for the outer peripheral portion of the first electrode 51 of the first organic EL element 60A. The first upper reflective conductive layer 64 (hatched by an upper right diagonal line in the drawing) is provided throughout the entire first electrode 51 of the first organic EL element 60A.

First Electrode of Second Organic EL Element

As illustrated in FIG. 33 and FIG. 34, the first electrode 51 of the second organic EL element 60B includes a second lower transparent conductive layer 71, a second reflective conductive layer 72, and a second upper transparent conductive layer 75 which are provided in order on the flattening film 29. Configurations of the second lower transparent conductive layer 71 and the second upper transparent conductive layer 75 are the same as those in the first embodiment. A configuration of the second reflective conductive layer 72 is different from that in the first embodiment.

The second reflective conductive layer 72 includes a second lower reflective conductive layer 73 provided on the second lower transparent conductive layer 71 and a second upper reflective conductive layer 74 provided on the second lower reflective conductive layer 73. The second lower reflective conductive layer 73 and the second upper reflective conductive layer 74 have light reflectivity to reflect light.

A plurality of second lower reflective conductive layers 73 are provided in an island shape on the inner side of an opening 68 of an edge cover 52. The second lower reflective conductive layer 73 is not provided at a position overlapping the edge cover 52 in a plan view. The second lower reflective conductive layer 73 is formed of the same material as that of and in the same layer as the first lower reflective conductive layer 63, for example, at least one metal material selected from among silver (Ag), a silver alloy, aluminum (Al), and an aluminum alloy. A thickness t23 of the second lower reflective conductive layer 73 is equal to the thickness t13 of the first lower reflective conductive layer 63 on the inner side of the opening 68 of the edge cover 52, and is, for example, approximately 70 nm to 90 nm.

As illustrated in FIG. 35, the plurality of second lower reflective conductive layers 73 (hatched dots in the drawing) are disposed in a matrix on the inner side of the opening 68 of the edge cover 52. The plurality of second lower reflective conductive layers 73 may be aligned in a row or may be provided in another arrangement such as a zigzag shape. A predetermined gap is provided between the adjacent second lower reflective conductive layers 73. As illustrated in FIG. 33, the peripheral end surface of the second lower reflective conductive layer 73 is covered with the second upper reflective conductive layer 74. The second lower transparent conductive layer and the second upper reflective conductive layer are in contact with each other in the gap between the adjacent second reflective conductive layers 72 on the inner side of the opening 68 of the edge cover 52.

The second lower reflective conductive layer 73 is sealed between the second lower transparent conductive layer 71 and the second upper reflective conductive layer 74. The second lower transparent conductive layer 71 and the second upper reflective conductive layer 74 are in contact with each other at a location overlapping the peripheral edge portion of the opening 68 of the edge cover 52. The second lower transparent conductive layer 71, the second upper reflective conductive layer 74, and the second upper transparent conductive layer 75 constitute a portion of the first electrode 51 of the second organic EL element 60B which overlaps the edge cover 52 in a plan view. The peripheral end surfaces of the second lower transparent conductive layer 71, the second upper reflective conductive layer 74, and the second upper transparent conductive layer 75 are aligned in a direction in which the second lower transparent conductive layer 71, the second upper reflective conductive layer 74, and the second upper transparent conductive layer 75 are layered (the thickness direction of the first electrode 51).

The second lower reflective conductive layer 73 is partially provided on the inner side of the opening 68 of the edge cover 52. The first electrode 51 of the second organic EL element 60B has a portion in which the second lower reflective conductive layer 73 is not provided on the inner side of the opening 68 of the edge cover 52. Thus, the first electrode 51 of the second organic EL element 60B includes a thin layer portion 51a and a plurality of thick layer portions 51b (tb>ta) each of which is thicker than the thin layer portion 51a on the inner side of the opening 68 of the edge cover 52.

The thin layer portion 51a in the first electrode 51 of the second organic EL element 60B is a portion in which the second lower reflective conductive layer 73 is not provided, and is constituted by the second lower transparent conductive layer 71, the second upper reflective conductive layer 74, and the second upper transparent conductive layer 75. That is, the second reflective conductive layer 72 of the thin layer portion 51a is configured by the second upper reflective conductive layer 74. The thin layer portion 51a extends in a lattice pattern between the adjacent second lower reflective conductive layers 73 on the inner side of the opening 68 of the edge cover 52. Further, the thin layer portion 51a constitutes a portion of the first electrode 51 which overlaps the edge cover 52 and is also provided in a region including the inside of the contact hole 33. The first electrode 51 of the second organic EL element 60B partially reflects and partially transmits light (conceptually indicated by a dashed arrow in FIG. 33) which is incident from the front face side of the display region D in the thin layer portion 51a.

The thick layer portions 51b of the first electrode 51 of the second organic EL element 60B are portion in each of which the second lower reflective conductive layer 73 is provided, and are disposed in a matrix. The second reflective conductive layer 72 of the thick layer portion 51b is constituted by the second lower reflective conductive layer 73 and the second upper reflective conductive layer 74. The thickness tb of the thick layer portion 51b is equal to the thickness t1 of a portion of the first electrode 51 of the first organic EL element 60A which is positioned on the inner side of the opening 68 of the edge cover 52. The first electrode 51 of the second organic EL element 60B totally reflects or almost totally reflects light incident from the front face side of the display region D (conceptually illustrated by a dashed arrow in FIG. 33) by the second reflective conductive layer 72 in the thick layer portion 51b.

Method of Manufacturing Organic EL Display Device

A method of manufacturing the organic EL display device 1 according to the third embodiment will be described below.

A method for manufacturing the organic EL display device 1 according to the third embodiment includes a TFT layer forming step ST1, a light-emitting element layer forming step ST2, a sealing film forming step ST3, a flexibilization step ST4, and a mounting step ST5. Among these steps, the TFT layer forming step ST1, the sealing film forming step ST3, the flexibilization step ST4, and the mounting step ST5 are the same as those in the first embodiment.

The light-emitting element layer forming step ST2 includes a first electrode forming step ST2a, an edge cover forming step ST2b, an organic EL layer forming step ST2c, and a second electrode forming step ST2d. Among these steps, the edge cover forming step ST2b, the organic EL layer forming step ST2c, and the second electrode forming step ST2d are the same as those in the first embodiment.

The first electrode forming step ST2a includes a first film forming step ST2a-1, a first patterning step ST2a-2, a second film forming step ST2a-3, and a second patterning step ST2a-4.

First Film Forming Step

The first film forming step ST2a-1 is the same as that in the first embodiment. That is, as illustrated in FIG. 13, in the first film forming step ST2a-1, the first transparent conductive film 101 and the first reflective conductive film 102 are formed in order on the substrate on which the TFT layer 20 has been formed, for example, by a sputtering method so that each of the films is formed as a single layer or a plurality of layers of each of the films are layered. The thickness of the first transparent conductive film 101 that is formed here is set to, for example, approximately 10 nm to 20 nm. The thickness of the first reflective conductive film 102 is set to, for example, approximately 70 nm to 90 nm.

First Patterning Step

FIG. 36 is a cross-sectional view illustrating main portions of the substrate on which a resist layer 103 has been formed in the first patterning step ST2a-2 in the method of manufacturing the organic EL display device 1 according to the third embodiment. FIG. 37 is a cross-sectional view illustrating main portions of the substrate on which patterning has been performed in the first patterning step ST2a-2 in the method of manufacturing the organic EL display device 1 according to the third embodiment.

The first patterning step ST2a-2 is performed after the first film forming step ST2a-1. In the first patterning step ST2a-2, the first reflective conductive film 102 is patterned by photolithography to form the plurality of first lower reflective conductive layers 63 from the first reflective conductive film 102 in a predetermined pattern in the first display region D1 of the display region D and form the plurality of second lower reflective conductive layers 73 from the first reflective conductive film 102 in a predetermined pattern in the second display region D2 of the display region D.

First, a photosensitive resin material is applied to the substrate on which the first transparent conductive film 101 and the first reflective conductive film 102 have been formed, for example, by a known coating method such as a spin coating method. Subsequently, the coating film of the photosensitive resin material is pre-baked, exposed, developed, and post-baked to pattern the coating film, thereby forming the island-shaped resist layer 103 in each region for forming the first lower reflective conductive layer 63 in the first display region D1 and in each region for forming the second lower reflective conductive layer 73 in the second display region D2 as illustrated in FIG. 36.

Next, the first reflective conductive film 102 is subjected to wet etching by being exposed to an etching solution using the resist layer 103 as a mask. As the etching solution in this case, a type of etching solution having a relatively high selection ratio of the material of the first reflective conductive film 102 with respect to the material of the first transparent conductive film 101 is used. The first reflective conductive film 102 is patterned by being selectively corroded and dissolved by wet etching using such an etching solution. Subsequently, the resist layer 103 is removed by asking. Thus, as illustrated in FIG. 37, the first lower reflective conductive layers 63 are formed from the first reflective conductive film 102 in the first display region D1, and the second lower reflective conductive layers 73 are formed from the first reflective conductive film 102.

FIG. 38 is a cross-sectional view illustrating main portions of the substrate on which film formation has been performed in the second film forming step ST2a-3 in the method of manufacturing the organic EL display device 1 according to the third embodiment.

The second film forming step ST2a-3 is performed after the first patterning step ST2a-2. As illustrated in FIG. 39, in the second film forming step ST2a-3, the second reflective conductive film 104 and the second transparent conductive film 105 are formed in order on the substrate on which the first lower reflective conductive layer 63 and the second lower reflective conductive layer 73 have been formed, for example, by a sputtering method so that each of the films is formed as a single layer or a plurality of layers of each of the films are layered. The thickness of the second reflective conductive film 104 that is formed here is set to, for example, approximately 10 nm to 50 nm. The thickness of the second transparent conductive film 105 is equal to the thickness of the first transparent conductive film 101 (for example, approximately 10 nm to 20 nm).

Second Patterning Step

FIG. 39 is a cross-sectional view illustrating main portions of the substrate on which a resist layer 106 has been formed in the second patterning step ST2$a$-4 in the method of manufacturing the organic EL display device 1 according to the third embodiment. FIG. 40 is a cross-sectional view illustrating main portions of the substrate on which patterning has been performed in the second patterning step ST2$a$-4 in the method of manufacturing the organic EL display device 1 according to the third embodiment.

The second patterning step ST2$a$-4 is performed after the second film forming step ST2$a$-3. In the second patterning step ST2$a$-4, the first transparent conductive film 101, the second reflective conductive film 104, and the second transparent conductive film 105 are patterned by photolithography to form a plurality of first electrodes 51 in a predetermined pattern in each of the first display region D1 and the second display region D2.

First, a photosensitive resin material is applied to the substrate on which the second reflective conductive film 104 and the second transparent conductive film 105 have been formed, for example, by a known coating method such as a spin coating method. Subsequently, the coating film of the photosensitive resin material is pre-baked, exposed, developed, and post-baked to pattern the coating film, thereby forming the island-shaped resist layer 106 in each region for forming the first electrode 51 in the first display region D1 and the second display region D2 as illustrated in FIG. 39.

Next, the first transparent conductive film 101, the second reflective conductive film 104, and the second transparent conductive film 105 are subjected to wet etching by being exposed to an etching solution using the resist layer 106 as a mask. As the etching solution in this case, a type of etching solution having a relatively low selection ratio between the material of the second reflective conductive film and the materials of the first transparent conductive film 101 and the second transparent conductive film 105 is used. The first transparent conductive film 101, the second reflective conductive film 104, and the second transparent conductive film 105 are patterned by being collectively corroded and dissolved by wet etching using such an etching solution. Subsequently, the resist layer 106 is removed by asking.

By patterning the first transparent conductive film 101, the second reflective conductive film 104, and the second transparent conductive film 105, the first lower transparent conductive layer 61, the first upper reflective conductive layer 64, and the first upper transparent conductive layer 65 are formed from the first transparent conductive film 101, the second reflective conductive film 104, and the second transparent conductive film 105, respectively, so as to overlap the first lower reflective conductive layer 63 in the first display region D1 as illustrated in FIG. 40. In addition, along with the formation of the first lower transparent conductive layer 61 and the like, the second lower transparent conductive layer 71, the second upper reflective conductive layer 74, and the second upper transparent conductive layer 75 are formed from the first transparent conductive film 101, the second reflective conductive film 104, and the second transparent conductive film 105, respectively, so as to overlap the second lower reflective conductive layer 73 in the second display region D2.

In this manner, a plurality of first electrodes 51 in each of which the first lower transparent conductive layer 61, the first lower reflective conductive layer 63, the first upper reflective conductive layer 64, and the first upper transparent conductive layer 65 are layered are formed in the first display region D1. In addition, a plurality of first electrodes 51 in each of which the second lower transparent conductive layer 71, the second lower reflective conductive layer 73, the second upper reflective conductive layer 74, and the second upper transparent conductive layer 75 are layered are formed in the second display region D2.

Characteristics and Effects of Third Embodiment

A characteristic (1) of the organic EL display device 1 according to the third embodiment is that the first electrode 51 of the first organic EL element 60A includes the first lower transparent conductive layer 61, the first reflective conductive layer 62 provided on the first lower transparent conductive layer 61, and the first upper transparent conductive layer 65 provided on the first reflective conductive layer 62, the first electrode 51 of the second organic EL element 60B includes the second lower transparent conductive layer 71 formed of the same material as that of and in the same layer as the first lower transparent conductive layer 61, the second reflective conductive layer 72 formed of the same material as that of and in the same layer as the first reflective conductive layer 62 on the second lower transparent conductive layer 71, and the second upper transparent conductive layer 75 formed of the same material as that of and in the same layer as the first upper transparent conductive layer 65 on the second reflective conductive layer 72, and a portion of the second reflective conductive layer 72 is thinner than the first reflective conductive layer 62 on the inner side of the opening 68 of the edge cover 52.

According to the characteristic (1) of the organic EL display device 1 according to the third embodiment, a portion of the second reflective conductive layer 72 is thinner than the first reflective conductive layer 62 on the inner side of the opening 68 of the edge cover 52, and thus light passes through the portion of the first electrode 51 of the second organic EL element 60B in which the second reflective conductive layer 72 is thinner than the first reflective conductive layer 62 on the inner side of the opening 68 of the edge cover 52, and the amount of light that passes through the first electrode 51 on the inner side of the opening 68 of the edge cover 52 increases. Thereby, it is possible to increase the transmittance of light in the second display region D2 that transmits light used in the camera 3 in the display region D.

A characteristic (2) of the organic EL display device 1 according to the third embodiment is that the first electrode 51 of the second organic EL element 60B includes the thin layer portion 51$a$ and the thick layer portion 51$b$ on the inner side of the opening 68 of the edge cover 52, the thin layer portion 51$a$ being a portion in which the second reflective conductive layer 72 is provided being thinner than the first reflective conductive layer 62, and the thick layer portion 51$b$ being a portion which is thicker than the thin layer portion 51$a$ and in which the second reflective conductive layer 72 is provided having a thickness equal to that of the first reflective conductive layer 62, and the thickness tb of the thick layer portion 51b is equal to the thickness t1 of a portion of the first electrode 51 of the first organic EL element 60A which is positioned on the inner side of the opening 68 of the edge cover 52.

According to the characteristic (2) of the organic EL display device 1 according to the third embodiment, the thickness tb of the thick layer portion 51b in the first electrode 51 of the second organic EL element 60B is equal to the thickness t1 of the portion of the first electrode 51 of the first organic EL element 60A which is positioned on the inner side of the opening 68 of the edge cover 52, and thus it is possible to reflect light from the organic EL layer 53 by the thick layer portion 51b in the same manner as the first electrode 51 of the first organic EL element 60A to suppress a decrease in luminance in the second display region D2 while increasing the transmittance of light in the second display region D2 by the thin layer portion 51a in the first electrode 51 of the second organic EL element 60B.

A characteristic (3) of the organic EL display device 1 according to the third embodiment is that the first reflective conductive layer 62 is constituted by the first lower reflective conductive layer 63 and the first upper reflective conductive layer 64 provided on the first lower reflective conductive layer 63 throughout the entire inner side of an opening 68 of the edge cover 52, the second reflective conductive layer 72 of the thick layer portion 51b in the first electrode 51 of the second organic EL element 60B is constituted by the second lower reflective conductive layer 73 formed of the same material as that of and in the same layer as the first lower reflective conductive layer 63 and the second upper reflective conductive layer 74 formed of the same material as that of and in the same layer as the first upper reflective conductive layer 64 on the second lower reflective conductive layer 73, and the second reflective conductive layer 72 of the thin layer portion 51a in the first electrode 51 of the second organic EL element 60B is constituted by the second upper reflective conductive layer 74 formed of the same material as that of and in the same layer as the first upper reflective conductive layer 64.

According to the characteristic (3) of the organic EL display device 1 according to the third embodiment, the second reflective conductive layer 72 of the thick layer portion 51b in the first electrode 51 of the second organic EL element 60B is formed of the same material as that of and in the same layer as two conductive layers constituting the first reflective conductive layer 62, and the second reflective conductive layer 72 of the thin layer portion 51a is formed from the same material as that of and in the same layer as one layer out of the two conductive layers constituting the first reflective conductive layer 62, and thus it is easy to provide the thin layer portion 51a thinner than the first reflective conductive layer 62 in the second reflective conductive layer 72 when manufacturing the organic EL display device 1. Thereby, the second organic EL element 60B can be realized by a relatively simple manufacturing flow.

A characteristic (4) of the organic EL display device 1 according to the third embodiment is that a plurality of second lower reflective conductive layers 73 are provided in an island shape on the inner side of the opening 68 of the edge cover 52.

According to the characteristic (4) of the organic EL display device 1 according to the third embodiment, a plurality of second lower reflective conductive layers 73 are provided in an island shape on the inner side of the opening 68 of the edge cover 52, and thus it is possible to reduce a region in which light from the front face side in the second display region D2 is blocked by the second lower reflective conductive layer 73, as compared to a case where the second lower reflective conductive layer 73 is formed throughout the entire inner side of the opening 68 of the edge cover 52. This contributes to an improvement in image capture performance of the in-camera 3 which is combined with the organic EL display device 1.

A characteristic (5) of the organic EL display device 1 according to the third embodiment is that the second lower transparent conductive layer 71 and the second upper reflective conductive layer 74 are in contact with each other at a location overlapping the peripheral edge portion of the opening 68 of the edge cover 52.

According to the characteristic (5) of the organic EL display device 1 according to the third embodiment, the second reflective conductive layer 72 is not provided in a portion of the first electrode 51 which is covered with the edge cover 52, and thus it is easy to cover the peripheral edge portion of the first electrode 51 with the edge cover 52. In addition, a location where the second lower transparent conductive layer 71 and the second upper transparent conductive layer 75 are in contact with each other has an excellent transparency and a relatively high light transmittance. Thereby, it is possible to increase sensitivity at the time of image capture by the camera 3. In addition, the smaller the size of the second reflective conductive layer 72, the less the influence of reflection of the second reflective conductive layer 72 at the time of image capture by the camera 3, and thus high-definition patterning of the second reflective conductive layer 72 by photolithography becomes effective.

A characteristic of a method of manufacturing the organic EL display device 1 according to the third embodiment is that the first electrode forming step ST2a includes the first film forming step ST2a-1 of forming the first transparent conductive film 101 and the first reflective conductive film 102 in order on the substrate on which the TFT layer 20 has been formed, the first patterning step ST2a-2 of patterning the first reflective conductive film 102 to form the first lower reflective conductive layer 63 from the first reflective conductive film 102. so as to cover the entire inner side of the opening 68 of the edge cover 52 in the first display region D1 of the display region D and to form the second lower reflective conductive layer 73 from the first reflective conductive film 102 so as to expose the first transparent conductive film 101 in a portion thereof on the inner side of the opening 68 of the edge cover 52 in the second display region D2 of the display region D, the second film forming step ST2a-3 of forming the second reflective conductive film 104 and the second transparent conductive film 105 on the substrate on which the first lower reflective conductive layer 63 and the second lower reflective conductive layer 73 have been formed, and the second patterning step ST2a-4 of patterning the first transparent conductive film 101, the second reflective conductive film 104, and the second transparent conductive film 105 to form the first lower transparent conductive layer 61 from the first transparent conductive film 101, form the first upper reflective conductive layer 64 from the second reflective conductive film 104, and form the first upper transparent conductive layer 65 from the second transparent conductive film 105 in the first display region D1 so as to overlap the first lower reflective conductive layer 63, and to form the second lower transparent conductive layer 71 from the first transparent conductive film 101, form the second upper reflective conductive layer 74 from the second reflective conductive film 104, and form the second upper transparent conductive layer 75 from the second transparent conductive film 105 in the second display region D2 so as to overlap the second lower reflective conductive layer 73.

According to the characteristics of the method of manufacturing the organic EL display device 1 according to the third embodiment, the first lower reflective conductive layer 63 and the second lower reflective conductive layer 73 are formed in the first patterning step ST2a-2, and the first lower transparent conductive layer 61, the first upper reflective conductive layer 64, and the first upper transparent conductive layer 65 are formed in the second patterning step ST2a-4, and also the second lower transparent conductive layer 71, the second upper reflective conductive layer 74, and the second upper transparent conductive layer 75 are formed in the second patterning step ST2a-4, and thus the first electrode 51 of the first organic EL element 60A and the first electrode 51 of the second organic EL element 60B having different layer configurations can be formed together. This contributes to efficiently and inexpensively manufacturing the organic EL display device 1.

In addition, according to the characteristics of the method of manufacturing the organic EL display device 1 according to the third embodiment, after the second reflective conductive film 104 and the second transparent conductive film 105 are formed in order in the second film forming step ST2a-3, the second reflective conductive film 104 and the second transparent conductive film 105 are patterned in the second patterning step ST2a-4, and thus both the surface of the first reflective conductive layer 62 which reflects light from the organic EL layer 53 and the surface of the second reflective conductive layer 72 which reflects light from the organic EL layer 53 are covered with the second transparent conductive film 105 until the second reflective conductive film 104 is formed and then patterned, and are not exposed to the atmosphere. Thereby, it is possible to prevent the surfaces of the first upper reflective conductive layer 64 and the second reflective conductive layer 72 from being oxidized or becoming rough due to a reaction with oxygen in the atmosphere or the like. As a result, it is possible to increase the light extraction efficiency of the first organic EL element 60A and the second organic EL element 60B.

Modification Example of Third Embodiment

FIG. 41 is a plan view illustrating configurations of light-emitting regions E and the peripheral configurations thereof in the first display region D1 and the second display region D2 of the organic EL display device 1 according to a modification example of the third embodiment.

In the organic EL display device 1 according to the third embodiment, a plurality of second lower reflective conductive layers 73 in the first electrode 51 of the second organic EL element 60B are provided in an island shape on the inner side of the opening 68 of the edge cover 52, but as illustrated in FIG. 41, the second lower reflective conductive layer 73 is provided in a lattice pattern on the inner side of the opening 68 of the edge cover 52 in the organic EL display device 1 according to the present modification example.

A plurality of rectangular openings 78 are formed in a portion of the second lower reflective conductive layer 73 which is positioned on the inner side of the opening 68 of the edge cover 52. For example, the plurality of openings 78 are disposed in a matrix. The plurality of openings 78 may be aligned in a row or may be provided in another arrangement such as a zigzag shape. The opening 78 may have a shape other than a rectangular shape such as a circular shape, an elliptical shape, and a slit shape. The second lower reflective conductive layer 73 overlaps the peripheral edge portion of the opening 68 of the edge cover 52 and the entire periphery of the opening 68.

Characteristics and Effects of Modification
Example of Third Embodiment

A characteristic of the organic EL display device 1 according to the present modification example is that the second lower reflective conductive layer 73 overlaps the peripheral edge portion of the opening 68 of the edge cover 52 and the entire periphery of the opening 68.

According to the characteristic of the organic EL display device 1 according to the present modification example, light emitted by the organic EL layer 53 at the peripheral edge portion of the edge cover 52 and the vicinity thereof can be reflected to the front face side of the display region D by the thick layer portion 51b provided with the second lower reflective conductive layer 73 in the first electrode 51 of the second organic EL element 60B. The light emission intensity of the organic EL layer 53 is relatively high at the peripheral edge portion of the edge cover 52 and the vicinity thereof. Thus, it is possible to suppress a decrease in the light extraction efficiency of the second organic EL element 60B due to the second lower reflective conductive layer 73 being not provided in a portion of the first electrode 51 on the inner side of the edge cover 52.

As described above, the preferred embodiments are described as examples of the technique of the disclosure. However, the technique of the disclosure is not limited to the embodiments and the modification examples, and is also applicable to an embodiment in which modification, replacement, adding, omission, and the like are suitably made. The constituent elements described in the embodiments described above can be combined into a new embodiment. The constituent elements described in the accompanying drawings and detailed description may also include constituent elements that are not essential for the purpose of solving the problems. As such, those constituent elements that are not essential and are described in the accompanying drawings and detailed description should not immediately be recognized as being essential.

For example, the above-described embodiments and modification examples thereof may have a configuration to be described below.

In the first embodiment, the second reflective conductive layer 72 included in the first electrode 51 of the second organic EL element 60B is formed of the same material as that of and in the same layer as the first upper reflective conductive layer 64 included in the first electrode 51 of the first organic EL element 60A, but for example, the second reflective conductive layer 72 may be formed of the same material as that of and in the same layer as the first lower reflective conductive layer 63 included in the first electrode 51 of the first organic EL element 60A. In this case, the first lower reflective conductive layer 63 and the second reflective conductive layer 72 are formed being relatively thin from the same film, and the first upper reflective conductive layer 64 is formed being relatively thick.

In the third embodiment, in the second reflective conductive layer 72 included in the first electrode 51 of the second organic EL element 60B, the plurality of second lower reflective conductive layers 73 are provided in an island shape on the inner side of the opening 68 of the edge cover 52, and the second upper reflective conductive layer 74 covers the plurality of second lower reflective conductive layers 73. However, the second lower reflective conductive layer 73 may be provided throughout the entire inner side of the opening 68 of the edge cover 52, and the plurality of second upper reflective conductive layers 74 may be provided in an island shape on the inner side of the opening 68 of the edge cover 52. That is, the aspect of the second lower reflective conductive layer 73 and the second upper reflective conductive layer 74 may be reversed. The same applies to the modification example of the third embodiment.

A polyimide resin has been illustrated as an example of the material of the flattening film 29, but the technique of the disclosure is not limited thereto. The flattening film 29 may be formed of an acrylic resin such as a polymethyl methacrylate resin (PMMA). The acrylic resin is preferably used as the material of the flattening film 29 from the perspective of increasing the transmittance of light in the second display region D2.

The area of the organic EL layer 53 of the first organic EL element 60A and the area of the organic EL layer 53 of the second organic EL element 60B are equal to each other above, but the technique of the disclosure is not limited thereto. The area of the organic EL layer 53 of the first organic EL element 60A and the area of the organic EL layer 53 of the second organic EL element 60B are preferably equal to each other, but may be different from each other.

The organic EL layer 53 is individually provided for each of the subpixels Sp above, but the technique of the disclosure is not limited thereto. The organic EL layer 53, including the light-emitting layer 53c, may be provided in common for the plurality of subpixels Sp as a continuous layer. In this case, the organic EL display device 1 may include a color filter, for example, to perform color tone expression of each of the subpixels Sp.

Each of the pixels Px is constituted by the subpixels Sp of the three colors above, but the technique of the disclosure is not limited thereto. The subpixels Sp constituting each of the pixels Px are not limited to having the three colors, and may have four or more colors. Further, the subpixels Sp of the three colors constituting each of the pixels Px are provided in the stripe arrangement, but the technique of the disclosure is not limited thereto. The arrangement of the plurality of subpixels Sp constituting each of the pixels Px may be another arrangement such as a PenTile arrangement.

The first TFT 30a, the second TFT 30b, the third TFT 30c, the fourth TFT 30d, the fifth TFT 30e, the sixth TFT 30f, and the seventh TFT 30g are each the top-gate type above, but the technique of the disclosure is not limited thereto. The first TFT 30a, the second TFT 30b, the third TFT 30c, the fourth TFT 30d, the fifth TFT 30e, the sixth TFT 30f, and the seventh TFT 30g may each be a bottom gate type. Further, the TFT 30 provided for each of the subpixels Px may be six or less and eight or more.

The first electrode 51 is the anode and the second electrode 54 is the cathode electrode, but the technique of the disclosure is not limited thereto. The first electrode 51 may be the cathode electrode, and the second electrode 54 may be the anode. In this case, the organic EL layer 53 has an inverted layered structure, for example.

The organic EL layer 53 has a five-layer layered structure constituted by the hole injection layer 53a, the hole transport layer 53b, the light-emitting layer 53c, the electron transport layer 53d, and the electron injection layer 53e, but the technique of the disclosure is not limited thereto. The organic EL layer 53 may have a three-layer layered structure constituted by a hole injection-cum-transport layer, the light-emitting layer 53c, and an electron transport-cum-injection layer, and can adopt any structure.

As the electronic component used in combination with the organic EL display device 1, the camera 3 is illustrated as an example above, but the technique of the disclosure is not limited thereto. The electronic component may be another electronic component such as a fingerprint sensor or a face recognition sensor, as long as the electronic component is disposed at a position overlapping the display region D in a plan view on the back face of the organic EL display device 1, and configured to use the light transmitted through the light-emitting element layer 50, the TFT layer 20, and the resin substrate layer 10.

The organic EL display device 1 is illustrated as an example of a display device, but the technique of the disclosure is not limited thereto. The technique of the disclosure can be applied to a display device provided with a plurality of light-emitting elements driven by a current, For example, the technique of the disclosure is applicable to a display device provided with quantum-dot light emitting diodes (QLEDs), which are light-emitting elements using a quantum dot-containing layer.

The invention claimed is:

1. A display device, comprising: a substrate; a thin film transistor layer provided on the substrate and including a plurality of thin film transistors; a light-emitting element layer provided on the thin film transistor layer and including a plurality of light-emitting elements; and a display region displaying an image by light emission from the plurality of light-emitting elements controlled by operations of the plurality of thin film transistors, wherein the light-emitting element layer further includes: a first electrode provided for each of the plurality of light-emitting elements, an edge cover covering a peripheral edge portion of the first electrode and in which an opening exposing the first electrode is formed, a light-emitting function layer provided on the first electrode inside the opening of the edge cover, and a second electrode provided on the light-emitting function layer, the display region includes a first display region and a second display region that is positioned inside of the first display region, each of the plurality of light-emitting elements includes a first light-emitting element positioned in the first display region and a second light-emitting element positioned in the second display region, each of the first light-emitting element and the second light-emitting element includes the first electrode, the light-emitting function layer, and the second electrode, the first electrode of the first light-emitting element includes: a first lower transparent conductive layer having first light transmittance, a first reflective conductive layer provided on the first lower transparent conductive layer and having light reflectivity, and a first upper transparent conductive layer provided on the first reflective conductive layer and having second light transmittance, the first electrode of the second light-emitting element includes: a second lower transparent conductive layer having the first light transmittance and being formed of the same material as the first lower transparent conductive layer and in the same layer as the first lower transparent conductive layer, a second reflective conductive layer provided on the second lower transparent conductive layer and having light reflectivity and being formed of the same material as the first reflective conductive layer and in the same layer as the first reflective conductive layer, and a second upper transparent conductive layer provided on the second reflective conductive layer and having the second light transmittance and being formed of the same material as the first upper transparent conductive layer and in the same layer as the first upper transparent conductive layer, the second reflective conductive layer is provided partially on an inner side of the opening of the edge cover, the first electrode of the second light-emitting element includes a thin layer portion and a thick layer portion on the inner side of the opening of the edge cover, the thin layer portion being where the second lower transparent conductive layer and the second upper transparent conductive layer directly contact, and the thick layer portion comprising the second reflective conductive layer between the second lower transparent conductive layer and the second upper transparent conductive layer and being thicker than the thin layer portion, and a thickness of the light-emitting function layer on the second upper transparent conductive layer of the thin layer portion is thicker than a thickness of the light-emitting function layer on the second upper transparent conductive layer of the thick layer portion.

2. The display device according to claim 1,
wherein the second reflective conductive layer is thinner than the first reflective conductive layer throughout an entirety of the inner side of the opening of the edge cover.

3. The display device according to claim 2,
wherein the first reflective conductive layer is formed by a first lower reflective conductive layer and a first upper reflective conductive layer provided on the first lower reflective conductive layer throughout the entirety of the inner side of the opening of the edge cover, and the second reflective conductive layer is formed of the same material as the first upper reflective conductive layer and in the same layer as the first upper reflective conductive layer.

4. The display device according to claim 1,
wherein
a thickness of the thick layer portion is equal to a thickness of a portion, of the first electrode of the first light-emitting element, positioned on the inner side of the opening of the edge cover.

5. The display device according to claim 4,
wherein a thickness of the second reflective conductive layer on the inner side of the opening of the edge cover is equal to a thickness of the first reflective conductive layer on the inner side of the opening of the edge cover, and
the second lower transparent conductive layer and the second upper transparent conductive layer are in contact with each other on the inner side of the opening of the edge cover.

6. The display device according to claim 4,
wherein a peripheral end surface of the first reflective conductive layer is covered with the first upper transparent conductive layer, and
the first lower transparent conductive layer and the first upper transparent conductive layer are in contact with each other on an outer periphery of the first reflective conductive layer.

7. The display device according to claim 4,
wherein the thin film transistor layer further includes a flattening film provided covering the plurality of thin film transistors,
a contact hole configured to electrically connect the first electrode to one of the plurality of thin film transistors is formed in the flattening film, and
the second reflective conductive layer is provided in a region including an inside of the contact hole.

8. The display device according to claim 1,
wherein a plurality of second reflective conductive layers, including the second reflective conductive layer, is provided in an island-shaped region on the inner side of the opening of the edge cover.

9. The display device according to claim 4,
wherein the second lower transparent conductive layer and the second upper transparent conductive layer are in contact with each other at a location overlapping a peripheral edge portion of the opening of the edge cover.

10. The display device according to claim 4,
wherein the second reflective conductive layer overlaps a peripheral edge portion of the opening of the edge cover throughout an entirety of a periphery of the opening.

11. The display device according to claim 1,
wherein the first electrode of the second light-emitting element includes a thin layer portion and a thick layer portion thicker than the thin layer portion on the inner side of the opening of the edge cover,
the second reflective conductive layer is provided in the thin layer portion and the thick layer portion,
the thin layer portion is thinner than the first reflective conductive layer,
the thick layer portion has a thickness equal to a thickness of the first reflective conductive layer, and
the thickness of the thick layer portion is equal to a thickness of a portion, of the first electrode of the first light-emitting element, positioned on the inner side of the opening of the edge cover.

12. The display device according to claim 11,
wherein the first reflective conductive layer is formed by a first lower reflective conductive layer and a first upper reflective conductive layer provided on the first lower reflective conductive layer throughout an entirety of the inner side of the opening of the edge cover,
the second reflective conductive layer in the thick layer portion is formed by a second lower reflective conductive layer and a second upper reflective conductive layer,
the second lower reflective conductive layer is formed of the same material as the first lower reflective conductive layer and in the same layer as the first lower reflective conductive layer,
the second upper reflective conductive layer is provided on the second lower reflective conductive layer and formed of the same material as the first upper reflective conductive layer and in the same layer as the first upper reflective conductive layer, and
the second reflective conductive layer in the thin layer portion is formed by the second upper reflective conductive layer.

13. The display device according to claim 12,
wherein a plurality of the second lower reflective conductive layers are provided in an island shape on the inner side of the opening of the edge cover.

14. The display device according to claim 12,
wherein the second lower transparent conductive layer and the second upper reflective conductive layer are in contact with each other at a location overlapping a peripheral edge portion of the opening of the edge cover.

15. The display device according to claim 12,
wherein the second lower reflective conductive layer overlaps a peripheral edge portion of the opening of the edge cover throughout an entirety of a periphery of the opening.

16. The display device according to claim 3, wherein a peripheral end surface of the first lower reflective conductive layer is covered with the first upper reflective conductive layer, and peripheral end surfaces of the first lower transparent conductive layer, the first upper reflective conductive layer, and the first upper transparent conductive layer are aligned in a direction in which the first lower transparent conductive layer, the first upper reflective conductive layer, and the first upper transparent conductive layer are layered.

17. The display device according to claim 1, wherein an area of the first electrode of the first light-emitting element and an area of the first electrode of the second light-emitting element are equal to each other in a plan view.

18. The display device according to claim 1, wherein an area of the opening exposing the first electrode of the first light-emitting element in the edge cover and an area of the opening exposing the first electrode of the second light-emitting element are equal to each other in a plan view.

19. The display device according to claim 1, wherein an area of the opening exposing the first electrode of the first light-emitting element in the edge cover is larger than an area of the opening exposing the first electrode of the second light-emitting element in a plan view.

20. The display device according to claim 1, wherein an area of the light-emitting function layer of the first light-emitting element and an area of the light-emitting function layer of the second light-emitting element are equal to each other in a plan view.

* * * * *